(12) United States Patent
Yokoyama et al.

(10) Patent No.: US 10,049,712 B2
(45) Date of Patent: Aug. 14, 2018

(54) SEMICONDUCTOR DEVICE INCLUDING VOLATILE AND NON-VOLATILE MEMORY

(71) Applicant: Sony Corporation, Tokyo (JP)

(72) Inventors: Takashi Yokoyama, Kanagawa (JP); Shunsaku Tokito, Kanagawa (JP); Hiroshi Hasegawa, Kanagawa (JP); Hajime Yamagishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/520,932

(22) PCT Filed: Oct. 23, 2015

(86) PCT No.: PCT/JP2015/079945
§ 371 (c)(1),
(2) Date: Apr. 21, 2017

(87) PCT Pub. No.: WO2016/080146
PCT Pub. Date: May 26, 2016

(65) Prior Publication Data
US 2018/0025765 A1    Jan. 25, 2018

(30) Foreign Application Priority Data

Nov. 20, 2014 (JP) ................. 2014-235309

(51) Int. Cl.
*G11C 14/00* (2006.01)
*G11C 11/16* (2006.01)
(Continued)

(52) U.S. Cl.
CPC ........ *G11C 11/1697* (2013.01); *H01L 27/228* (2013.01); *H01L 43/02* (2013.01); *H01L 43/08* (2013.01); *H01L 43/12* (2013.01)

(58) Field of Classification Search
CPC .................................................. G11C 14/0081
(Continued)

(56) References Cited

U.S. PATENT DOCUMENTS

2010/0202191 A1* 8/2010 Ahn ...................... G11C 11/412
365/154
2011/0280073 A1   11/2011 Chiu et al.
2016/0172036 A1*  6/2016 Augustine .......... G11C 14/0081
365/66

FOREIGN PATENT DOCUMENTS

JP     2006186109 A     7/2006
JP     2006351683 A    12/2006
(Continued)

*Primary Examiner* — Hoai V Ho
(74) *Attorney, Agent, or Firm* — Michael Best & Friedrich LLP

(57) ABSTRACT

A semiconductor device includes a flip-flop circuit, a control line, a first P-type transistor and a first non-volatile storage element, and a second P-type transistor and a second non-volatile storage element. The flip-flop circuit has a circular structure in which a first inverter circuit, a first connection line including a first node, a second inverter circuit, and a second connection line including a second node are coupled in order. The first P-type transistor and the first non-volatile storage element are coupled together in series between the first node and the control line. The second P-type transistor and the second non-volatile storage element are coupled together in series between the second node and the control line. The non-volatile storage element is a magnetic tunnel junction element including a pinned layer, a tunnel barrier layer, and a free layer arranged in order from a position close to the control line.

19 Claims, 34 Drawing Sheets

(51) Int. Cl.
  *H01L 27/22*  (2006.01)
  *H01L 43/12*  (2006.01)
  *H01L 43/08*  (2006.01)
  *H01L 43/02*  (2006.01)

(58) Field of Classification Search
  USPC .................................. 365/154, 158, 185.08
  See application file for complete search history.

(56) References Cited

FOREIGN PATENT DOCUMENTS

| | | | |
|---|---|---|---|
| JP | 2008544558 | A | 12/2008 |
| JP | 2013030240 | A | 2/2013 |
| JP | 2013062319 | A | 4/2013 |
| JP | 2013114731 | A | 6/2013 |
| JP | 2013197406 | B2 | 9/2013 |
| WO | 2009/028298 | A1 | 3/2009 |

* cited by examiner

[FIG. 1]
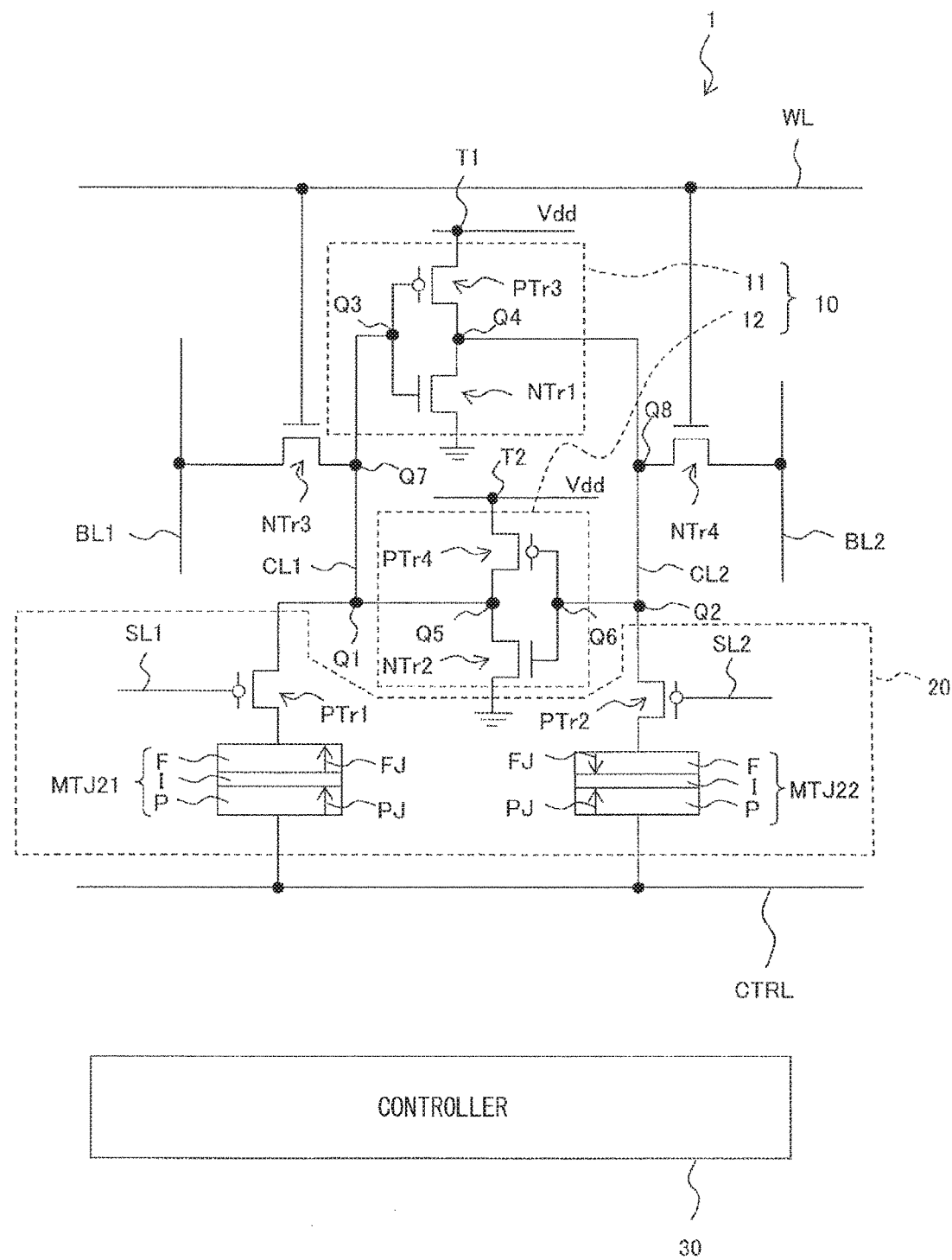

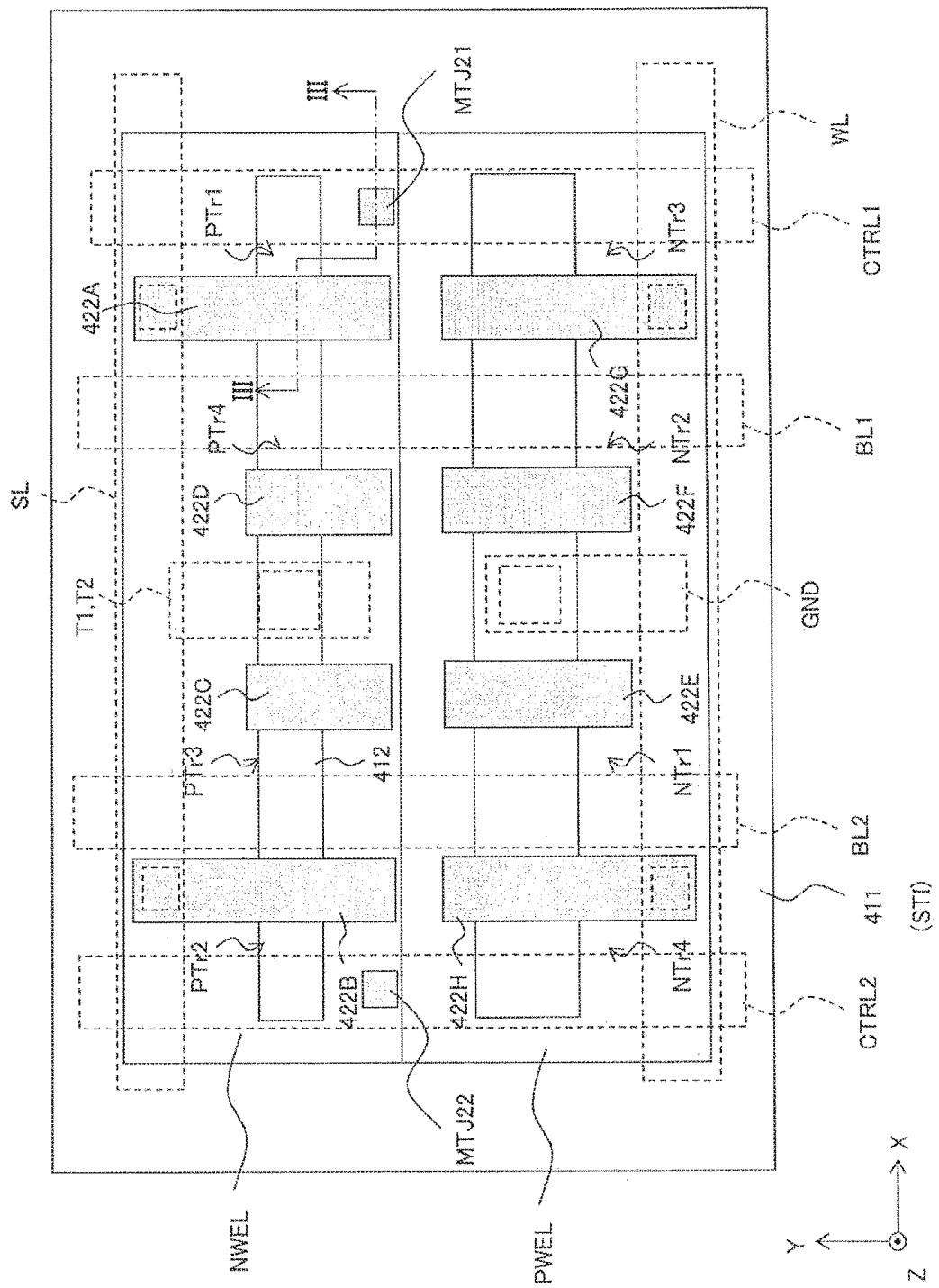
[FIG. 2]

[FIG. 3]
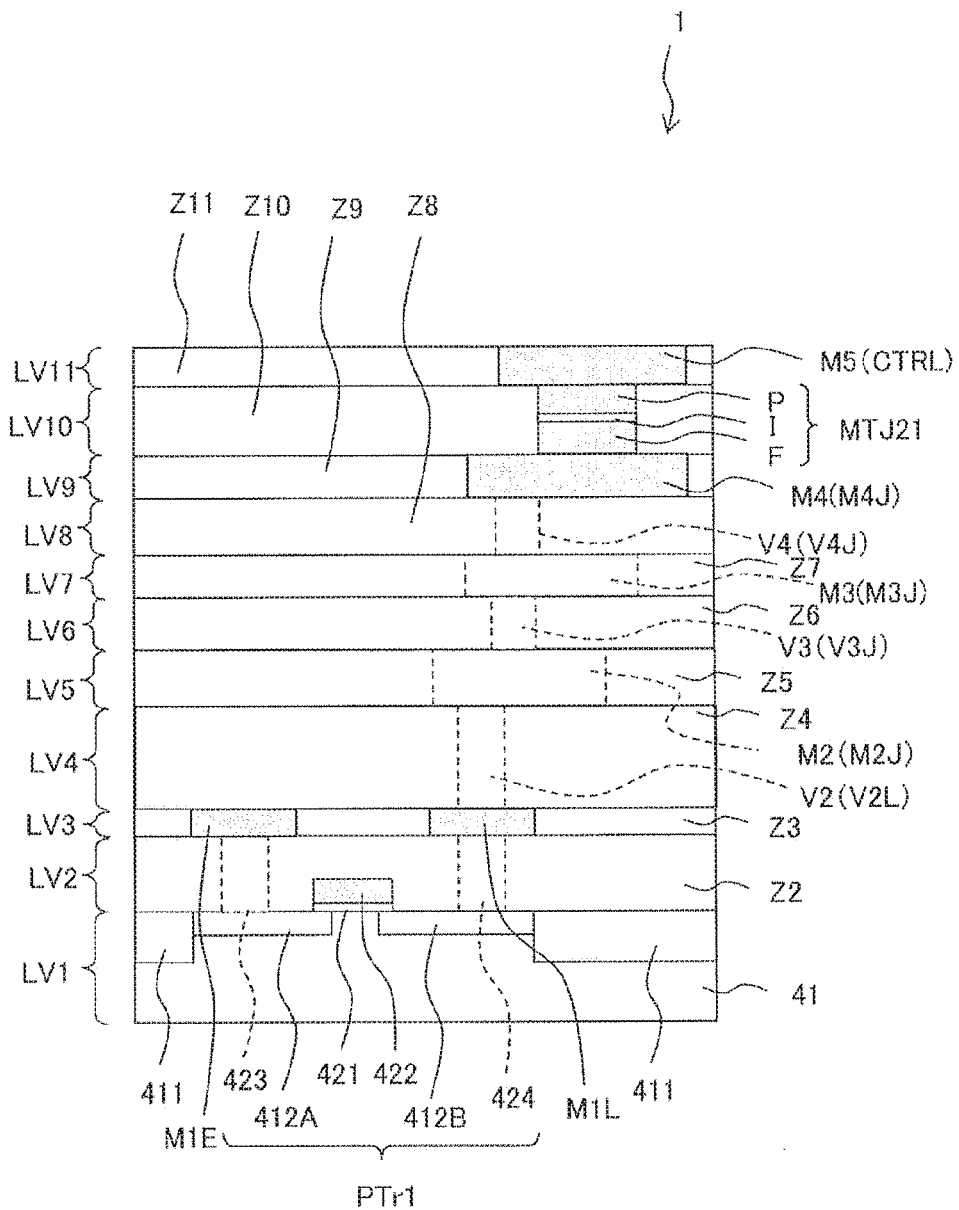

[FIG. 4A]
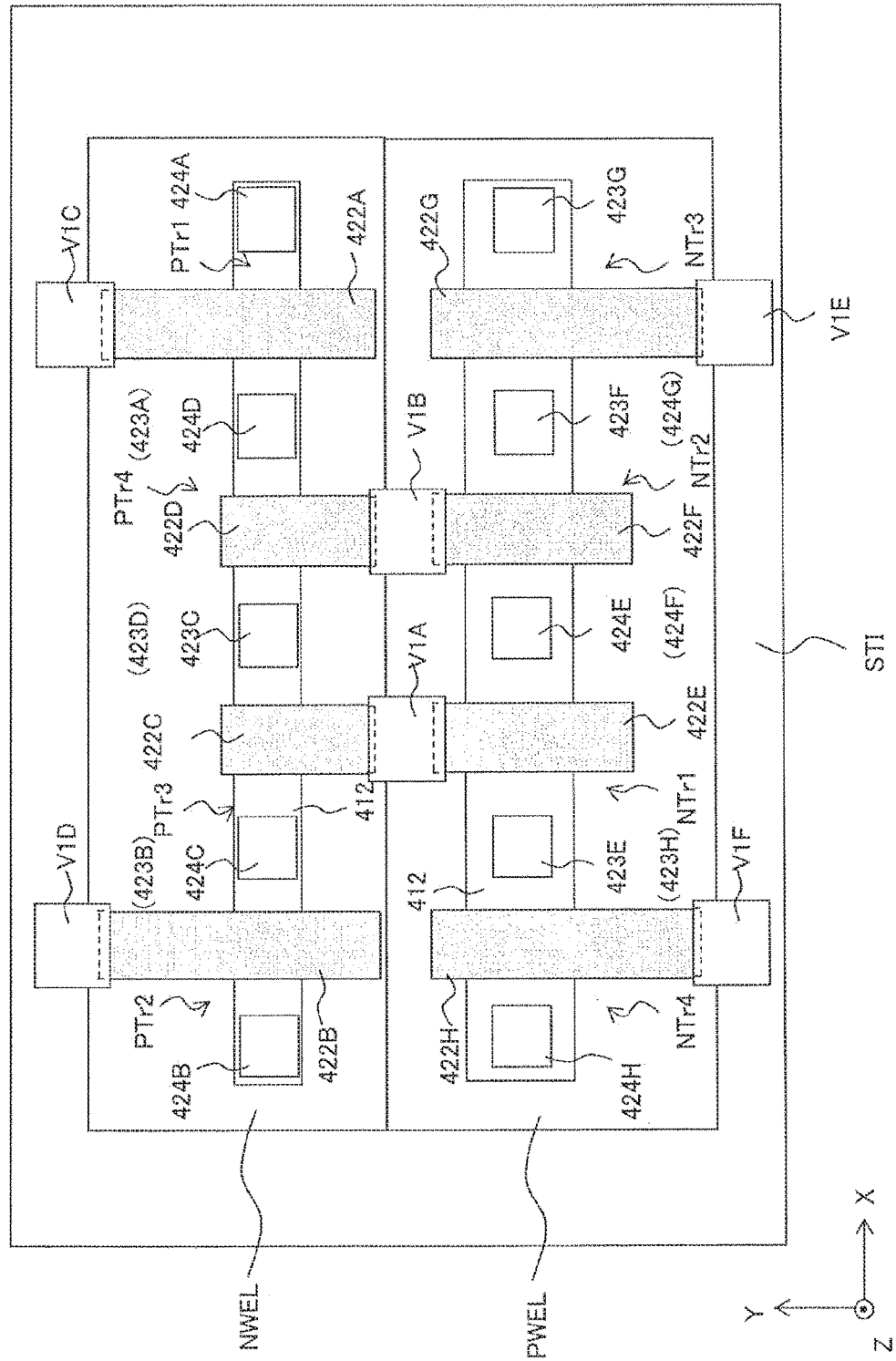

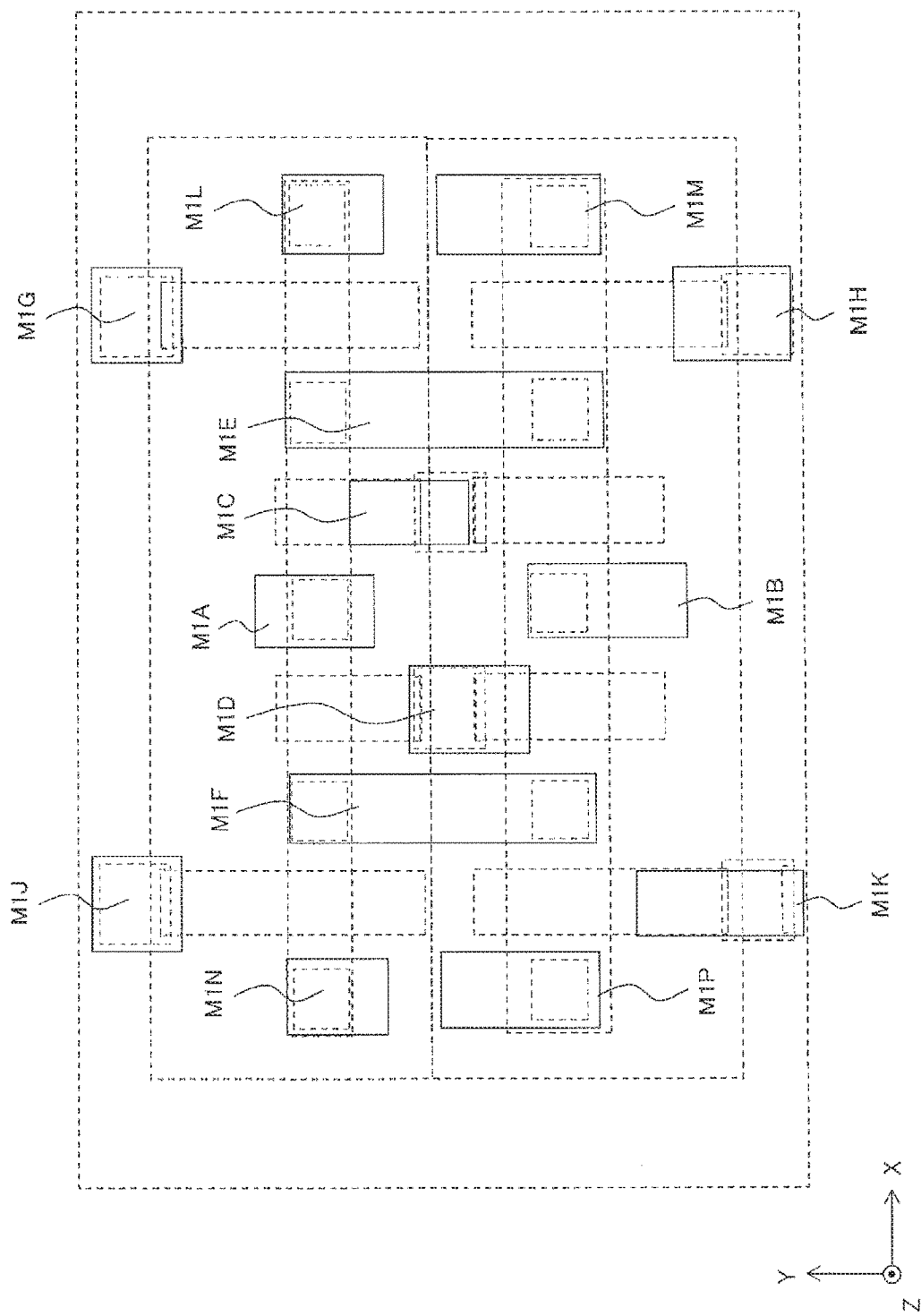
[ FIG. 4B ]

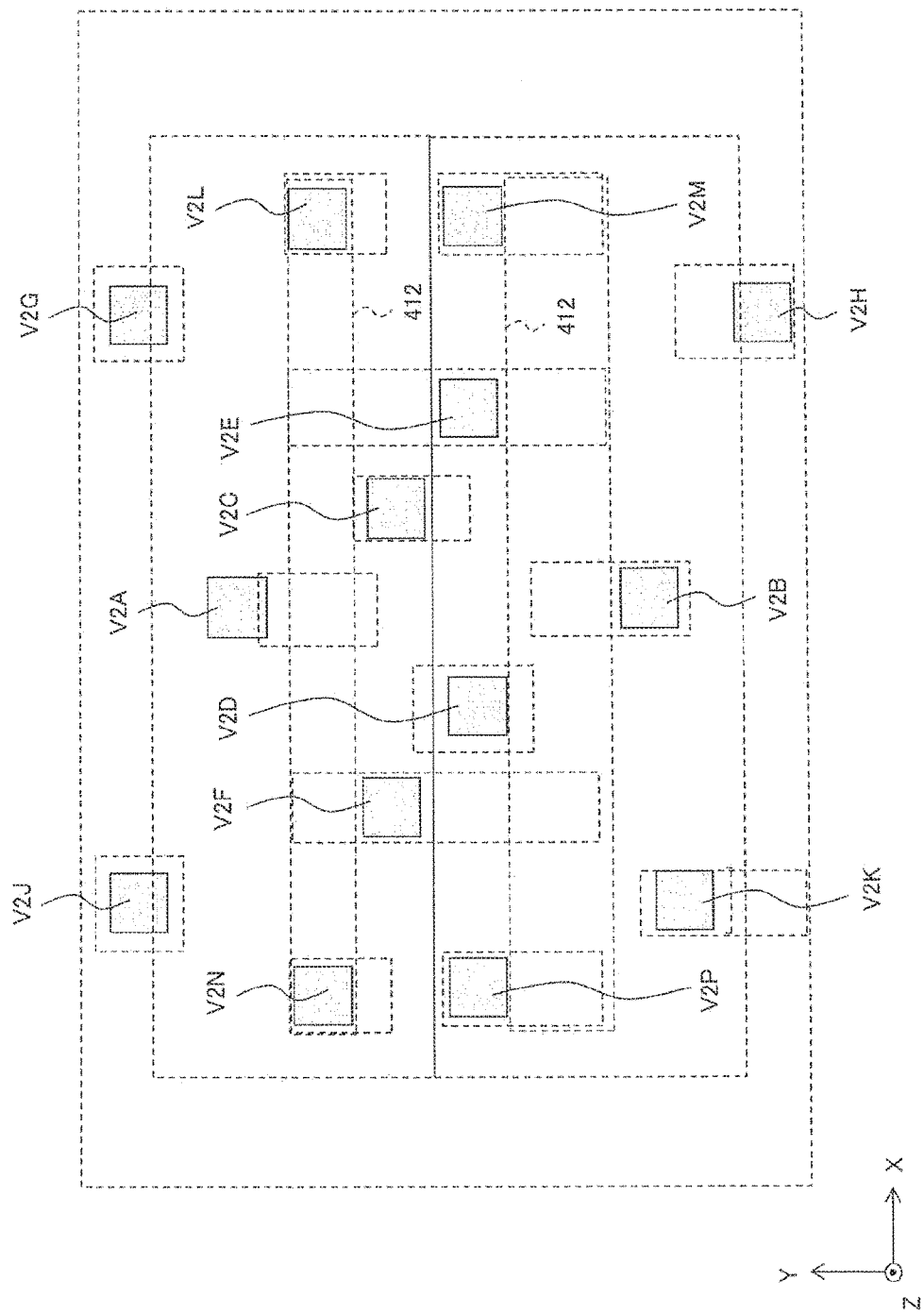
[FIG. 4C]

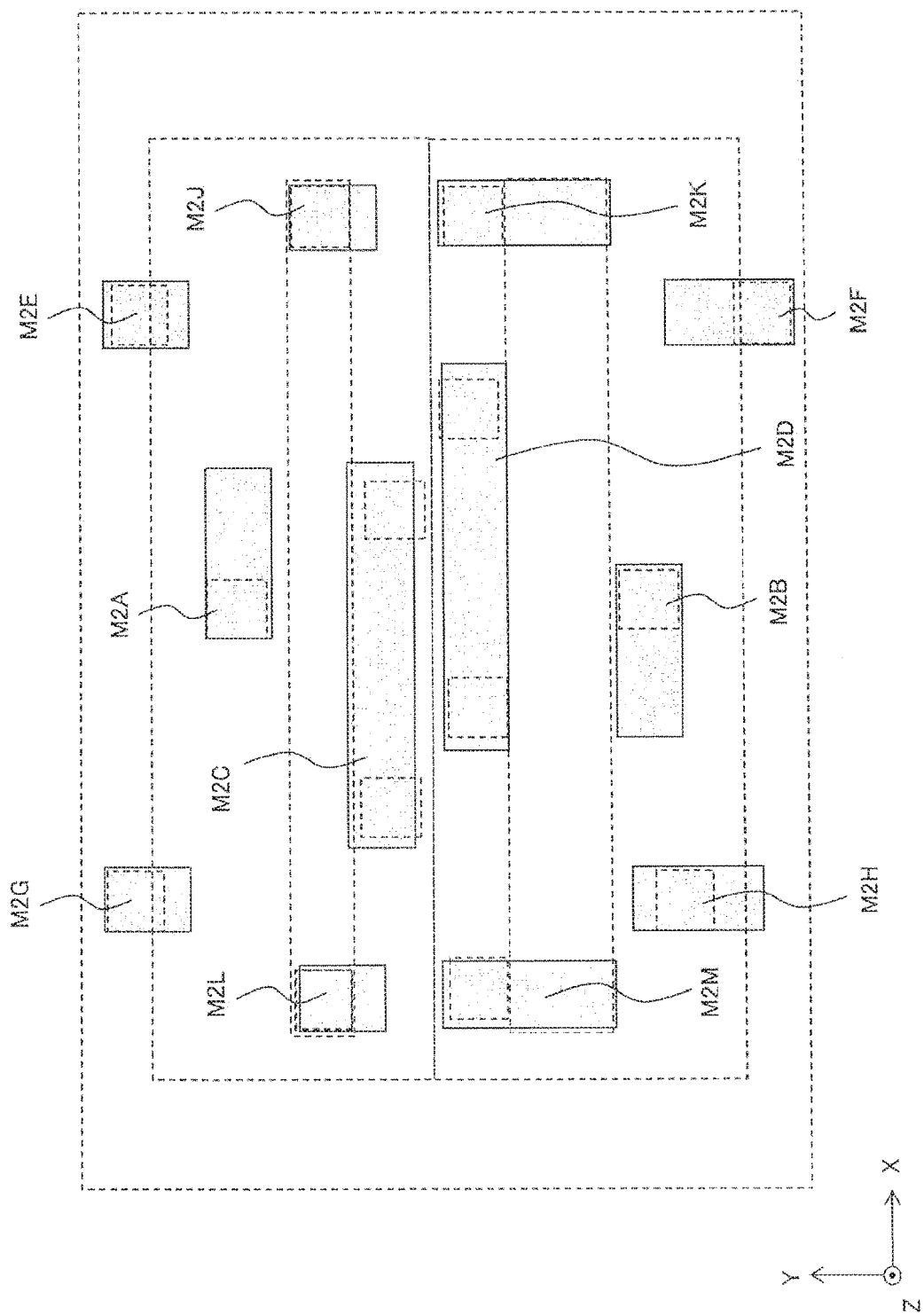
[FIG. 4D]

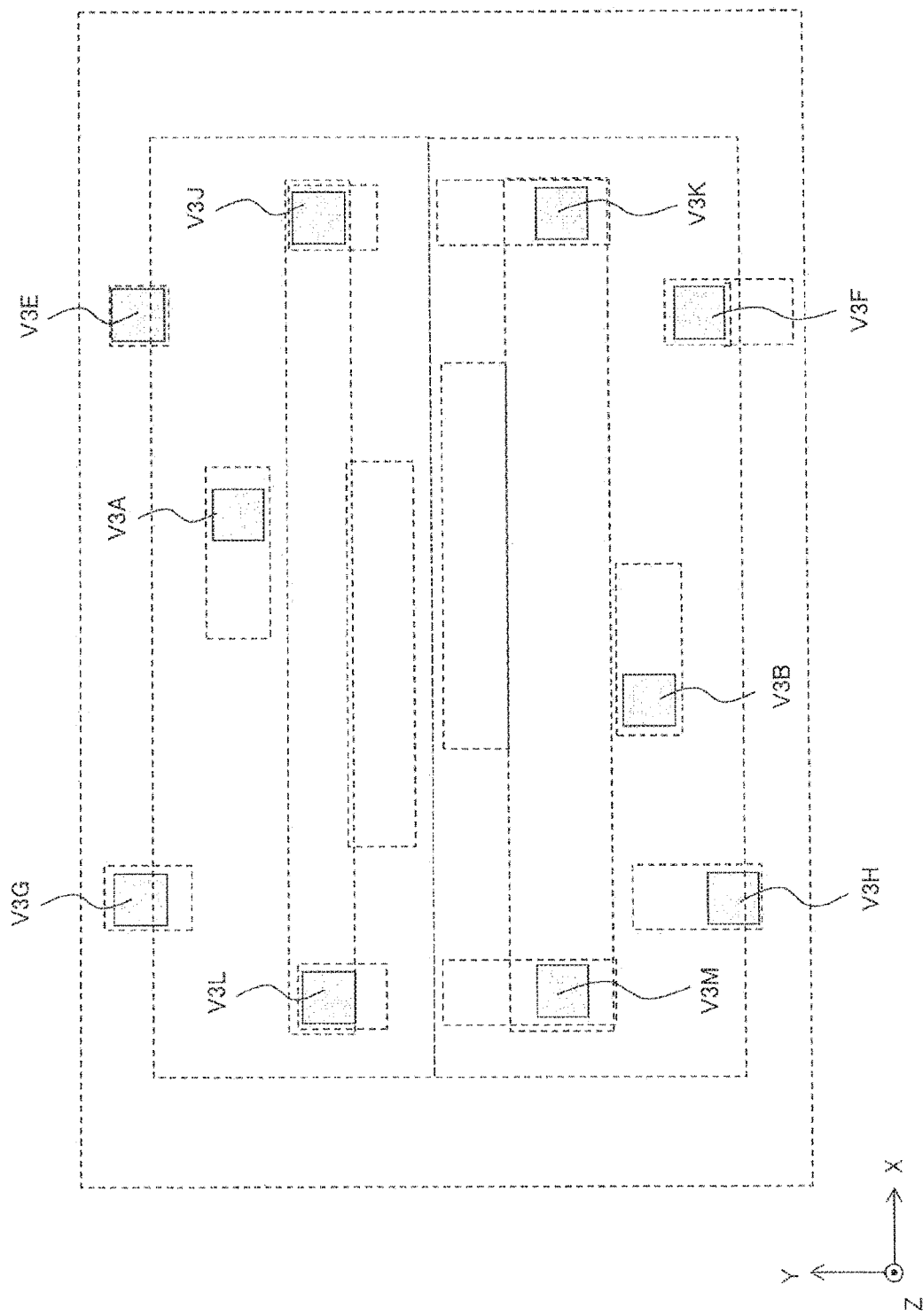
[FIG. 4E]

[FIG. 4F]
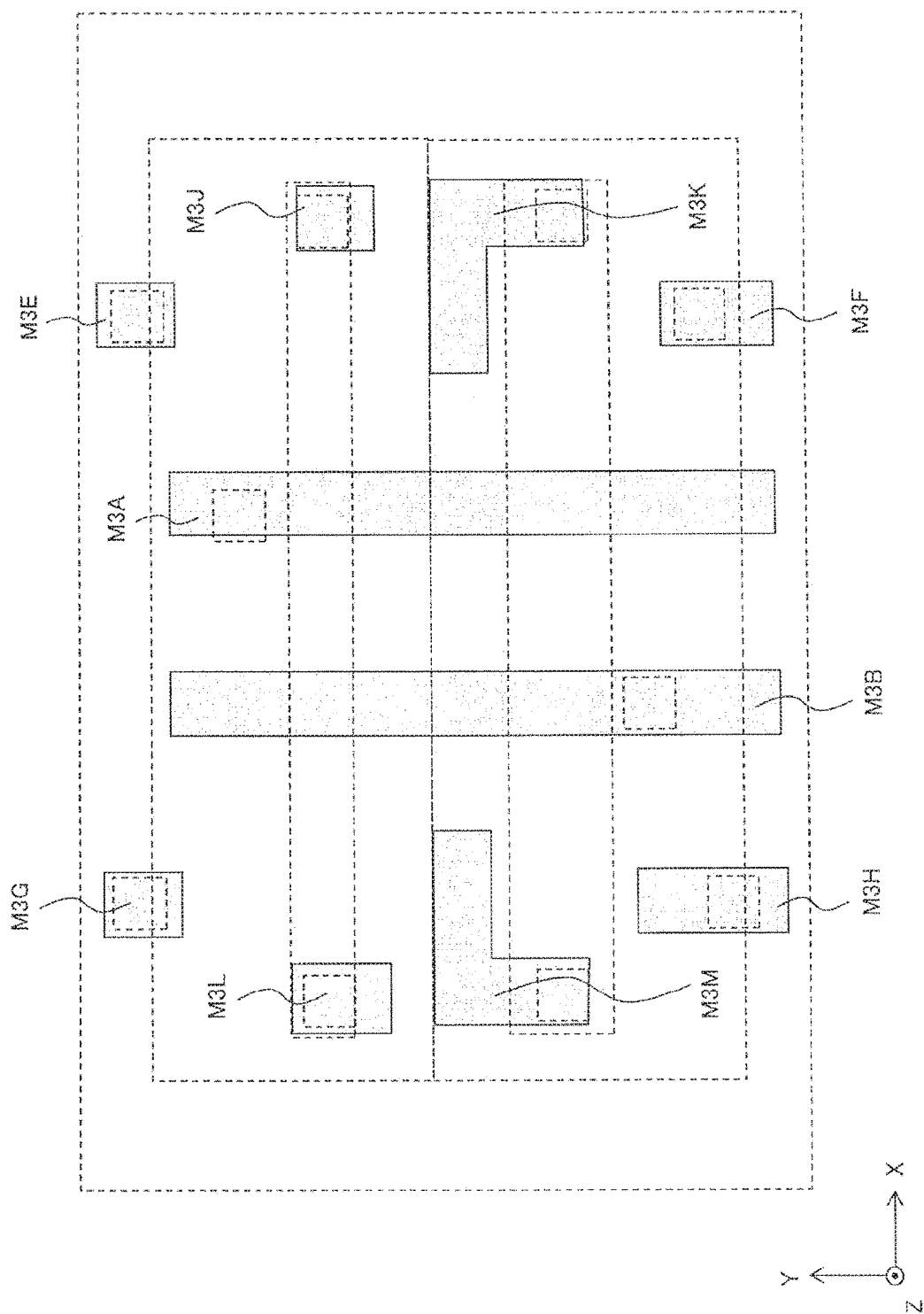

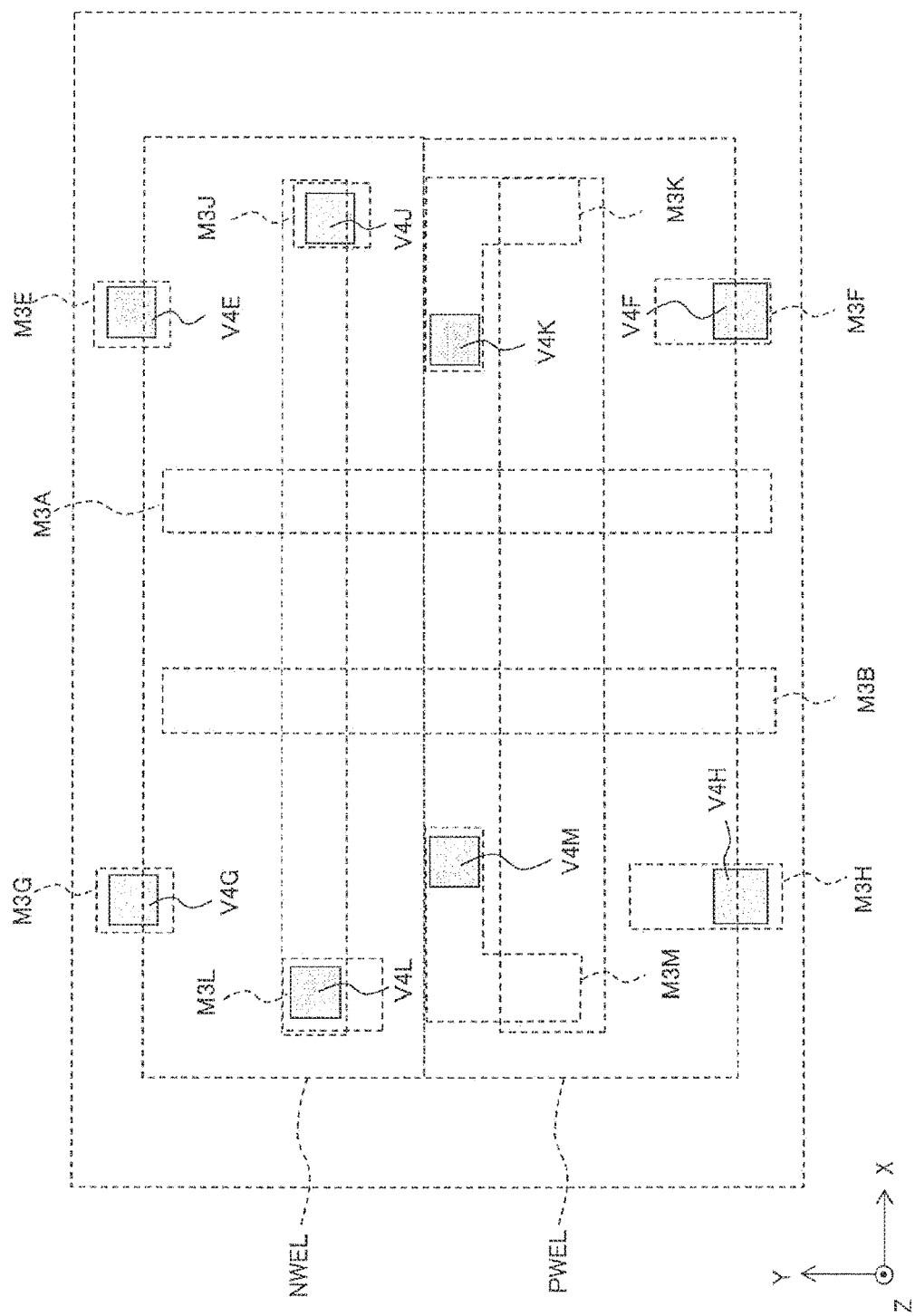
[FIG. 4G]

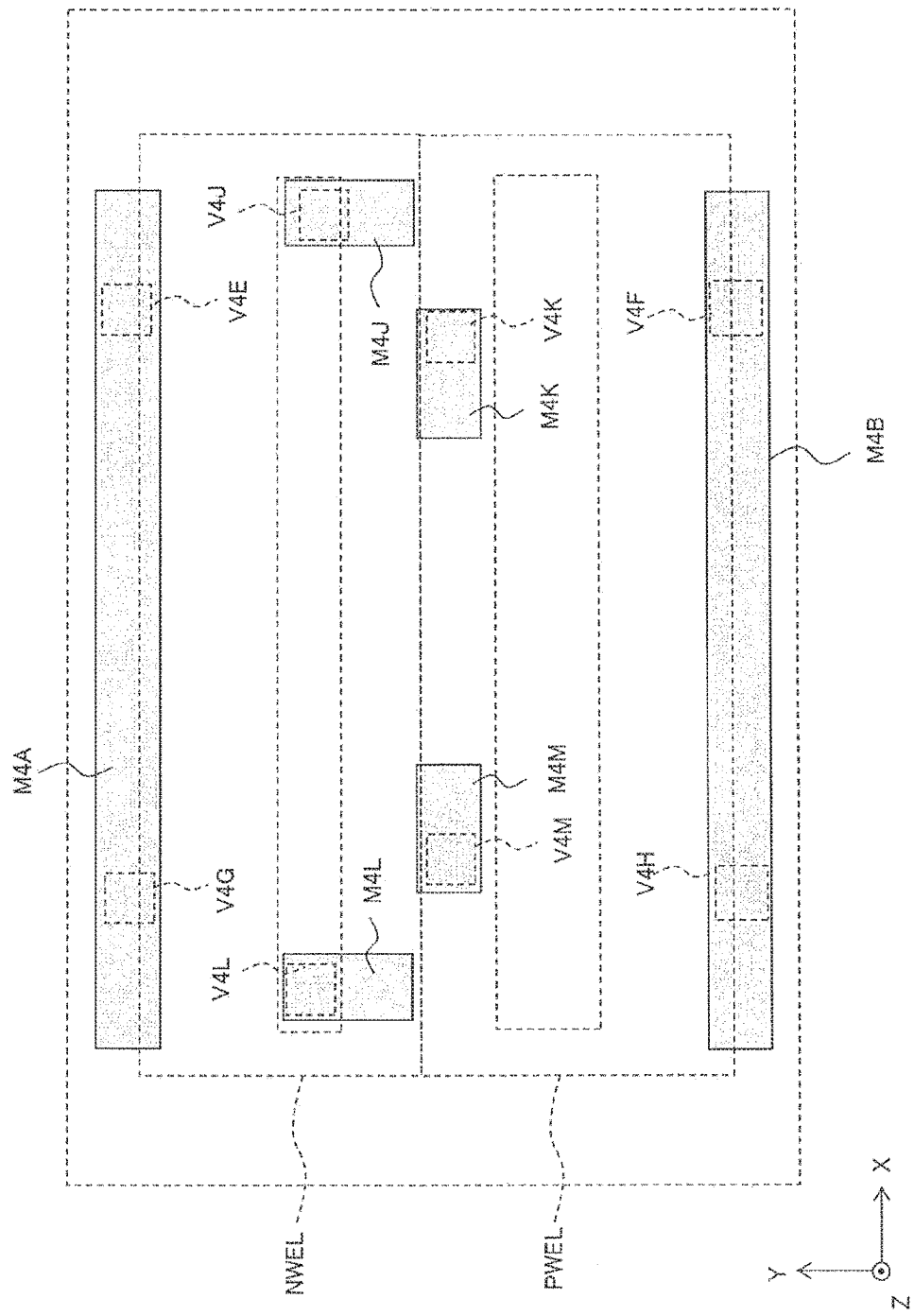
[FIG. 4H]

[FIG. 4J]
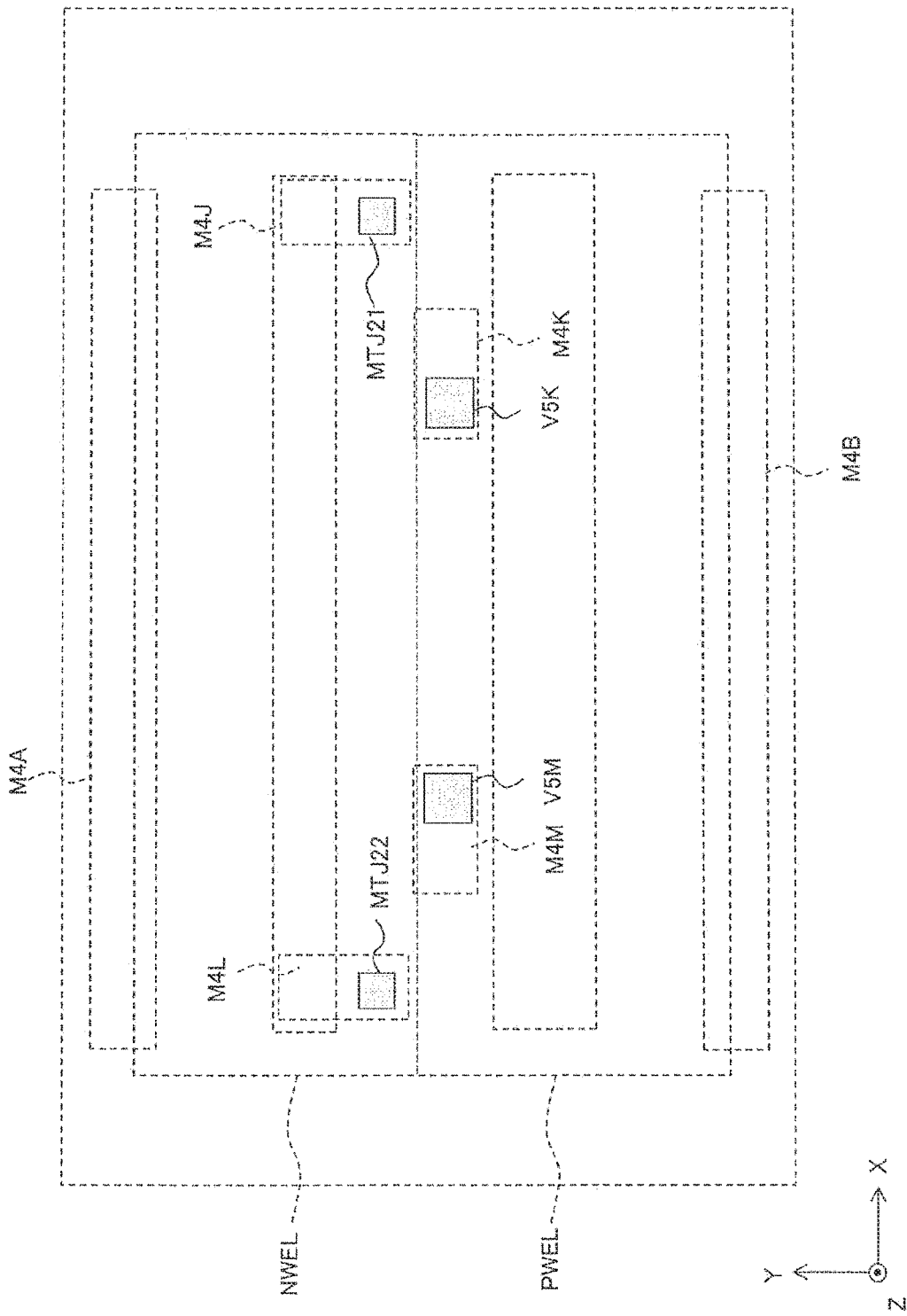

[FIG. 4K]
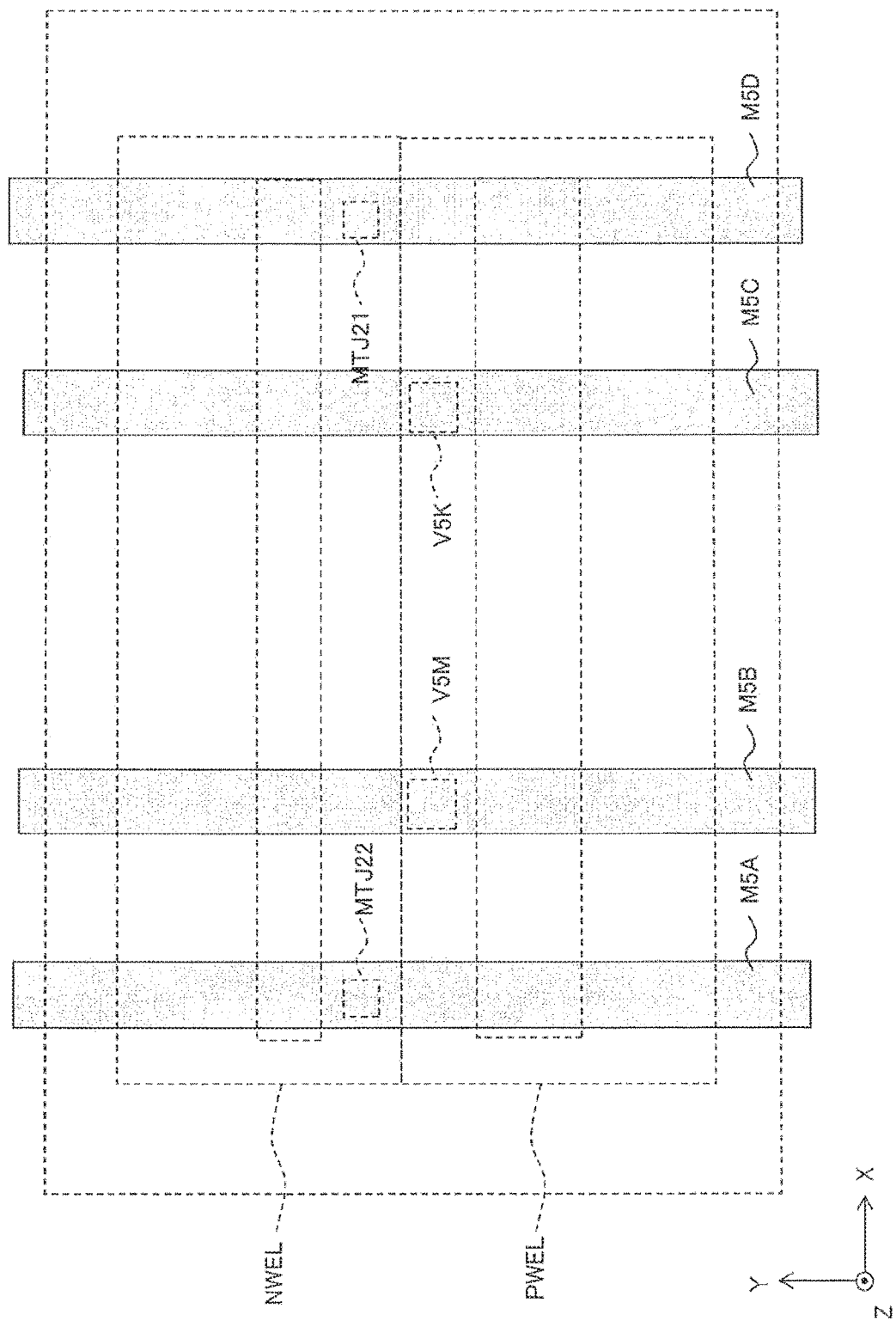

[ FIG. 5A ]
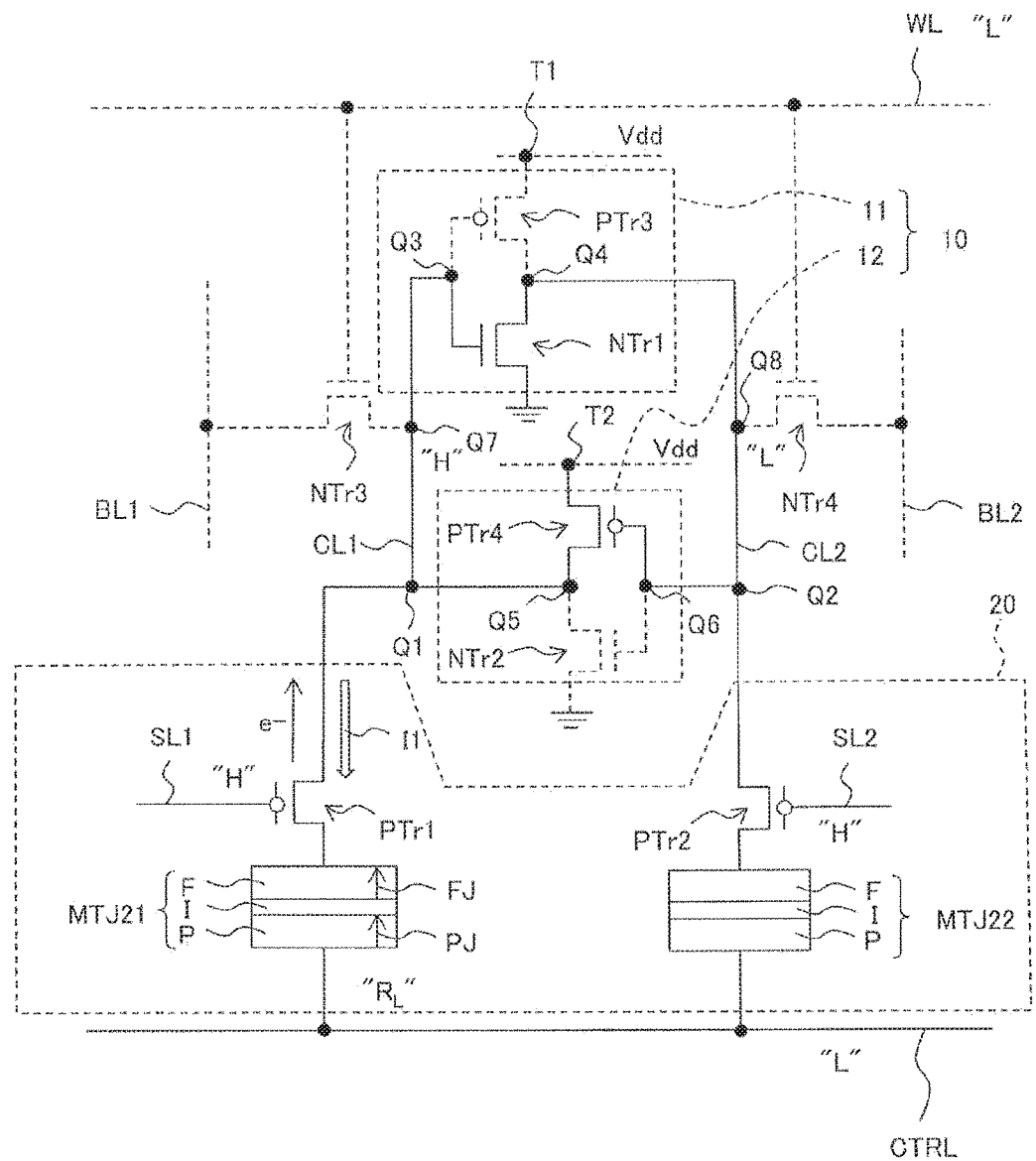

[ FIG. 5B ]
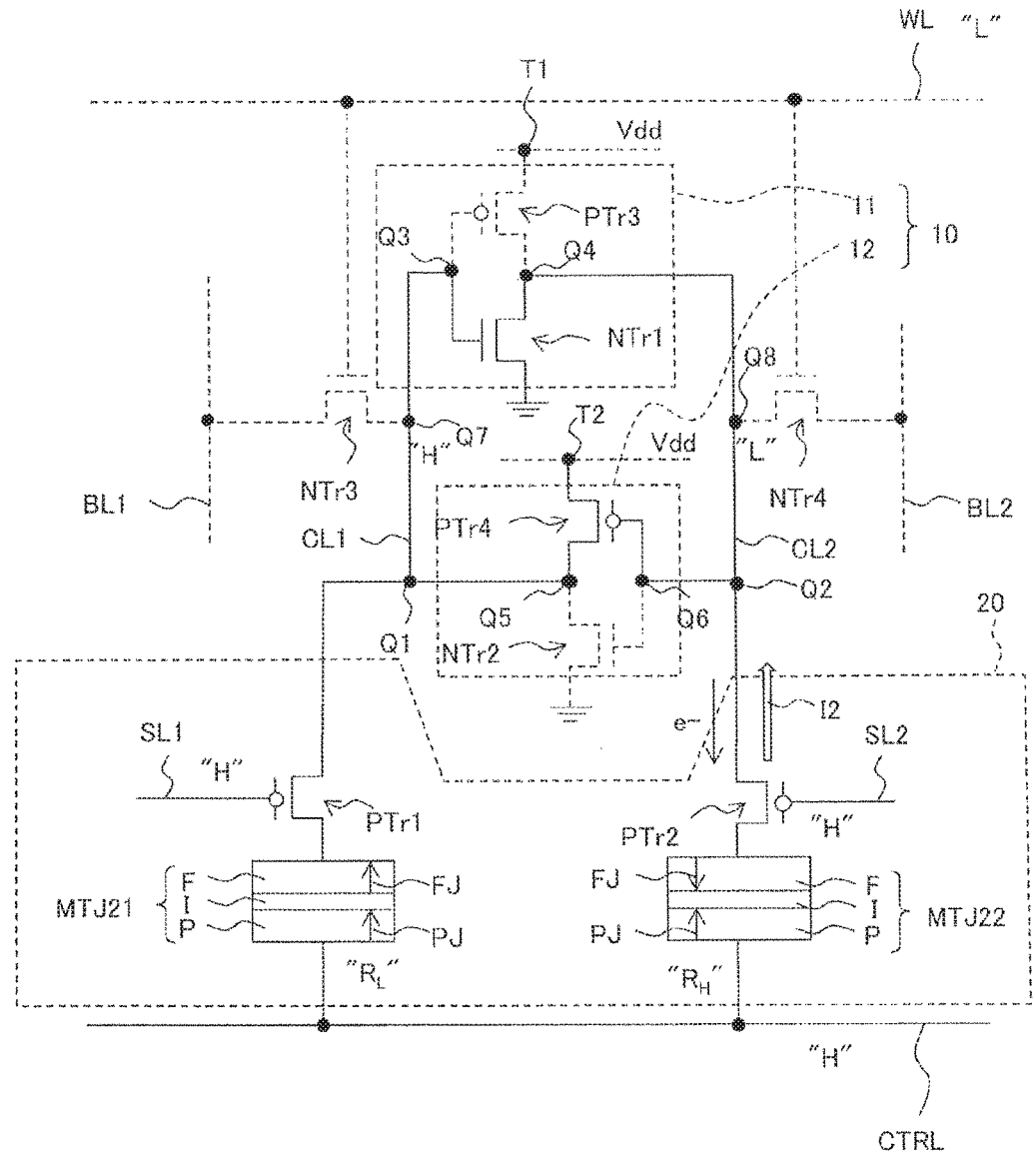

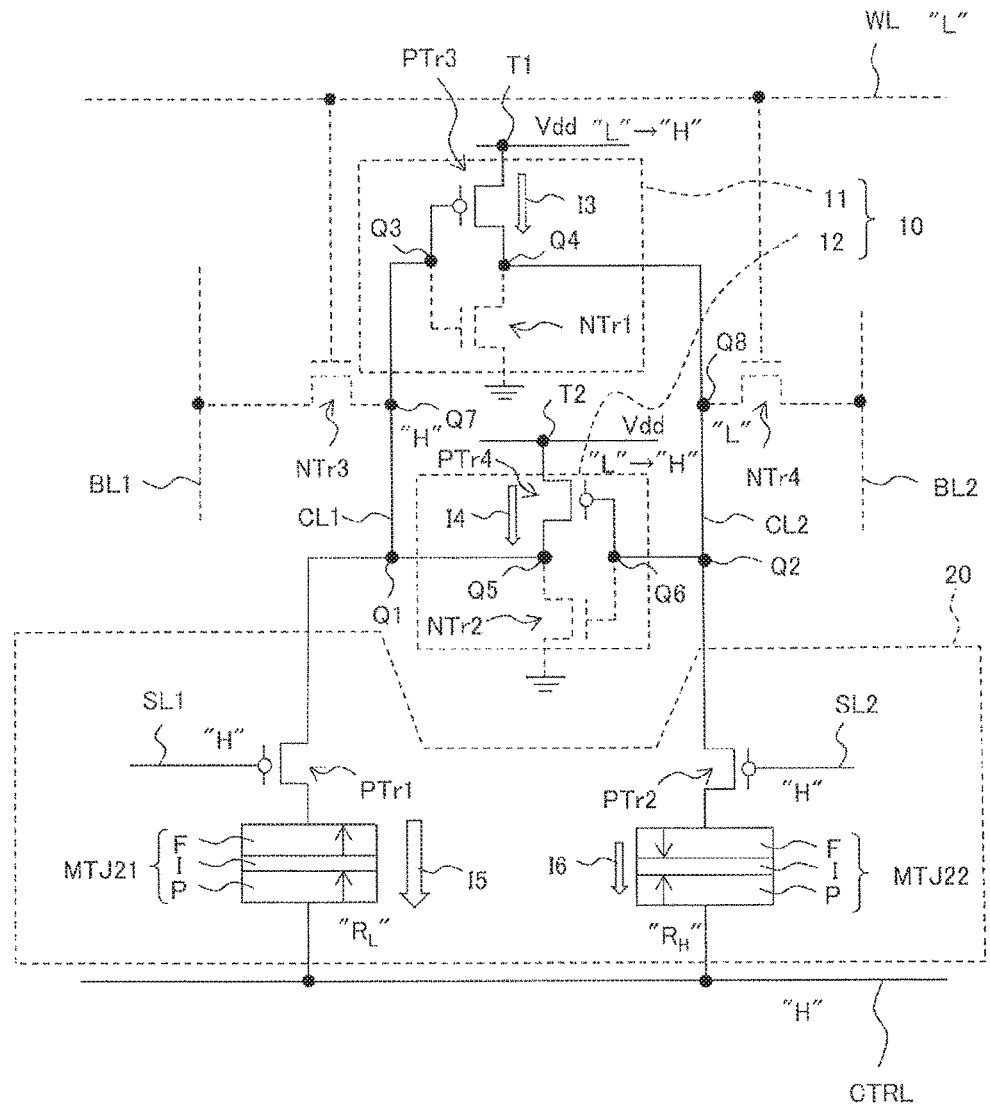
[ FIG. 6 ]

[ FIG. 7A ]
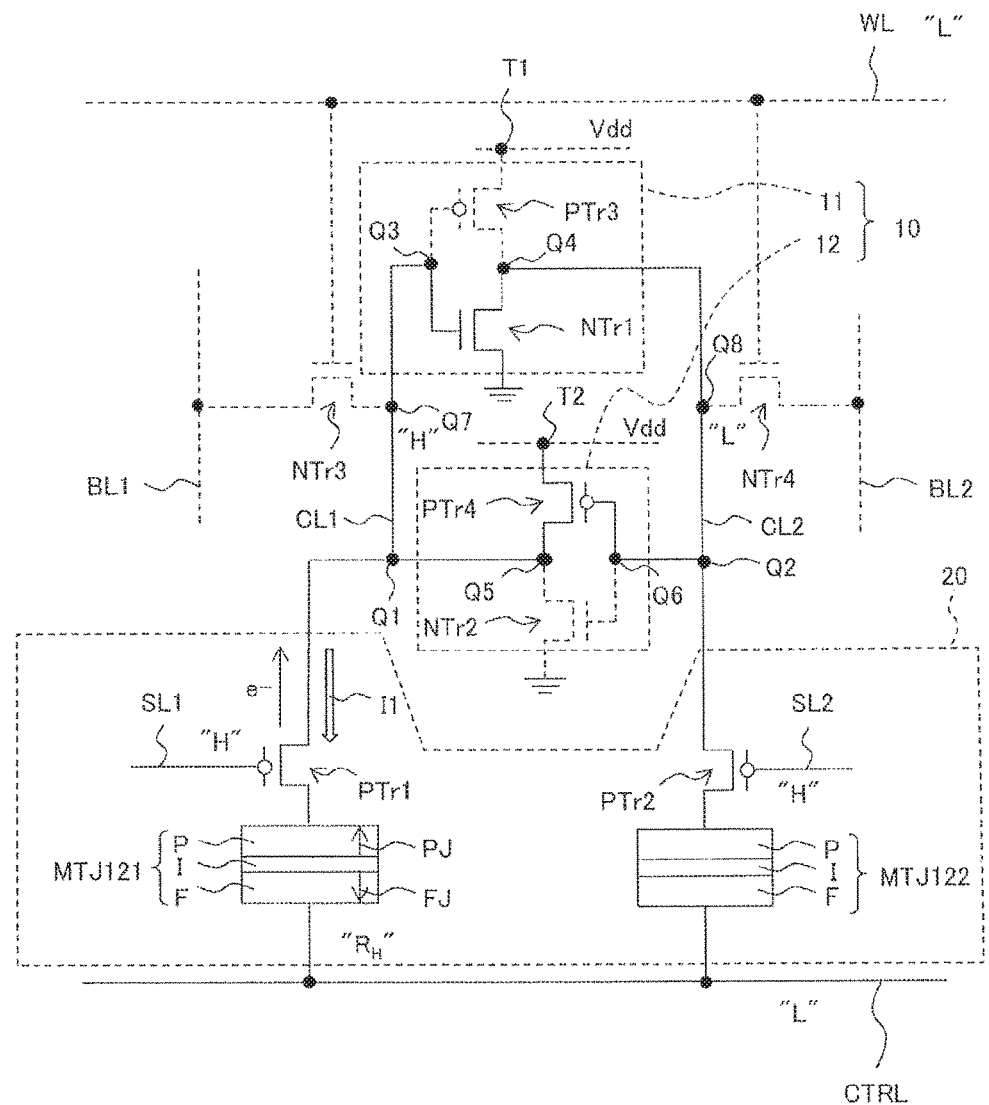

[ FIG. 7B ]
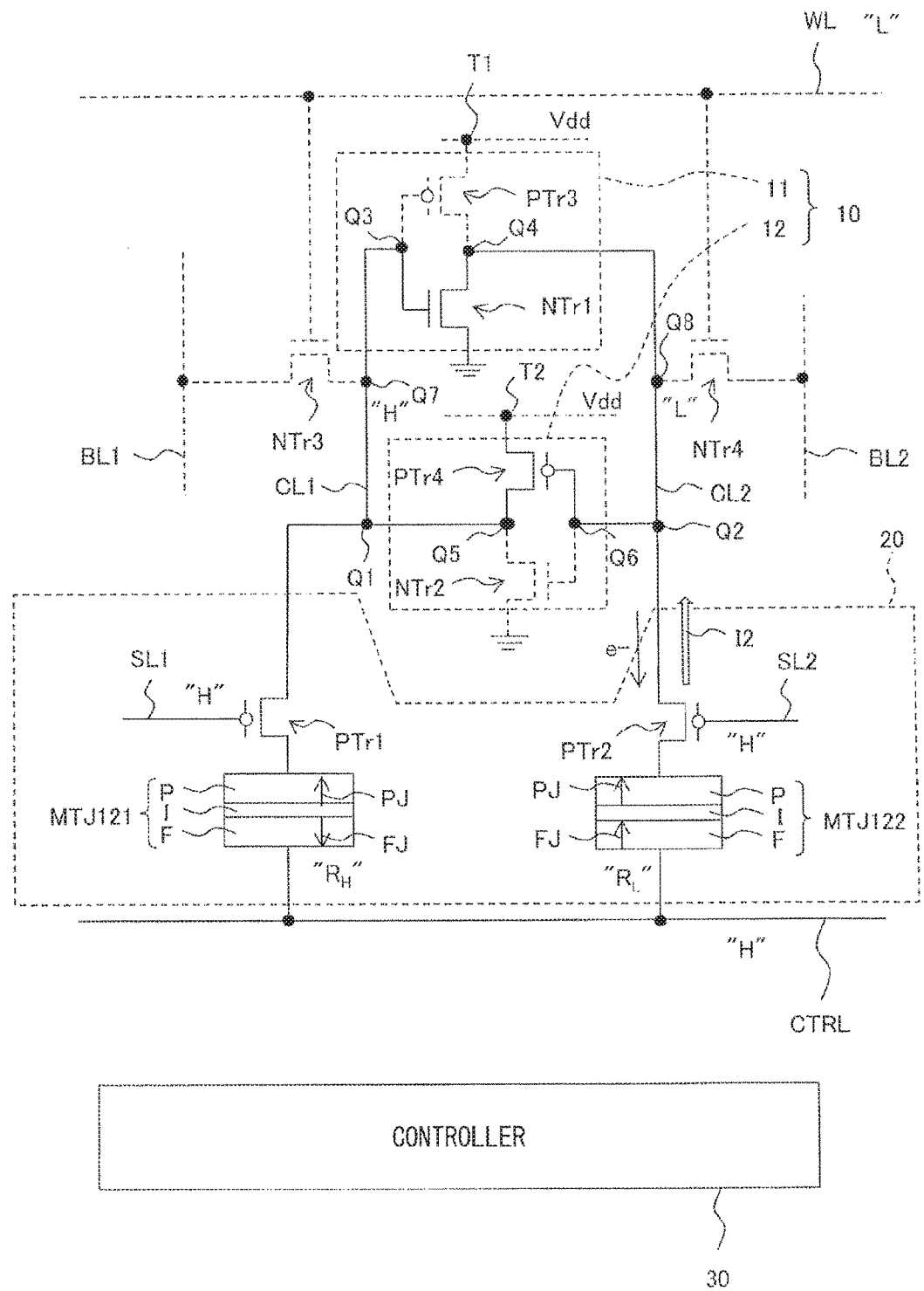

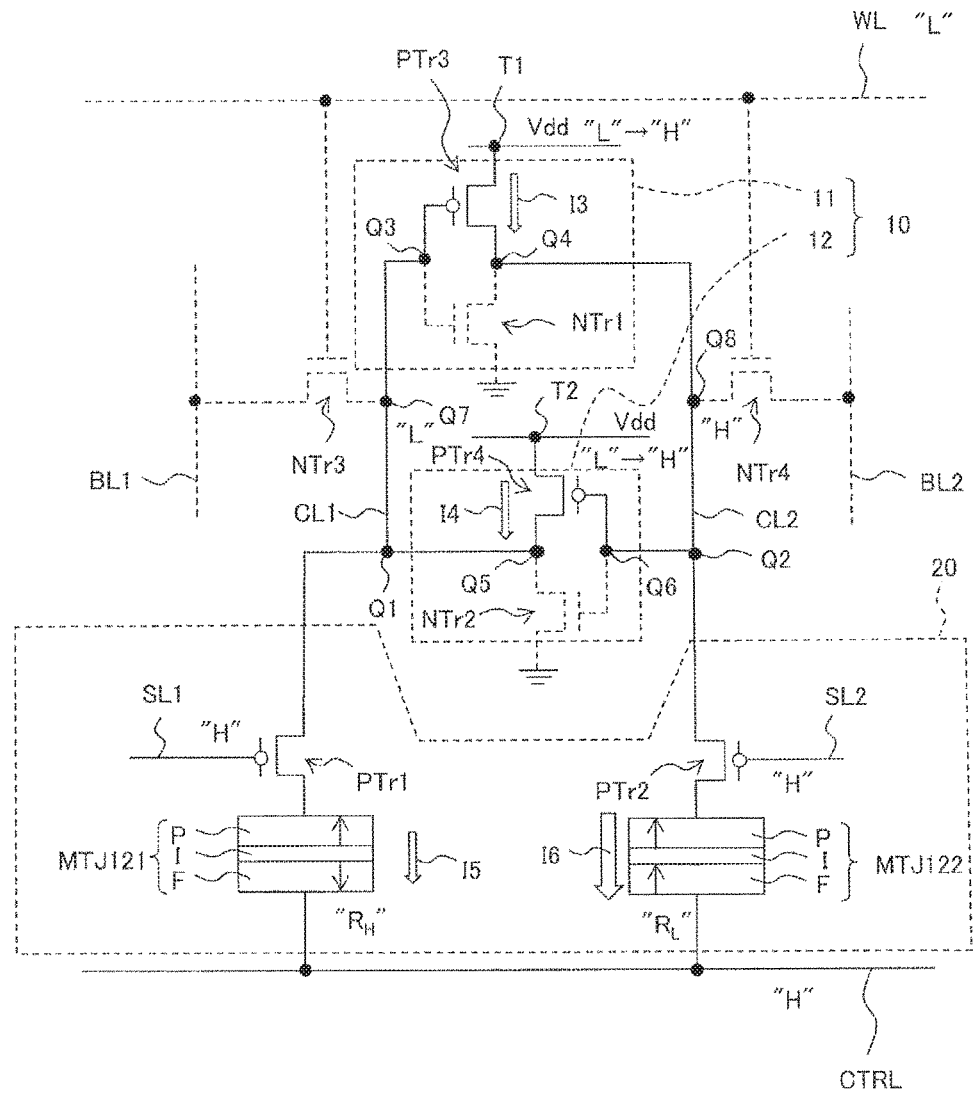
[ FIG. 8 ]

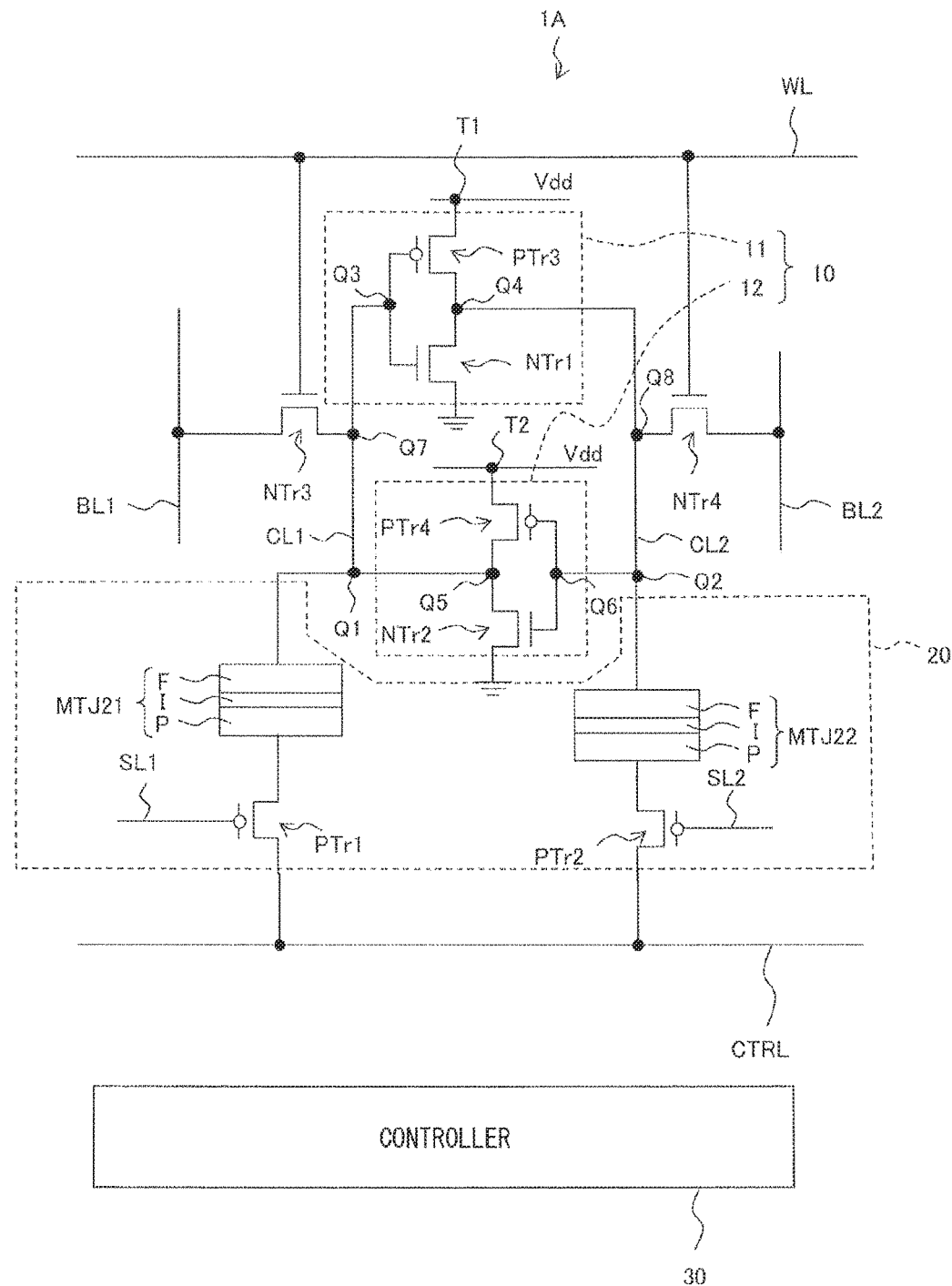
[FIG. 9A]

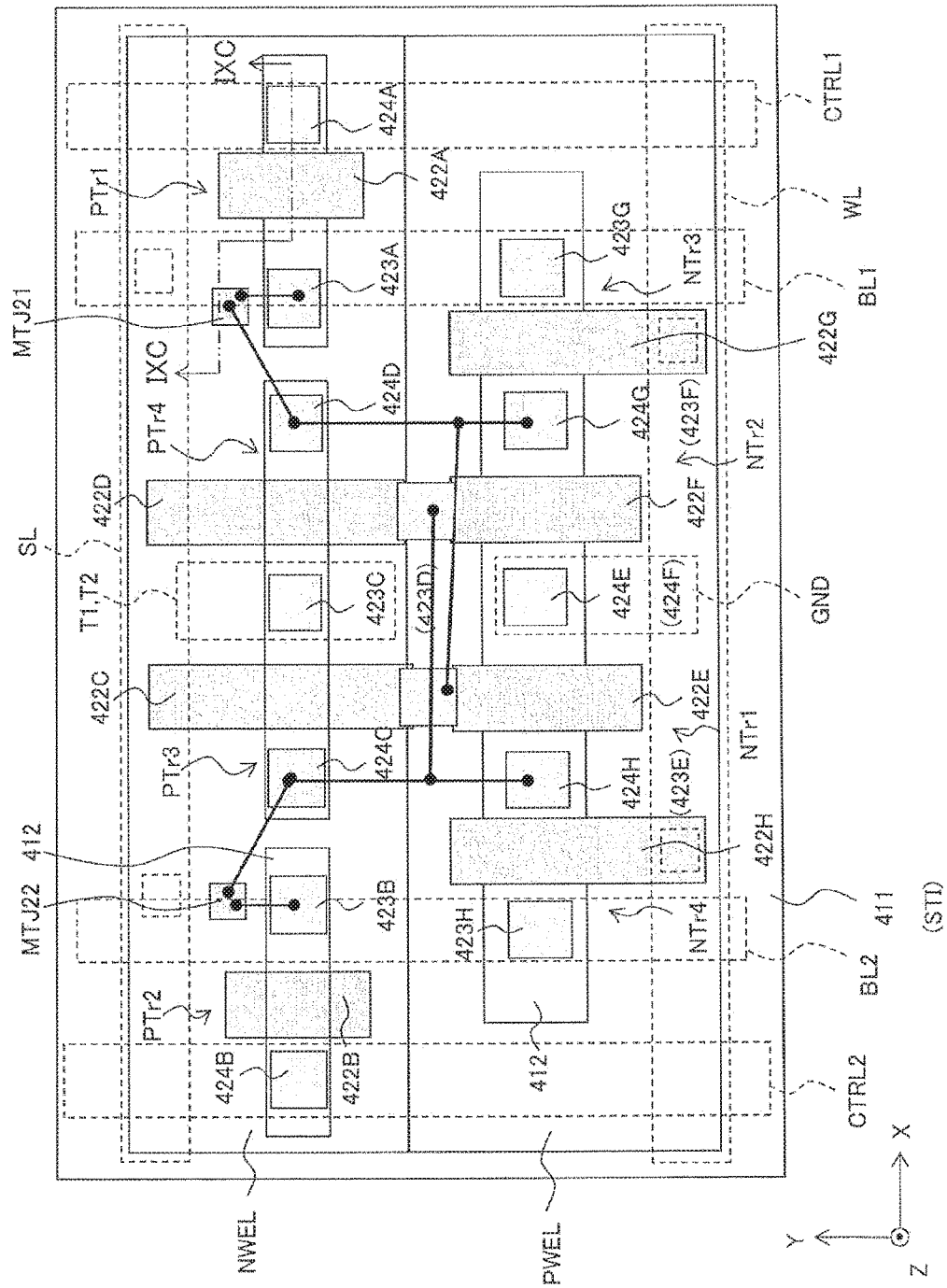
[FIG. 9B]

[ FIG. 9C ]
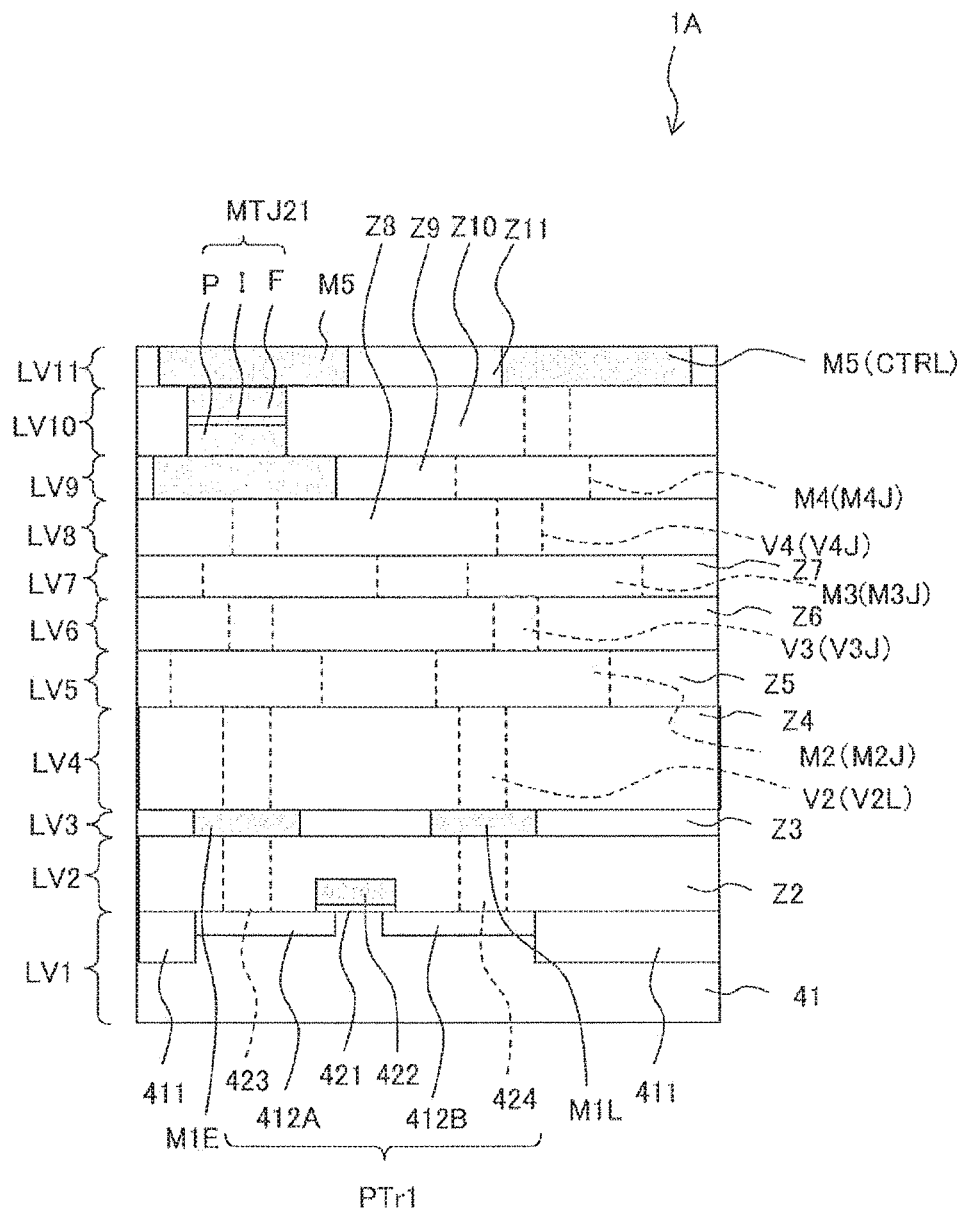

[ FIG. 10A ]
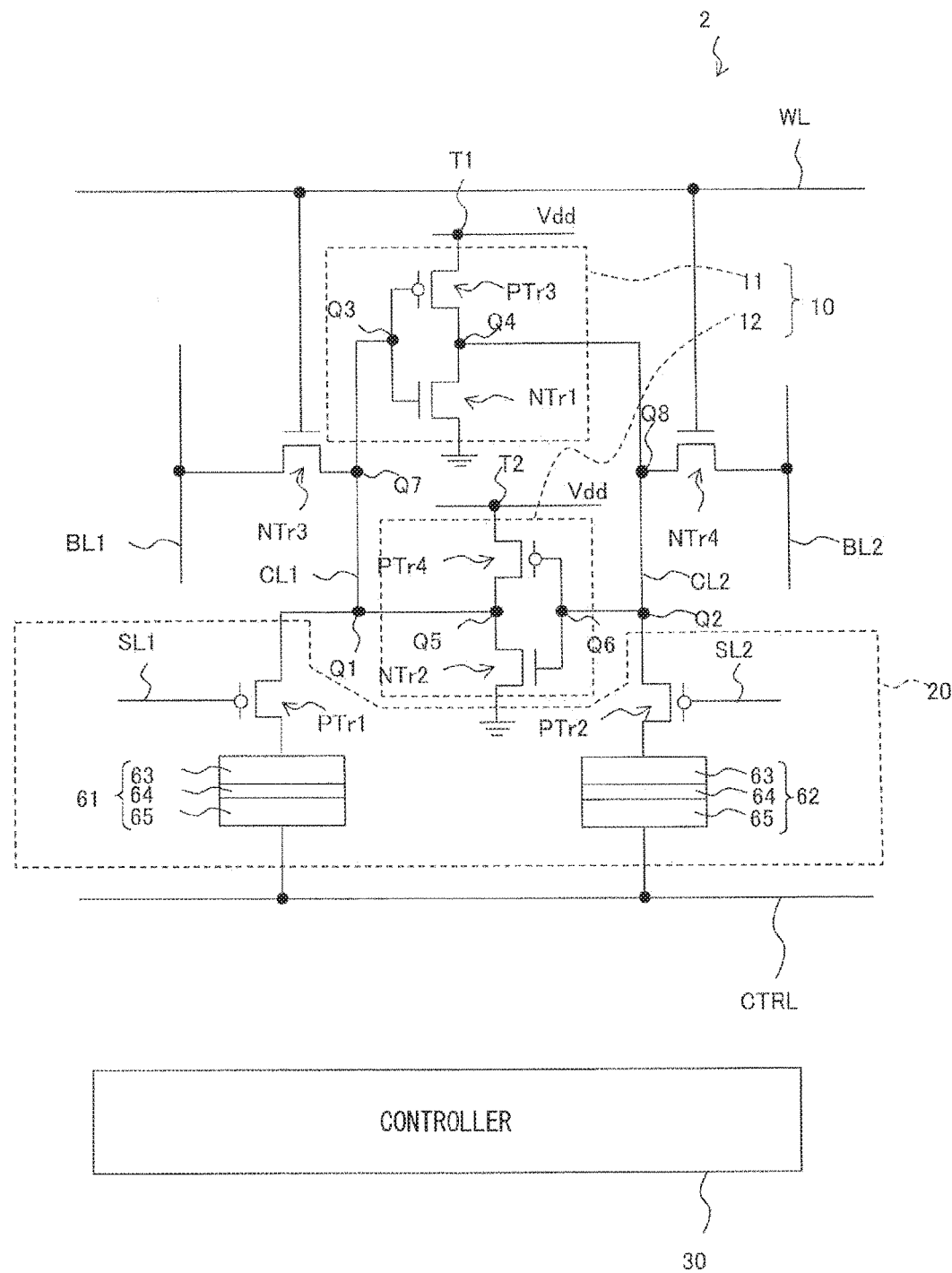

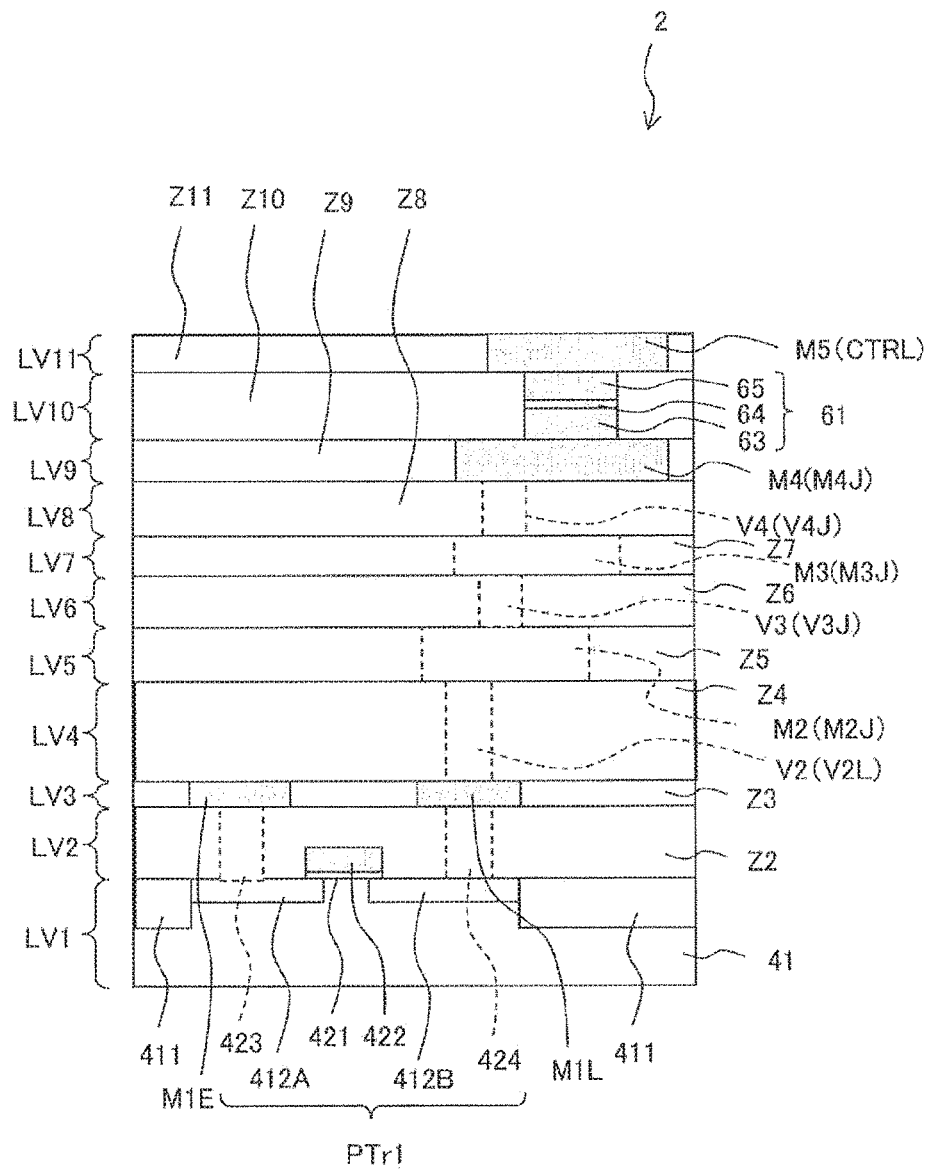
[ FIG. 10B ]

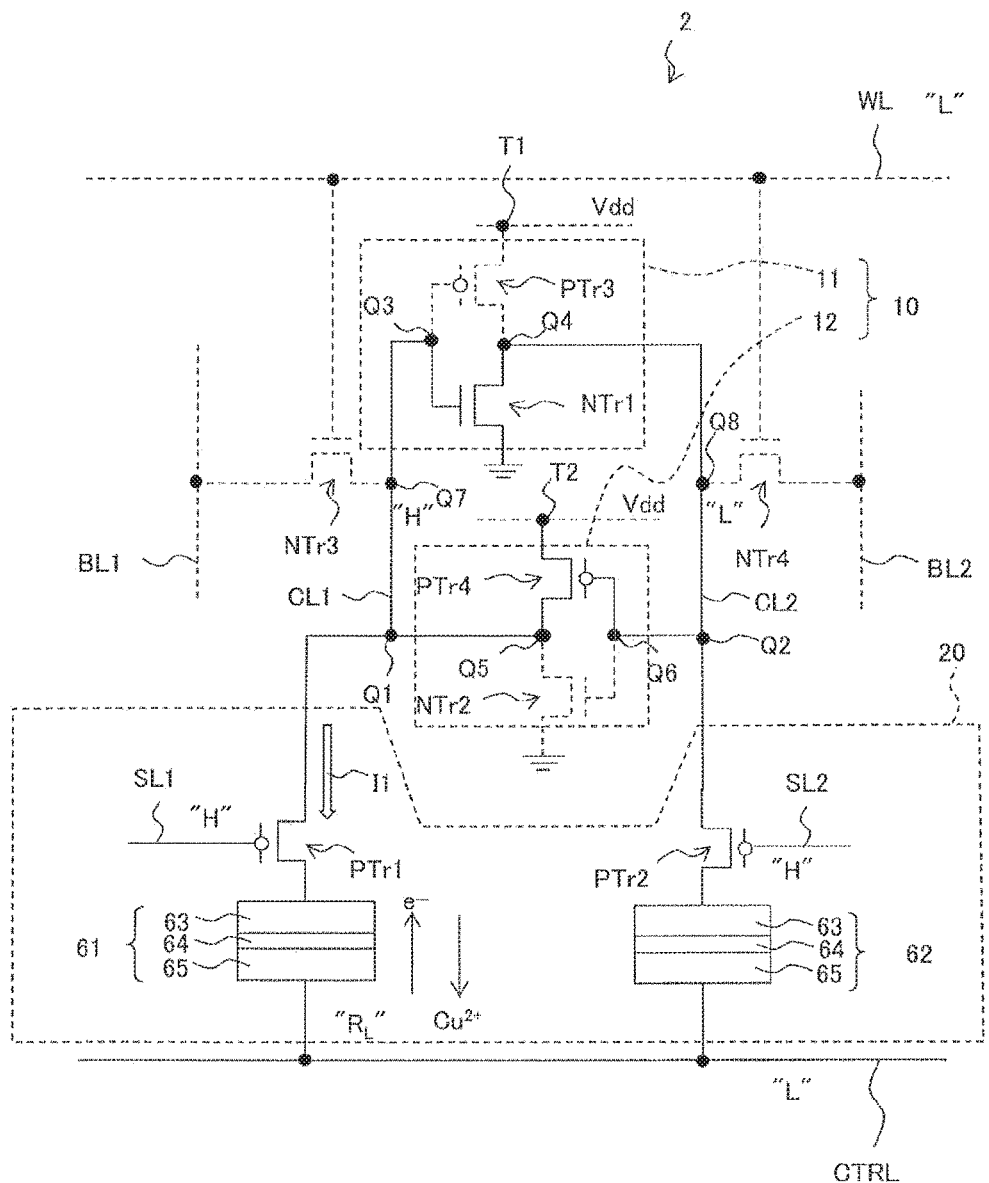
[FIG. 11A]

[FIG. 11B]
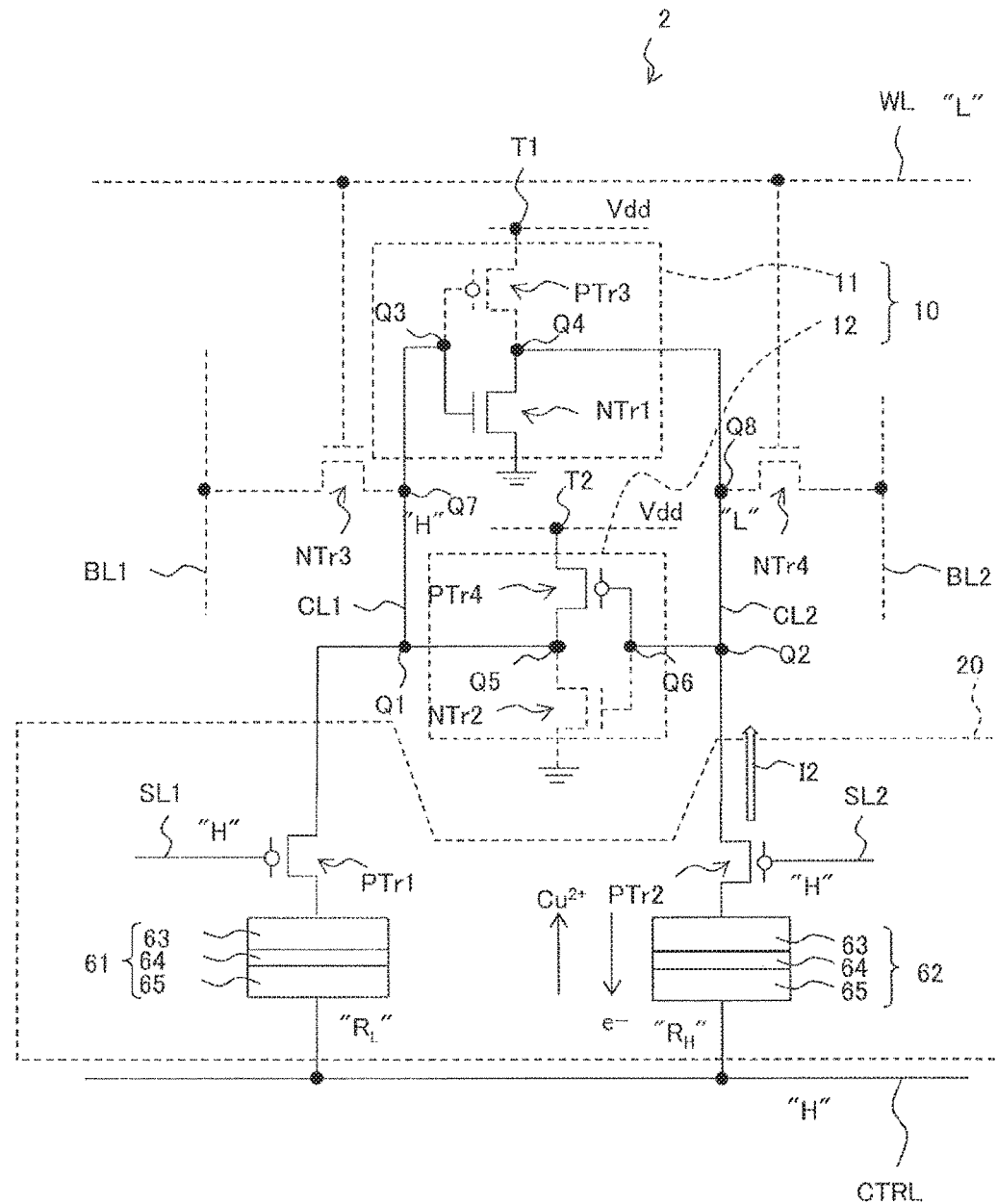

[ FIG. 12A ]
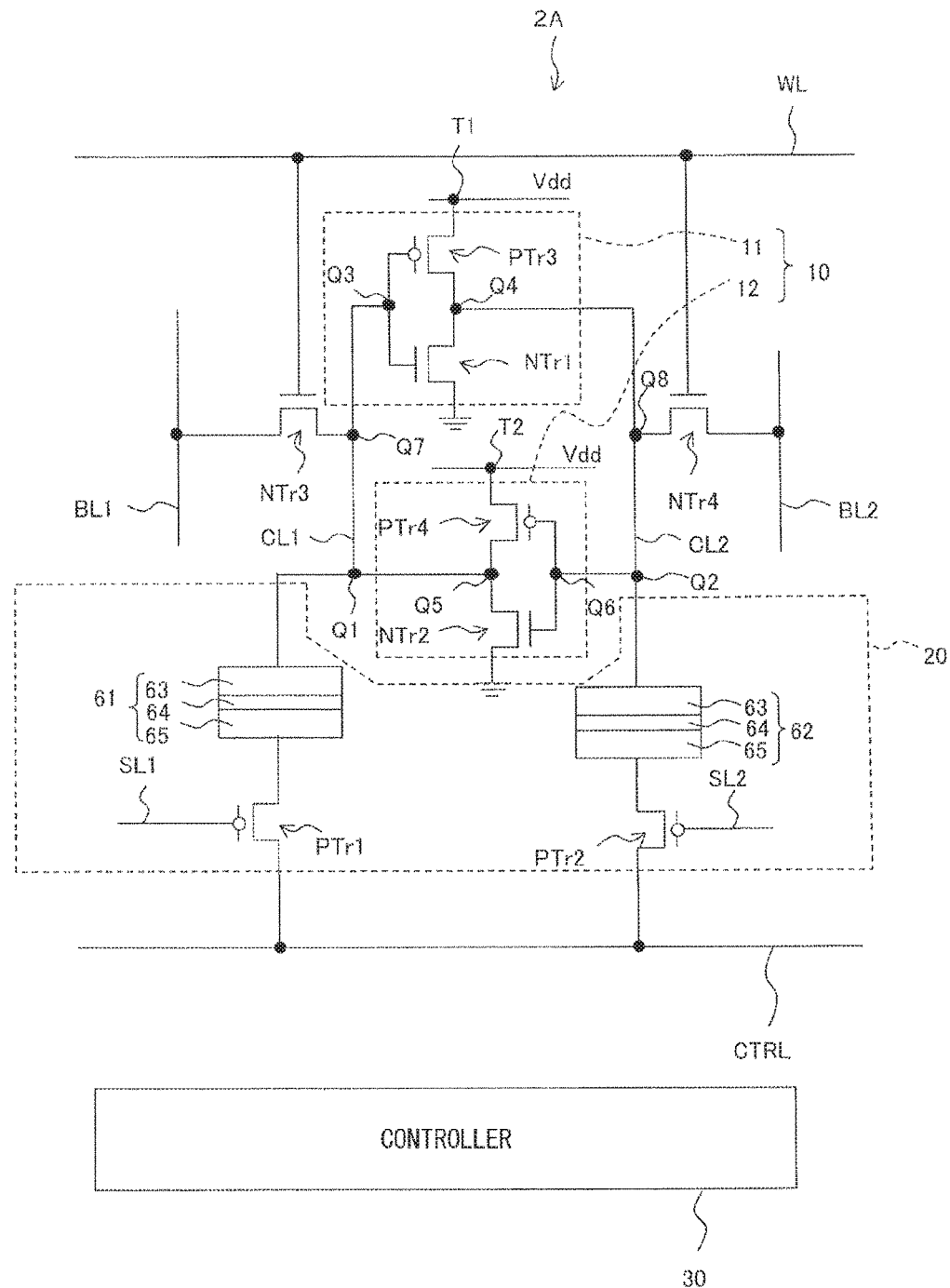

[FIG. 12B]
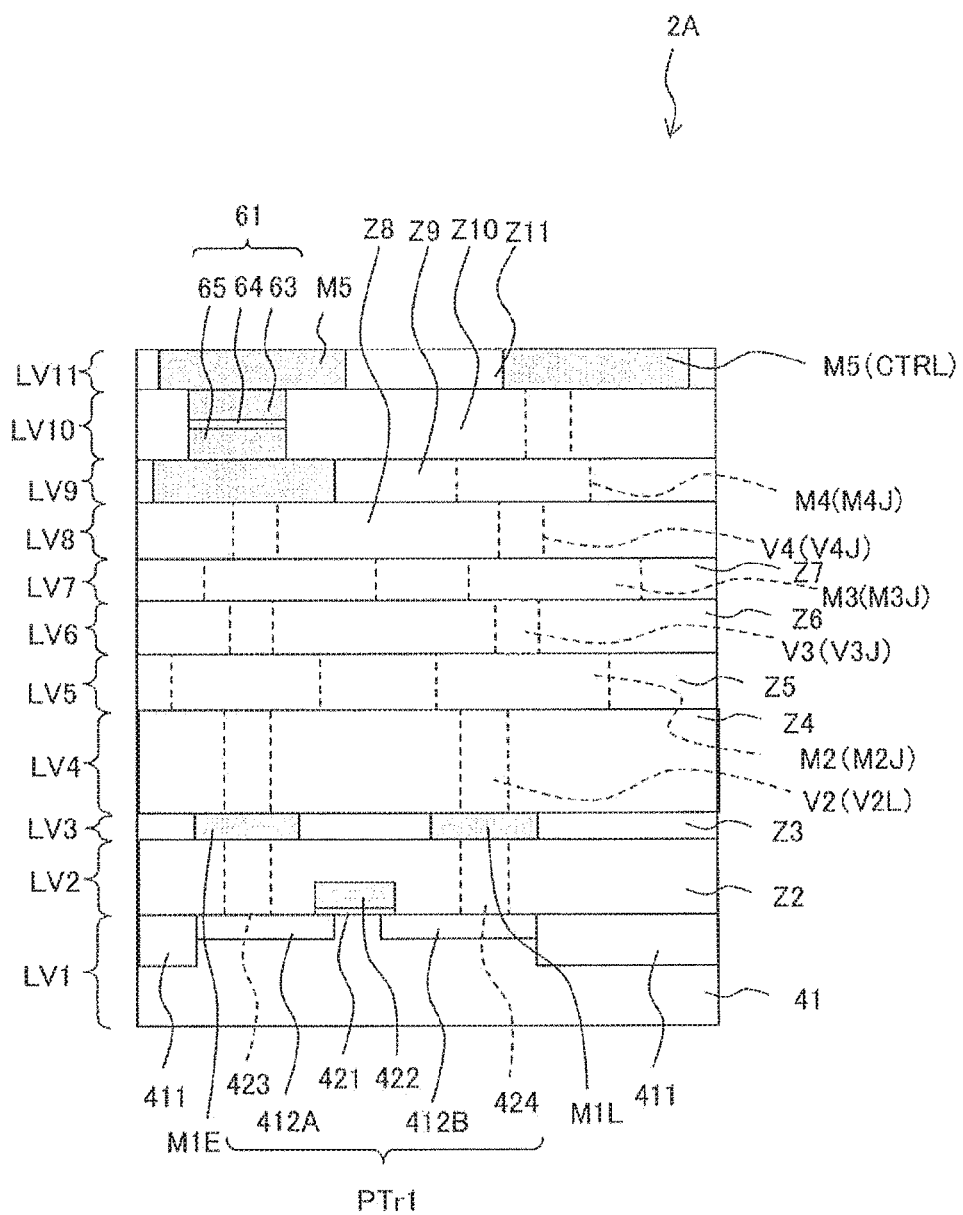

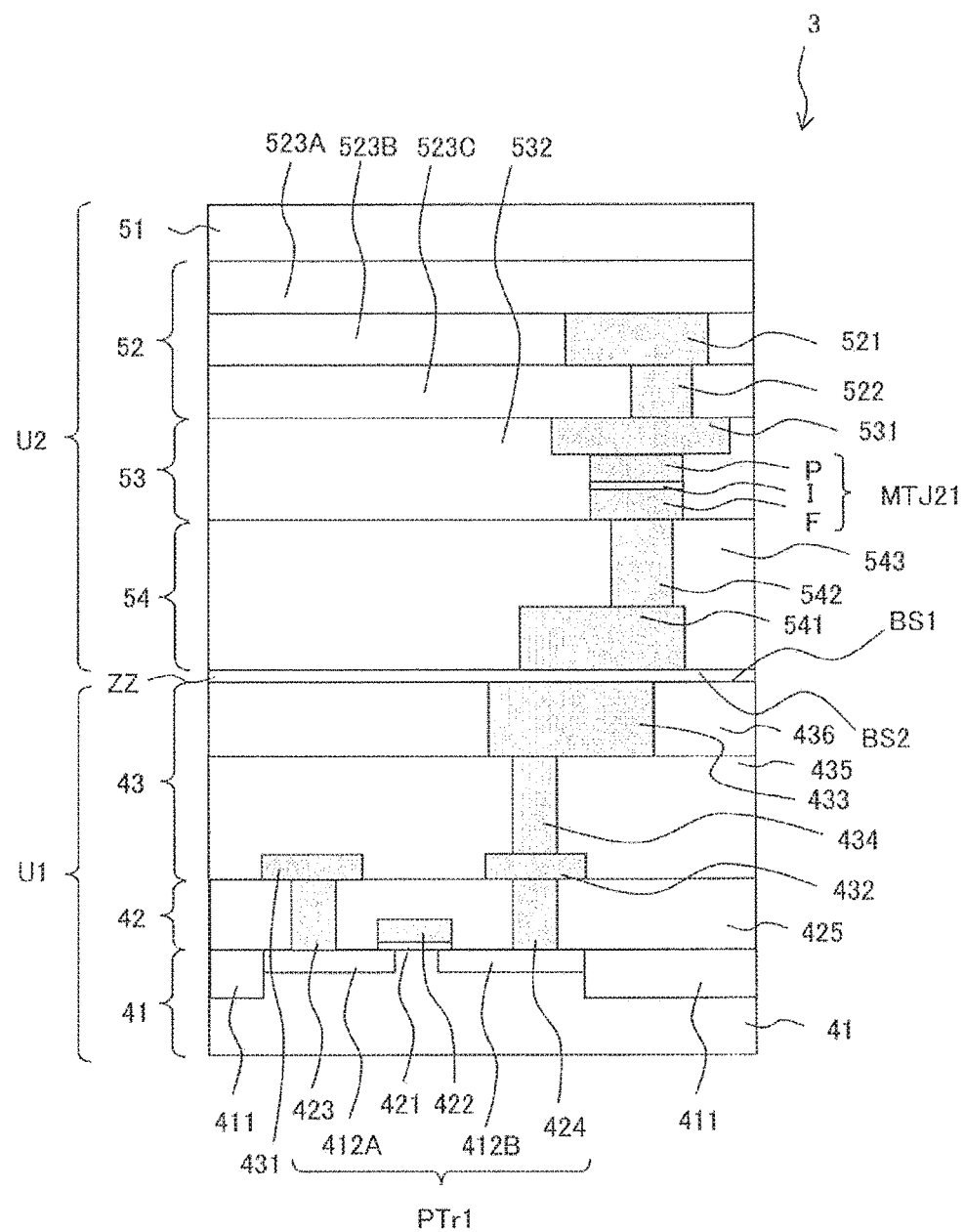
[ FIG. 13 ]

[ FIG. 14A ]
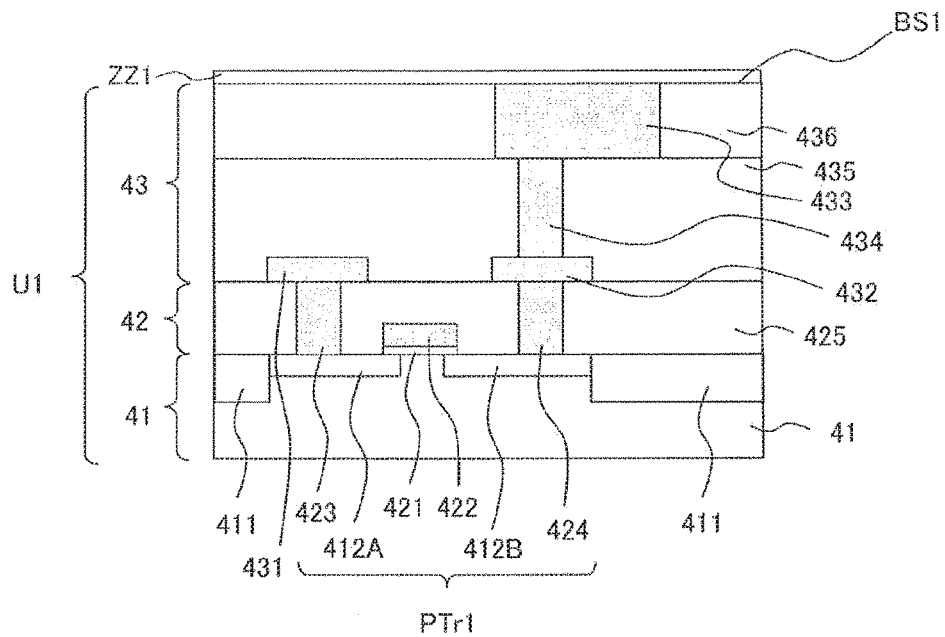
[ FIG. 14B ]
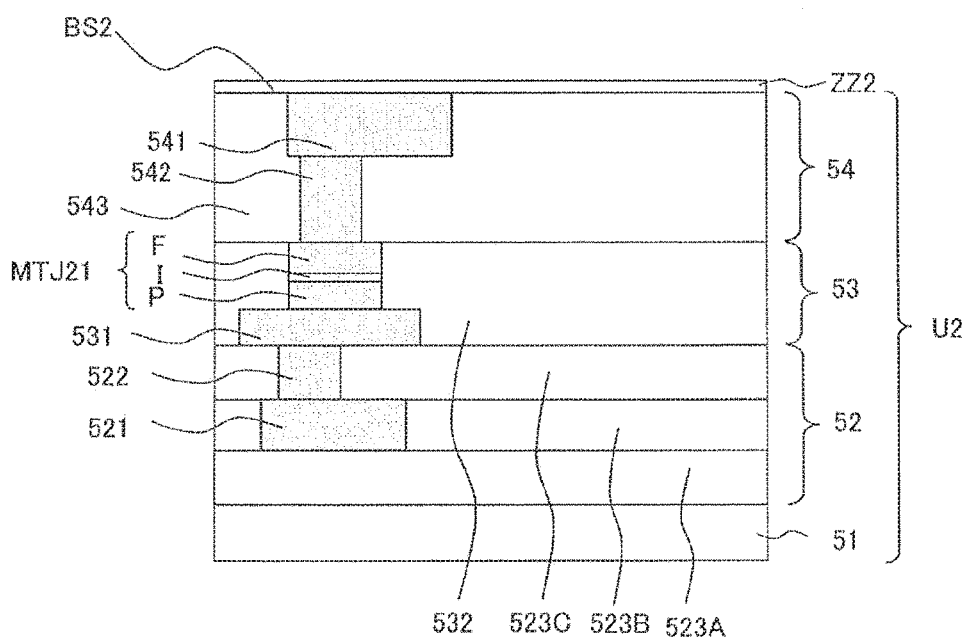

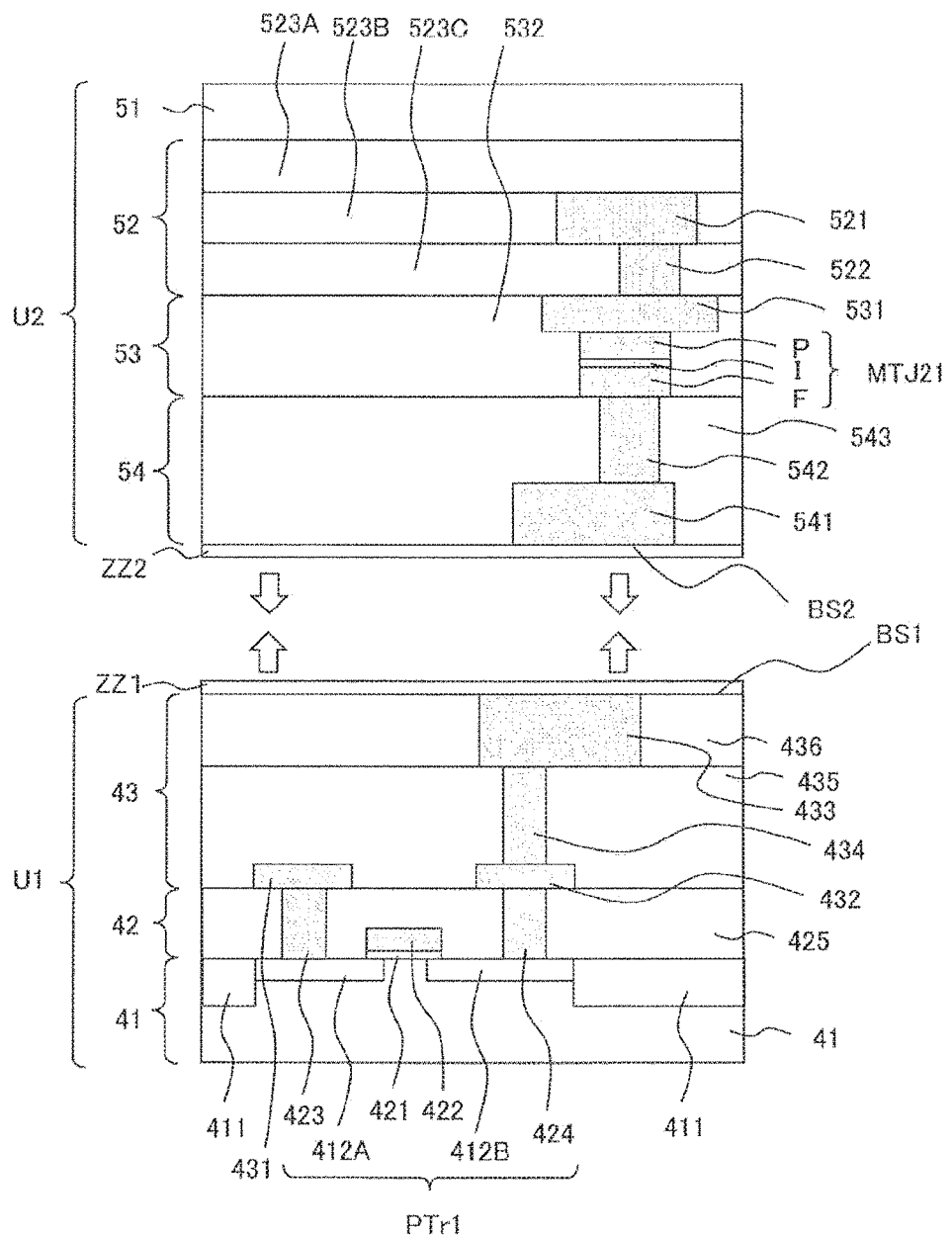
[FIG. 14C]

[ FIG. 15A ]
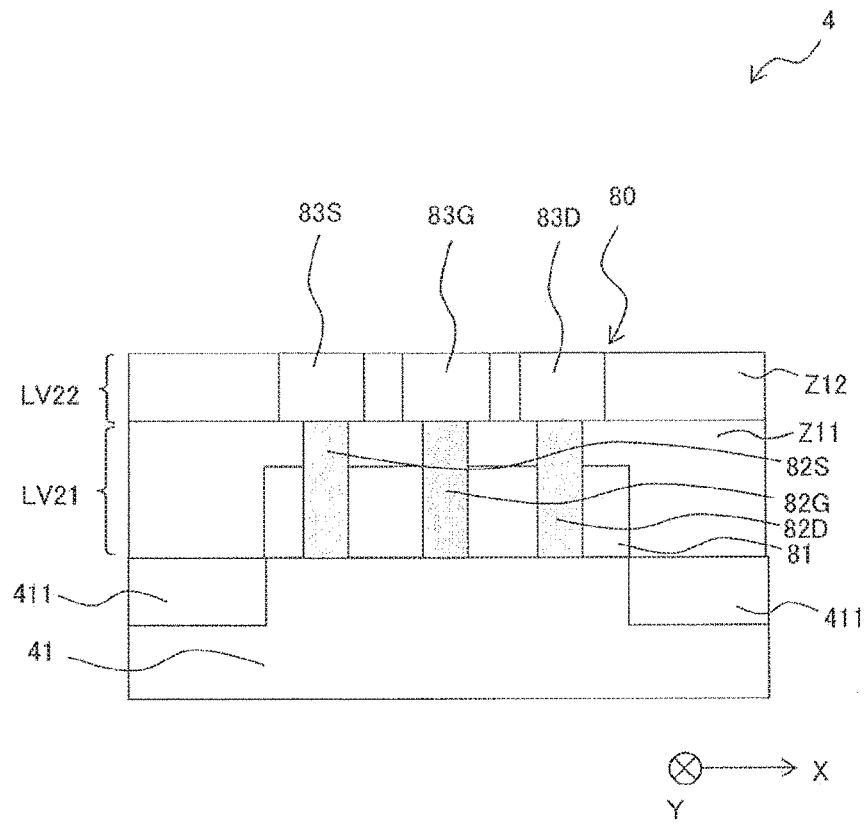
[ FIG. 15B ]
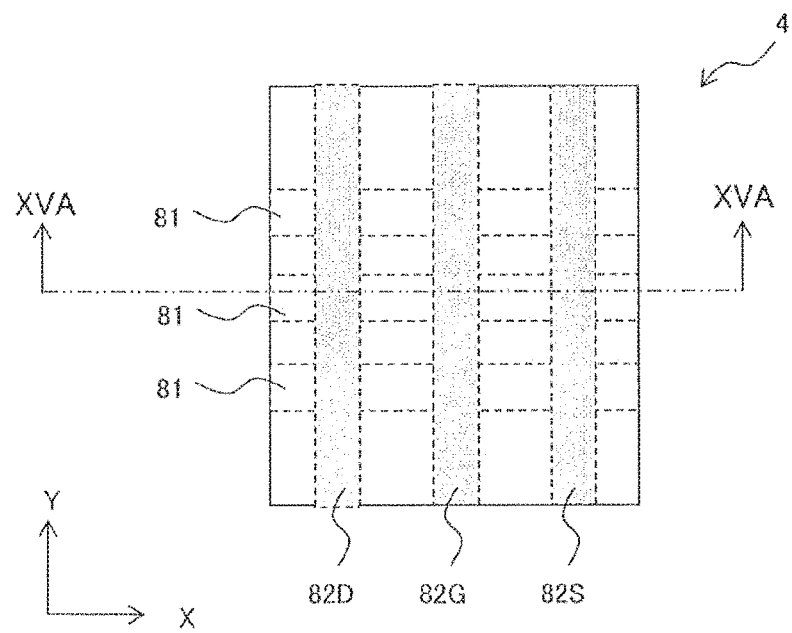

[ FIG. 16 ]
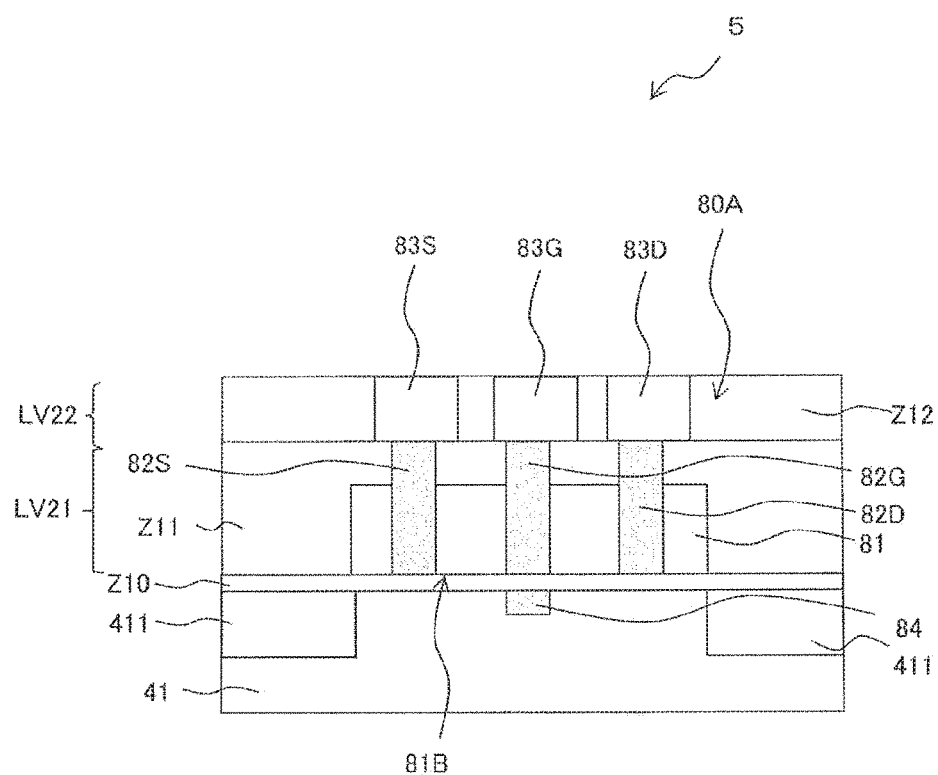

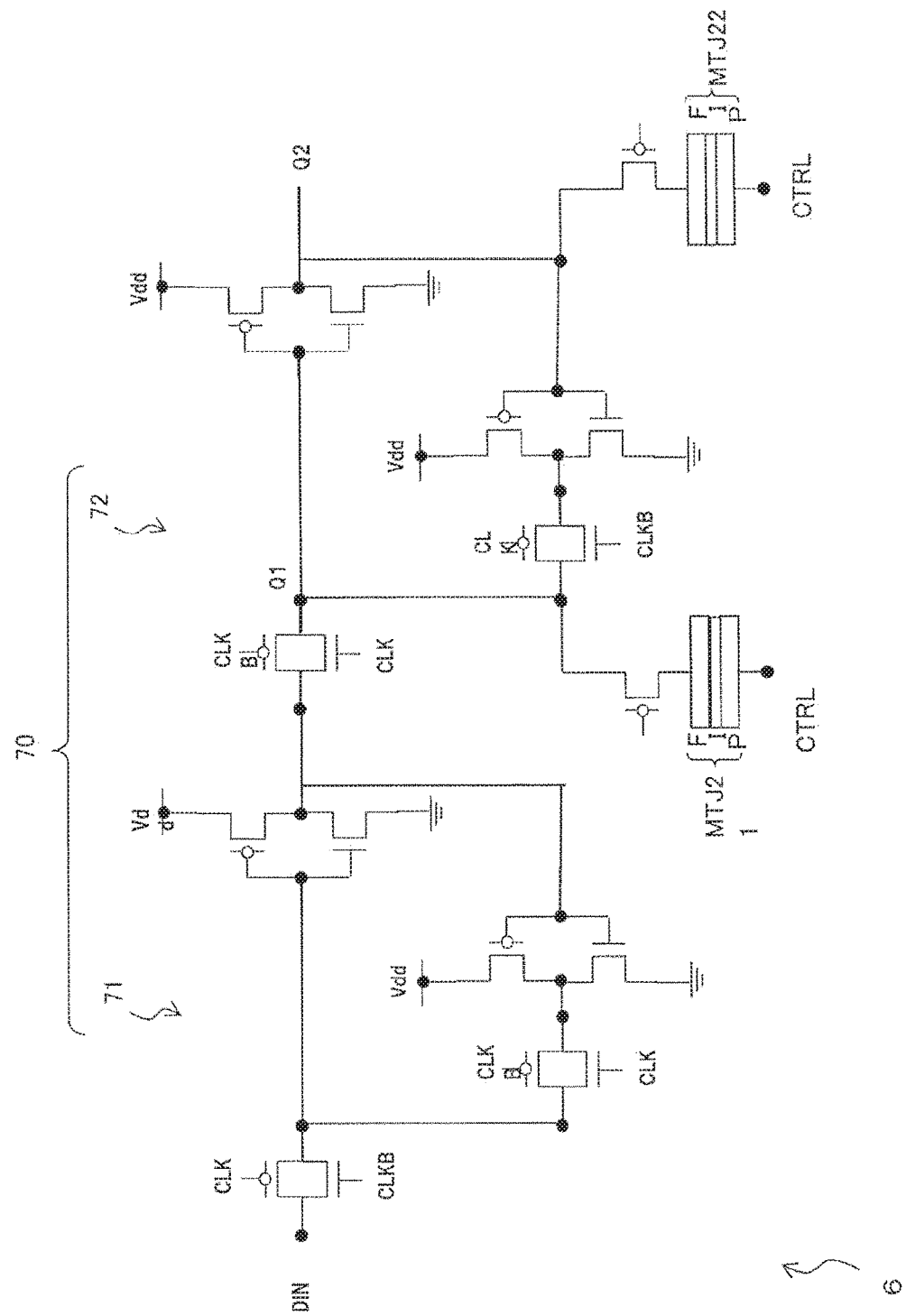
[FIG. 17]

SEMICONDUCTOR DEVICE INCLUDING VOLATILE AND NON-VOLATILE MEMORY

TECHNICAL FIELD

The disclosure relates to a semiconductor device including a non-volatile storage element and a flip-flop circuit.

BACKGROUND ART

Higher integration and higher operational speed of a semiconductor integrated circuit including a complementary metal oxide semiconductor (CMOS) transistor have been taken into consideration. In recent years, conversion from volatile memories to non-volatile memories has been taken into consideration from the viewpoint of lower power consumption. For example, developments have been in progress for a semiconductor device in which a static random access memory (SRAM) that is a volatile memory and a magnetic tunnel junction element that is a non-volatile memory are combined (see, e.g., PTL 1).

CITATION LIST

Patent Literature

PTL 1: International Publication No. WO2009/028298

SUMMARY OF INVENTION

In PTL 1, however, an SRAM circuit including two P-type FETs and four N-type FETs is combined with further two N-type FETs and two magnetic tunnel junction elements, thus resulting in an increased occupied area of an entire semiconductor device, which prevents miniaturization.

It is therefore desirable to provide a semiconductor device having a structure suitable for higher integration.

A semiconductor device according to an embodiment of the disclosure includes a flip-flop circuit, a control line, a first P-type transistor, a first non-volatile storage element, a secondary first electrically conductive transistor, and a second non-volatile storage element. The flip-flop circuit has a circular structure in which a first inverter circuit, a first connection line, a second inverter circuit, and a second connection line are coupled in order. The first connection line includes a first node, and the second connection line includes a second node. The first P-type transistor is provided between the first node and the control line. The first non-volatile storage element is provided between the first node and the control line. The first non-volatile storage element is coupled in series to the first P-type transistor. The secondary first electrically conductive transistor is provided between the second node and the control line. The second non-volatile storage element is provided between the second node and the control line. The second non-volatile storage element is coupled in series to the second P-type transistor. The first non-volatile storage element is one of a first magnetic tunnel junction element and a first resistance change element. The first magnetic tunnel junction element includes a first pinned layer, a first tunnel barrier layer, and a first free layer that are arranged in order from a position close to the control line. The first resistance change element includes a first electrode layer, a first insulating layer, and a first ion layer that are arranged in order from a position close to the control line. The second non-volatile storage element is one of a second magnetic tunnel junction element and a second resistance change element. The second magnetic tunnel junction element includes a second pinned layer, a second tunnel barrier layer, and a second free layer that are arranged in order from a position close to the control line. The second resistance change element includes a second electrode layer, a second insulating layer, and a second ion layer that are arranged in order from a position close to the control line.

The semiconductor device according to the embodiment of the disclosure is provided with two sets of a unit of the P type transistor and the non-volatile storage element coupled in series together between the flip-flop circuit and the control line. This achieves a compact overall configuration. In addition, each non-volatile storage element is one of a magnetic tunnel junction element and a resistance change element each including a plurality of layers arranged in a predetermined order. Therefore, data inversion is prevented when data stored in the non-volatile storage element from the flip-flop circuit are restored in the flip-flop circuit from the non-volatile storage element.

Another semiconductor device according to an embodiment of the disclosure includes a flip-flop circuit, a control line, a primary first electrically conductive transistor, a first non-volatile storage element, a secondary first electrically conductive transistor, a second non-volatile storage element, a first bit line, a primary second electrically conductive transistor, a second bit line, and a secondary second electrically conductive transistor. The flip-flop circuit has a circular structure in which a first inverter circuit, a first connection line, a second inverter circuit, and a second connection line are coupled in order. The first connection line includes a first node, and the second connection line includes a second node. The primary first electrically conductive transistor is provided between the first node and the control line. The first non-volatile storage element is provided between the first node and the control line. The first non-volatile storage element is coupled in series to the primary first electrically conductive transistor. The secondary first electrically conductive transistor is provided between the second node and the control line. The second non-volatile storage element is provided between the second node and the control line. The second non-volatile storage element is coupled in series to the secondary first electrically conductive transistor. The primary second electrically conductive transistor is provided between the first bit line and the first connection line. The secondary second electrically conductive transistor is provided between the second bit line and the second connection line. The first inverter circuit includes a tertiary first electrically conductive transistor and a tertiary second electrically conductive transistor that are coupled together in series. The second inverter circuit includes a quaternary first electrically conductive transistor and a quaternary second electrically conductive transistor that are coupled together in series.

In another semiconductor device according to an embodiment of the disclosure, the number of the first electrically conductive transistor and the number of the second electrically conductive transistor are well-balanced, which is advantageous to a compact overall configuration.

According to the semiconductor device of the embodiment of the disclosure, it becomes possible to achieve higher integration. It is to be noted that the effects of the disclosure are not limited to those described above, and may be any effects described hereinafter.

BRIEF DESCRIPTION OF DRAWINGS

FIG. 1 is a circuit diagram illustrating a configuration example of a semiconductor device according to a first embodiment of the disclosure.

FIG. 2 is a plan view of a configuration example of the semiconductor device illustrated in FIG. 1.

FIG. 3 is a cross-sectional view of a configuration example of a key part of the semiconductor device illustrated in FIG. 1.

FIG. 4A is a plan view of a process in a method of manufacturing the semiconductor device illustrated in FIG. 1.

FIG. 4B is a cross-sectional view of a process subsequent to FIG. 4A.

FIG. 4C is a cross-sectional view of a process subsequent to FIG. 4B.

FIG. 4D is a cross-sectional view of a process subsequent to FIG. 4C.

FIG. 4E is a cross-sectional view of a process subsequent to FIG. 4D.

FIG. 4F is a cross-sectional view of a process subsequent to FIG. 4E.

FIG. 4G is a cross-sectional view of a process subsequent to FIG. 4F.

FIG. 4H is a cross-sectional view of a process subsequent to FIG. 4G.

FIG. 4J is a cross-sectional view of a process subsequent to FIG. 4H.

FIG. 4K is a cross-sectional view of a process subsequent to FIG. 4J.

FIG. 5A is an explanatory diagram of a method for storing data in a non-volatile storage element in the semiconductor device illustrated in FIG. 1.

FIG. 5B is another explanatory diagram of a method for storing data in the non-volatile storage element in the semiconductor device illustrated in FIG. 1.

FIG. 6 is an explanatory diagram of a method for reading out data stored in the non-volatile storage element in the semiconductor device illustrated in FIG. 1.

FIG. 7A is an explanatory diagram of a method for storing data in the non-volatile storage element in a semiconductor device as a reference example.

FIG. 7B is another explanatory diagram of a method for storing data in the non-volatile storage element in the semiconductor device as a reference example.

FIG. 8 is an explanatory diagram of a method for reading out data stored in the non-volatile storage element in the semiconductor device as a reference example.

FIG. 9A is a circuit diagram illustrating a first modification example of the semiconductor device according to the first embodiment of the disclosure.

FIG. 9B is a plan view of a configuration example of the semiconductor device illustrated in FIG. 9A.

FIG. 9C is a cross-sectional view of a configuration example of a key part of the semiconductor device illustrated in FIG. 9A.

FIG. 10A is a circuit diagram illustrating a configuration example of a semiconductor device according to a second embodiment of the disclosure.

FIG. 10B is a cross-sectional view of a configuration example of a key part of the semiconductor device illustrated in FIG. 10A.

FIG. 11A is an explanatory diagram of a method for storing data in a non-volatile storage element in the semiconductor device illustrated in FIGS. 10A and 10B.

FIG. 11B is another explanatory diagram of a method for storing data in the non-volatile storage element in the semiconductor device illustrated in FIGS. 10A and 10B.

FIG. 12A is a circuit diagram illustrating a modification example of the semiconductor device according to the second embodiment of the disclosure.

FIG. 12B is a cross-sectional view of a configuration example of a key part of the semiconductor device illustrated in FIG. 12A.

FIG. 13 is a cross-sectional view of a configuration example of a semiconductor device according to a third embodiment of the disclosure.

FIG. 4A is a plan view of a process in a method of manufacturing the semiconductor device illustrated in FIG. 13.

FIG. 14B is a cross-sectional view of a process subsequent to FIG. 14A.

FIG. 14C is a cross-sectional view of a process subsequent to FIG. 14B.

FIG. 15A is a cross-sectional view of a configuration example of a key part of a semiconductor device according to a fourth embodiment of the disclosure.

FIG. 15B is a plan view of a configuration example of the key part of the semiconductor device illustrated in FIG. 15A.

FIG. 16 is a cross-sectional view of a configuration example of a key part of a semiconductor device according to a fifth embodiment of the disclosure.

FIG. 17 is a circuit diagram illustrating a configuration example of a semiconductor device as another modification example.

DESCRIPTION OF EMBODIMENTS

Some embodiments of the disclosure are described below in the following order with reference to drawings.
1. First Embodiment (A semiconductor device having an MTJ element of a top spin structure)
2. First Modification Example of First Embodiment (A modification example in which arrangement of an MTJ element is changed)
3. Second Modification Example of First Embodiment (An example in which writing into an MTJ element is performed in batch at an intermediate potential)
4. Second Embodiment (A semiconductor device having a ReRAM element)
5. Modification Example of Second Embodiment (A modification example in which arrangement of a ReRAM element is changed)
6. Third Embodiment (A semiconductor device adopting a joining structure)
7. Fourth Embodiment (A semiconductor device adopting Fin-FET)
8. Fifth Embodiment (A semiconductor device adopting nano-wire FET)
9. Another Modification Example (A modification example of a flip-flop circuit)

[1. First Embodiment]
[Configuration of Semiconductor Device 1]

Description is given of a configuration of a semiconductor device 1 as a first embodiment of the disclosure, with reference to FIGS. 1 to 3. FIG. 1 illustrates a circuit configuration of the semiconductor device 1. FIG. 2 illustrates a planar configuration of the semiconductor device 1. Further, FIG. 3 corresponds to a cross-sectional view along a cut line III-III illustrated in FIG. 2 as viewed in a direction of arrows.

The semiconductor device 1 includes a flip-flop circuit 10, a non-volatile storage section 20, and a controller 30. The flip-flop circuit 10 includes an inverter circuit 11 and an inverter circuit 12. The non-volatile storage section 20 includes a magnetic tunnel junction (MTJ) element 21 and MTJ 22 as a specific example of a second non-volatile storage element. Here, the MTJ 21 is a specific example of a "first non-volatile storage element" of the disclosure, and the MTJ 22 is a specific example of the "second non-volatile storage element" of the disclosure.

The semiconductor device 1 may further include a word line WL, bit lines BL1 and BL 2, a selection line SL, and a control line CTR.

[Configuration of Flip-Flop Circuit 10]

The flip-flop circuit 10 has a circular structure in which an inverter circuit 11, a connection line CL1 including a node Q1, an inverter circuit 12, and a connection line CL 2 including a node Q2 are coupled in order. The inverter circuit 11 may include a P-type transistor PTr3 and an N-type transistor NTr1 coupled together in series, and the inverter circuit 12 may include a P-type transistor PTr4 and an N-type transistor NTr2 coupled together in series. The transistor as used herein may be a metal oxide semiconductor (MOS) field effect transistor (FET), for example. More specifically, in the inverter circuit 11, a gate electrode of the P-type transistor PTr3 and a gate electrode of the N-type transistor NTr1 may be coupled together at a node Q3, and one of a source electrode and a drain electrode of the P-type transistor PTr3 and one of a source electrode and a drain electrode of the N-type transistor NTr1 may be coupled together at a node Q4. The other of the source electrode and the drain electrode of the P-type transistor PTr3 may be coupled to an external power supply Vdd through a power supply terminal T1, and the other of the source electrode and the drain electrode of the N-type transistor NTr1 may be grounded. Likewise, in the inverter circuit 12, a gate electrode of the P-type transistor PTr4 and a gate electrode of the N-type transistor NTr2 may be coupled together at a node Q5, and one of a source electrode and a drain electrode of the P-type transistor PTr4 and one of a source electrode and a drain electrode of the N-type transistor NTr2 may be coupled together at a node Q6. The other of the source electrode and the drain electrode of the P-type transistor PTr4may be coupled to the external power supply Vdd through a power supply terminal T2, and the other of the source electrode and the drain electrode of the N-type transistor NTr2 may be grounded.

[Configuration of Non-Volatile Storage Section 20]

The non-volatile storage section 20 further includes a P-type transistor PTr1 that is provided between the node Q1 and the control line CTRL, and is coupled in series to the MTJ 21. Further, the non-volatile storage section 20 further includes a P-type transistor PTr2 that is provided between the node Q2 and the control line CTRL, and is coupled in series to the MTJ 22. The other end of a selection line SL1 whose one end is coupled to the controller 30 may be coupled to a gate electrode 422 (described later) of the P-type transistor PTr1. Likewise, the other end of a selection line SL2 whose one end is coupled to the controller 30 may be coupled to the gate electrode 422 of the P-type transistor PTr2. MTJs 21 and 22 each include a pinned layer P, a tunnel barrier layer I, and a free layer F that are arranged in order from a position close to the control line CTRL.

FIG. 3 illustrates a cross-sectional configuration of the semiconductor device 1 near the non-volatile storage section 20. As illustrated in FIG. 3, the semiconductor device 1 has a layered structure in which, for example, levels LV1 to LV11 are stacked in order.

In the level LV1, for example, an element separation layer 411, and a channel layer and a pair of diffusion layers 412A and 412B that configure a portion of the P-type transistor PTr1 may be formed on a substrate 41 made of a semiconductor material such as monocrystalline silicon. The element separation layer 411 may be formed at an element separation region, and the channel layer and the pair of diffusion layers 412A and 412B may be formed at an active region surrounded by the element separation region. The element separation layer 411 may be an insulating film made of silicon oxide ($SiO_2$), for example, and may be formed by shallow trench isolation (STI), for example. Further, the pair of diffusion layers 412A and 412B may be, for example, silicon in which impurities are diffused. The level LV1 and the level LV2 may further include a flip-flop circuit 30.

In the level LV2, a gate insulating film 421 and the gate electrode 422 may be stacked in order on the channel region, and a source electrode 423 and a drain electrode 424 may be formed, respectively, on the pair of diffusion layers 412A and 412B. The gate insulating film 421, the gate electrode 422, the source electrode 423, and the drain electrode 424 may be embedded by an insulating layer Z2. However, a surface of the source electrode 423 and a surface of the drain electrode 424 may be both exposed to an interface between the level LV2 and a level LV3.

In the level LV3, there may be formed a metal layer M1E to be in contact with the surface of the source electrode 423 and a metal layer M1L to be in contact with the surface of the drain electrode 424. A surrounding region of the metal layers M1E and M1L may be embedded by an insulating layer Z3.

In the level LV4, there may be formed a via V2 to be in contact with a surface of the metal layer M1L. A surrounding region of the via V2 may be embedded by an insulating layer Z4.

In the level LV5, there may be formed a metal layer M2 to be in contact with a top surface of the via V2. A surrounding region of the metal layer M2 may be embedded by an insulating layer Z5.

In the level LV6, there may be formed a via V3 to be in contact with a surface of the metal layer M2. A surrounding region of the via V3 may be embedded by an insulating layer Z6.

In the level LV7, there may be formed a metal layer M3 to be in contact with a top surface of the via V3. A surrounding region of the metal layer M3 may be embedded by an insulating layer Z7.

In the level LV8, there may be formed a via V4 to be in contact with a surface of the metal layer M3. A surrounding region of the via V4 may be embedded by an insulating layer Z8.

In the level LV9, there may be formed a metal layer M4 to be in contact with a top surface of the via V4. A surrounding region of the metal layer M4 may be embedded by an insulating layer Z9.

In the level LV10, there may be formed the MTJ 21 to be in contact with a surface of the metal layer M4. A surrounding region of the MTJ 21 may be embedded by an insulating layer Z10.

In the level LV11, there may be formed a metal layer M5 to be in contact with a top surface of the MTJ 21. A surrounding region of the metal layer M5 may be embedded by an insulating layer Z11. However, a top surface of the metal layer M5 may be exposed.

The gate insulating film 421 may be made of a silicon oxide film, for example. Further, the gate electrode 422, the source electrode 423, the drain electrode 424, as well as other metal layers M1 to M5 and vias V2 to V4 may be each configured, for example, by a monolayer structure or a multilayer structure made of a highly electrically conductive non-magnetic material such as copper (Cu), aluminum (Al), gold (Au), platinum (Pt), titanium (Ti), molybdenum (Mo), tantalum (Ta), tungsten (W), titanium nitride (TiN), titanium-tungsten (TiW), tungsten nitride (WN), and a silicide, and may be formed, for example, by a physical vapor deposition (PVD) method such as a sputtering method.

The MTJ 21 and the MTJ 22 may be, for example, spin transfer torque-magnetic tunnel junction (STT-MTJ) storage elements that store information by inverting an orientation of magnetization of the free layer F as a storage layer described later by spin injection. The MTJs 21 and 22 may each have a so-called top spin structure in which the pinned layer P, the tunnel barrier layer I, and the free layer F are stacked in order from above, i.e., from a position close to the control line CTRL. It is to be noted that an underlayer or a protective layer may be further included to cover the surface of the free layer F and the surface of the pinned layer P. The MTJs 21 and 22 may store information by varying an orientation of magnetization FJ of the free layer F having uniaxial anisotropy. More specifically, the information "0" or "1" may be defined by a relative angle (parallel or antiparallel) between the magnetization FJ of the free layer F and magnetization PJ of the pinned layer P. For example, it is possible to associate, with information "0", a low resistance state where the magnetization FJ of the free layer F and the magnetization PJ of the pinned layer P are parallel to each other, whereas it is possible to associate, with information "1", a high resistance state where the magnetization FJ of the free layer F and the magnetization PJ of the pinned layer P are antiparallel to each other.

The pinned layer P may be a reference layer that is set as a reference of recorded information of the free layer F (direction of the magnetization FJ), and may be made of a ferromagnetic body having a magnetic moment in which a direction of the magnetization PJ is fixed, for example, to a direction perpendicular to a film surface. The free layer F may be a ferromagnetic layer having the magnetization FJ that varies freely in the direction perpendicular to the film surface depending on an incoming spin-polarized current. Further, the tunnel barrier layer I may be an intermediate layer that cuts a magnetic coupling between the pinned layer P and the free layer F, and functions to flow a tunnel current.

The MTJs 21 and 22 may be configured to store recorded information by a perpendicular magnetization method, for example. In other words, flowing of the spin-polarized current from the free layer F to the pinned layer P may cause spin-polarized electrons to be injected from the pinned layer P to the free layer F, allowing a direction of the magnetization PJ of the pinned layer P and a direction of the magnetization FJ of the free layer F to be arranged in parallel. In contrast, flowing of the spin-polarized current from the pinned layer P to the free layer F may cause spin-polarized electrons to flow from the free layer F to the pinned layer P, allowing electrons having a spin parallel to the magnetization PJ of the pinned layer P to be transmitted, and electrons having a spin antiparallel to the magnetization PJ of the pinned layer P to be reflected. As a result, the direction of the magnetization PJ of the pinned layer P and the direction of the magnetization FJ of the free layer F to be arranged in antiparallel.

Examples of a constituent material for each of the free layer F and the pinned layer P may include a simple substance of a ferromagnetic element such as nickel (Ni), iron (Fe), and cobalt (Co); an alloy containing such a ferromagnetic element (e.g., Co—Fe, Co—Fe—Ni, Fe—Pt, and Ni—Fe); a compound (e.g., Co—Fe—B) in which a non-magnetic element (e.g., tantalum, boron, chromium, platinum, silicon, carbon, and nitrogen) is added to such an alloy; an oxide containing one or more of Co, Fe, and Ni (e.g., a ferrite such as Fe—MnO (MnO: manganese(II) oxide)); a group of intermetallic compounds referred to as a half-metallic ferromagnetic material (e.g., a Heusler alloy such as NiMnSb (Sb; antimony), $Co_2MnGe$ (Ge: germanium), $Co_2MnSi$, and $Co_2CrAl$); and other oxides (e.g., $(La,Sr)MnO_3$(La: lanthanum, Sr: Strontium), $CrO_2$, and $Fe_1O_4$). Alternatively, the constituent material for each of the free layer F and the pinned layer P may be the above-listed material with gadolinium (Gd) being further added thereto. Furthermore, in order to further increase the perpendicular magnetic anisotropy, a heavy rare earth such as terbium (Tb), dysprosium (Dy), and holmium (Ho) may be added to the above-listed material. Further, the free layer F and the pinned layer P may each have either a monolayer structure or a multilayer structure in which a plurality of layers made of the same type of material or different types of materials are stacked. Further, the constituent material for each of the free layer F and the pinned layer P may be any of a multicrystalline material, a monocrystalline material, and a non-crystalline material. Further, examples of the constituent material for the pinned layer may also include Co—Tb and Co—Pt, in addition to the above-listed materials. Furthermore, the pinned layer may also configured to have either a layered ferri-structure (which is a layered structure having an antiferromagnetic coupling; also referred to as synthetic antiferromagnet (SAF)), or a magnetostatic coupling structure. An antiferromagnetic layer may be disposed to be adjacent to the pinned layer. This is because disposing the antiferromagnetic layer to be adjacent to the pinned layer P makes it possible to obtain strong unidirectional magnetic anisotropy owning to an exchange interaction acting between the two layers. The layered ferri-structure may have, for example, a three-layer structure of magnetic layer/ruthenium (Ru) layer/magnetic layer (more specifically, e.g., a three-layer structure of CoFe/Ru/CoFe, and a three-layer structure of CoFeB/Ru/CoFeB). The layered ferri-structure may have a structure in which interlayer exchange coupling between the two magnetic layers is antiferromagnetic or ferromagnetic. Further, in the two magnetic layers, a structure that allows the antiferromagnetic coupling to be obtained owning to leakage magnetic field from an end surface of the magnetic layer is referred to as a magnetostatic coupling structure. Examples of a material that forms the antiferromagnetic layer may include an iron-manganese alloy, a nickel-manganese alloy, a platinum-manganese alloy, an iridium-manganese alloy, a rhodium-manganese alloy, a cobalt oxide, and a nickel oxide. In order to improve the crystallinity of the antiferromagnetic layer, an underlayer film made of any of Ta, Chromium (Cr), Ru, and Ti, for example, may be formed between a first wiring line (or a second wiring line) and the antiferromagnetic layer.

Examples of a material for forming the tunnel barrier layer I may include an insulating material such as aluminum oxide ($AlO_x$), aluminum nitride (AlN), magnesium oxide (MgO), magnesium nitride, silicon oxide, silicon nitride, titanium dioxide ($TiO_2$), chromium(III) oxide ($Cr_2O_3$), Ge, nickel(II) oxide (NiO), cadmium oxide ($CdO_x$), hafnium(IV) oxide ($HfO_2$), tantalum pentoxide ($Ta_2O_5$), boron nitride (BN), and zinc sulfide (ZnS). The tunnel barrier layer I may be obtained, for example, by oxidizing or nitriding a metal film formed by a sputtering method. More specific examples of forming the tunnel barrier layer I using $AlO_x$ or MgO may include a method of oxidizing aluminum or magnesium formed by the sputtering method in the atmosphere, a method of plasma-oxidizing aluminum or magnesium formed by the sputtering method, a method of oxidizing aluminum or magnesium formed by the sputtering method using ICP plasma, a method of naturally oxidizing aluminum or magnesium formed by the sputtering method in oxygen atmosphere, a method of oxidizing aluminum or magnesium formed by the sputtering method using oxygen radical, a method of irradiating aluminum or magnesium formed by the sputtering method with ultraviolet rays when naturally oxidizing the aluminum or magnesium in oxygen atmosphere, a method of forming a film of aluminum or magnesium by a reactive sputtering method, and a method of forming a film of $AlO_x$ or MgO by the sputtering method.

These layers may be formed, for example, by a physical vapor deposition (PVD) method exemplified by the sputtering method, an ion beam deposition method, and a vacuum deposition method, as well as a chemical vapor deposition (CVD) method represented by an atomic layer deposition (ALD) method.

[Configuration of Other Portions]

The semiconductor device 1 may further include an N-type transistor NTr3 provided between a bit line BL1 and a connection line SL1, and an N-type transistor NTr4 provided between a bit line BL2 and a connection line SL2. A gate electrode of the N-type transistor NTr3 and a gate electrode of the N-type transistor NTr4 may be both coupled to the common word line WL.

[Layout of Semiconductor Device 1]

Referring again to FIG. 2, description is given of a layout of the semiconductor device 1 in an in-plane direction. In the semiconductor device 1, four P-type transistors PTr1 to PTr4 may include, respectively, gate electrodes 422A to 422D, and four N-type transistors NTr1 to NTr4 may include, respectively, gate electrodes 422E to 422H. Any of these eight gate electrodes 422A to 422H may extend in the same direction (Y-axis direction). Further, the gate electrodes 422A to 422D may be disposed alongside one another in the X-axis direction orthogonal to each of the directions in which the gate electrodes 422A to 422D extend (Y-axis direction) in the same N-type well region NWEL. In the present embodiment, the gate electrode 422B, the gate electrode 422C, the gate electrode 422D, and the gate electrode 422A may be disposed in order from left side to right side on the sheet of FIG. 2. Further, the gate electrodes 422E to 422H may be disposed alongside one another in the X-axis direction in the same P-type well region PWEL. In the present embodiment, the gate electrode 422H, the gate electrode 422E, the gate electrode 422F, and the gate electrode 422G may be disposed in order from left side to right side on the sheet of FIG. 2. The N-type well region NWEL and the P-type well region PWEL may be disposed to be adjacent to each other in the Y-axis direction. Accordingly, the gate electrode 422H may be disposed on an extension line of the gate electrode 422B; the gate electrode 422E may be disposed on an extension line of the gate electrode 422C; the gate electrode 422F may be disposed on an extension line of the gate electrode 422D; and the gate electrode 422G may be disposed on an extension line of the gate electrode 422A.

The power supply terminals T1 and T2 to be coupled to the external power supply Vdd may be each provided at any of positions interposed between the four gate electrodes 422A to 422D arranged in the X-axis direction. FIG. 2 illustrates an example in which the power supply terminals T1 and T2 are each provided in a region interposed between the gate electrode 422C and the gate electrode 422D that are disposed at a middle portion. Further, a ground terminal GND may be provided at any of positions interposed between the four gate electrodes 422E to 422H arranged in the X-axis direction. FIG. 2 illustrates an example in which the ground terminal GND is provided in a region between the gate electrode 422E and the gate electrode 422F that are disposed at a middle portion. Further, the MTJs 21 and 22 may be provided outside the region where the eight gate electrodes 422A to 422H are formed. In other words, the gate electrodes 422A to 422H may be disposed between the MTJs 21 and 22 in the X-axis direction.

It is to be noted that a shared selection line SL may be provided instead of independently providing the selection line SL1 and the selection line SL2. In this case, the selection line SL may extend in the X-axis direction, and may be coupled to both of the gate electrode 422A and gate electrode 422B, as illustrated in FIG. 2. Further, the word line WL may extend in the X-axis direction as with the selection line SL, and may be coupled to both of the gate electrode 422G and gate electrode 422H. Further, the control line CTRL may be provided to include a portion CTRL1 that extends in the Y-axis direction to overlap the MTJ 21, and a portion CTRL2 that extends in the Y-axis direction to overlap the MTJ 22. Furthermore, the two bit lines BL and BL2 may be provided that extend in the Y-axis direction between the portion CTRL1 and the portion CTRL2 of the control line CTRL.

[Method of Manufacturing Semiconductor Device 1]

Description is given next of a method of manufacturing the semiconductor device 1 with reference to FIGS. 4A to 4K. Each of FIGS. 4A to 4K is a plan view of a process in the method of manufacturing the semiconductor device 1.

First, as illustrated in FIG. 4A, the P-type transistors PTr1 to PTr4 and the N-type transistors NTr1 to NTr4 may be formed on the substrate 41. More specifically, the substrate 41 may be prepared on which the element separation layer 411 is formed to surround the N-type well region NWEL and the P-type well region PWEL. Thereafter, a diffusion layer 412 may be formed at each of a portion of the N-type well region NWEL and a portion of the P-type well region PWEL. Next, on the diffusion layer 412, there may be formed the source electrodes 423A to 423D and the drain electrodes 424A to 424D, respectively, in the P-type transistors PTr1 to PTr4 as well as the source electrodes 423E to 423H and the drain electrodes 424E to 424H, respectively, in the N-type transistors NTr1 to NTr4. Furthermore, the gate electrodes 422 (422A to 422H) may be formed on the substrate 41, with the gate insulating film 421 being interposed therebetween in the channel region between the corresponding source electrode 423 and the corresponding drain electrode 424. It is to be noted that a portion of the source electrodes 423 and the drain electrodes 424 may be shared as illustrated in FIG. 4A. Furthermore, a via V1A may be formed to be in contact with both of a top surface of the gate electrode 422C and a top surface of the gate electrode 422E, and a via V1B may be formed to be in contact with both of a top surface of the gate electrode 422D and a top surface of the gate electrode 422F. Further, a via V1C may be formed on one end of the gate electrode 422A; a via V1D may be formed on one end of the gate electrode 422B; a via V1E may be formed on one end of the gate electrode 422G; and a via V1F may be formed on one end of the gate electrode 422H.

Thereafter, metal layers M1A to M1P may be each formed at a predetermined position as illustrated in FIG. 4B. More specifically, the metal layer M1A may be formed on the source electrode 423C (423D); the metal layer M1B may be formed on the drain electrode 424E (424F); the metal layer M1C may be formed on the via V1B; the metal layer M1D may be formed on the via V1A; the metal layer M1E may be formed to link the source electrode 423A (drain electrode 424D) to the source electrode 423F (drain electrode 424G); the metal layer M1F may be formed to link the source electrode 423B (drain electrode 424C) to the source electrode 423E (source electrode 423H); the metal layer M1G may be formed on the via V1C; the metal layer M1H may be formed on the via V1E; the metal layer M1J may be formed on the via V1D; the metal layer M1K may be formed on the via V1F; the metal layer M1L may be formed on the drain electrode 424A; the metal layer M1M may be formed on the source electrode 423G; the metal layer M1N may be formed on the drain electrode 424B; and the metal layer M1P may be formed on the drain electrode 424H.

Subsequently, vias V2A to V2P may be formed, respectively, on the metal layers M1A to M1P as illustrated in FIG. 4C.

Thereafter, as illustrated in FIG. 4D, a metal layer M2A may be formed on the via V2A; a metal layer M2B may be formed on the via V2B; a metal layer M2C may be formed to link the via V2C to the via V2F; a metal layer M2D may be formed to link the via V2D to the viaV2E; a metal layer M2E may be formed on the via V2G; a metal layer M2F may be formed on the via V2H; a metal layer M2G may be formed on the via V2J; a metal layer M2H may be formed on the via V2K; a metal layer M2J may be formed on the via V2L; a metal layer M2K may be formed on the via V2M; a metal layer M2L may be formed on the via V2N; and a metal layer M2M may be formed on the via V2P.

Next, as illustrated in FIG. 4E, a via V3A may be formed on the metal layer M2A; a via V3B may be formed on the metal layer M2B; a via V3E may be formed on the metal layer M2E; a via V3F may be formed on the metal layer M2F; a via V3G may be formed on the metal layer M2G; a via V3H may be formed on the metal layer M2H; a via V3J may be formed on the metal layer M2J; a via V3K may be formed on the metal layer M2K; a via V3L may be formed on the metal layer M2L; and via V3M may be formed on the metal layer M2M.

Next, a metal layer M3A may be formed that extends in the Y-axis direction to be in contact with a top surface of the via V3A as illustrated in FIG. 4E. The metal layer M3A may constitute a portion of a power line to be coupled to the external power supply Vdd. Further, a metal layer M3B may be formed that extends in the Y-axis direction to be in contact with a top surface of the via V3B. The metal layer M3B may constitute a portion of an earth line to be grounded. Furthermore, metal layers M3E to M3M may be formed to be in contact with respective top surfaces of the vias V3E to V3M.

Next, vias V4E to V4M may be formed, respectively, on the metal layers M3E to M1M as illustrated in FIG. 4G.

Next, as illustrated in FIG. 4H, a metal layer M4M may be formed to link the via V4E to the via V4G; and a metal layer M4B may be formed to link the via V4F to the via V4H. In addition, metal layers M4J to M4M may be formed to be in contact with respective top surfaces of the vias V4J to V4M. Here, the metal layer M4A corresponds to the selection lines SL1 and SL2; and the metal layer M4B corresponds to the word line WL.

Next, as illustrated in FIG. 4J, the MTJ 21 may be formed on the metal layer M4J; the MTJ 22 may be formed on the metal layer M4L; a via V5K may be formed on the metal layer M4K, and a via V5M may be formed on the metal layer M4M.

Finally, as illustrated in FIG. 4K, a metal layer M5A may be formed on the MTJ 22; a metal layer M5B may be formed on the via V5M; a metal layer M5C may be formed on the via V5K; and metal layer M5D may be formed on the MTJ 21. Here, the metal layer M5B corresponds to the bit line BL2; the metal layer M5C corresponds to the bit line BL1; and the metal layers M5A and M5D correspond to the control line CTRL.

The above-described processes allows the semiconductor device 1 to be completed.

[Operation of Semiconductor Device 1]
[Basic Operation]

An operation in the semiconductor device 1 may be performed by a command supplied from the controller 30. The semiconductor device 1 may write data into, hold data in, and read out data from the flip-flop circuit 10 as long as power is supplied. A node Q7 and a node Q8 may be complementary nodes that complement each other. By setting one of the node Q7 and the node Q8 at a high level and the other at a low level, it becomes possible to bring the flip-flop circuit 10 into a stable state, thus allowing data to be stored. By setting the word line WL at a high level and bringing the N-type transistor NTr3 and the N-type transistor NTr4 into an electrically conductive state, data from the bit line BL1 and the bit line BL2 may be written into the flip-flop circuit 10. Further, by allowing a potential of the bit line BL1 and a potential of the bit line BL2 to be equal to each other and to have a floating state while setting the word line WL at a high level and bringing the N-type transistor NTr3 and the N-type transistor NTr4 into an electrically conductive state, it becomes possible for data written into the flip-flop circuit 10 to be to read out into the bit line BL1 and the bit line BL2. However, when power supply is cut off, the data written into the flip-flop circuit 10 results in being erased. Therefore, data written into the flip-flop circuit 10 is held permanently in the non-volatile storage section 20.

[Method for Storing Data in Non-Volatile Storage Section 20]

Description is given next, with reference to FIGS. 5A and 5B, of a method for storing data written into the flip-flop circuit 10 in the MTJ 21 and MTJ 22 in the non-volatile storage section 20. Description is given here of a case where high-level "Lv=H" data are stored in the node Q7, while low level "Lv=L" data are stored in the node Q8. The controller 30 may perform operations described below before cutting off application of a voltage supplied from the power supply Vdd to thereby perform writing into the non-volatile storage section 20. It is to be noted that the word line WL may be set at a low-level "Lv=L" potential, while the N-type transistor NTr3 and the N-type transistor NTr4 may be brought into a cut-off state. Further, in FIGS. 5A and 5B, components in an electrically conductive state are drawn in a solid line, while components in a cut-off state are drawn in a broken line. It is to be noted that the low-level "Lv=L" potential refers to a ground potential, for example, while the high-level "Lv=H" potential refers to a potential of the power supply Vdd, for example.

First, as illustrated in FIG. 5A, the selection lines SL1 and SL2 may be set at the high-level "Lv=H" potential to bring the P-type transistors PTr1 and PTr2 into an ON state, while setting the control line CTRL at the low-level "Lv=L" potential. This allows a current I1 to flow from the node Q7 into the control line CTRL sequentially through the P-type transistor PTr1 and the MTJ 21. As a result, it becomes possible to bring the MTJ 21 into a low resistance state that indicates a resistance value $R_L$. This is because the current I1 flows inside the MTJ 21 through the free layer F, the tunnel barrier layer I, and the pinned layer P in order, i.e., electrons e⁻ flow through the pinned layer P, the tunnel barrier layer I, and the free layer F in order, thus allowing the magnetization PJ of the pinned layer P and the magnetization FJ of the free layer F to be substantially parallel to each other. It is to be noted that a current does not flow into the MTJ 22 in this case, because the node Q8 is at the low-level "Lv=L" potential.

Next, as illustrated in FIG. 5B, the selection lines SL1 and SL2 may be set at the high-level "Lv=H" to bring the P-type transistors PTr1 and PTr2 into the ON state, while setting the control line CTRL at the high-level "Lv=H" potential. This allows a current I2 to flow from the control line CTRL into the node Q8 sequentially through the MTJ 22 and the P-type transistor PTr2. As a result, it becomes possible to bring the MTJ 22 into the high resistance state that indicates a resistance value $R_H$ ($>R_L$). This is because the current I2 flows inside the MTJ 22 through the pinned layer P, the tunnel barrier layer I, and the free layer F in order, i.e., electrons e⁻ flow through the free layer F, the tunnel barrier layer I, and the pinned layer P in order, thus allowing the magnetization PJ of the pinned layer P and the magnetization FJ of the free layer F to be substantially antiparallel to each other. It is to be noted that a current does not flow into the MTJ 21 in this case, because the node Q7 is at the high-level "Lv=H" potential.

Through the above-described operations, it becomes possible for the data written into the flip-flop circuit 10 to be stored into the non-volatile storage section 20 in a non-volatile manner. In other words, even when application of a voltage from the power supply Vdd is cut off thereafter to cause the data written into the flip-flop circuit 10 to be erased, the low resistance state of the MTJ 21 and the high resistance state of the MTJ 22 are maintained. It is to be noted that, although description is given of the case where data are first stored in the MTJ 21 before storing of data in the MTJ 22, the order may be reversed. Further, the MTJ 21 is brought into the low resistance state, while the MTJ 22 is brought into the high resistance state, however, it is also possible to bring the MTJ 21 into the high resistance state, while bringing the MTJ 22 into the low resistance state.

[Method for Reading Data Out into Flip-Flop Circuit 10]

The data stored in the non-volatile storage section 20 in a non-volatile manner may be read out (restored) again into the flip-flop circuit 10 as described below. Description is given below, with reference to FIG. 6, of a method for reading out data stored in the MTJ 21 and the MTJ 22 into the flip-flop circuit 10. Description is given here of a case where the MTJ 21 is in the low resistance state that indicates the resistance value $R_L$, while the MTJ 22 is in the high resistance state that indicates the resistance value $R_H$. Further, the word line WL may be set at the low-level "Lv=L" potential, while the N-type transistor NTr3 and the N-type transistor NTr4 may be in the cut-off state.

First, the controller 30 may be used to bring the P-type transistor PTr1 and the P-type transistor PTr2 into the ON state and to set the control line CTRL at the high-level "Lv=H" potential. Thereafter, the power supply may be activated to apply a voltage to the inverter circuit 11 and the inverter circuit 12 to reach the high-level "Lv=H" potential from the low-level "Lv=L" potential. In this case, the MTJ 21 in the low resistance state may be activated prior to the MTJ 22 in the high resistance state. In other words, after the power supply activation, a current I4 and a current I3 may flow, respectively, to the node Q7 and the node Q8 from the power supply, as illustrated in FIG. 6. The MTJ 21 is in the low resistance state, while the MTJ 22 is in the high resistance state, and thus a current I5 that flows from the node Q7 to the control line CTRL is larger than a current I6 that flows from the node Q8 to the control line CTRL (I5>I6). This causes a potential of the node Q7 to be first set at the high-level "Lv=H" potential that is the same as that of the control line CTRL, and a potential of the node Q8 is set at the low-level "Lv=L" potential accordingly. This allows for precise reproduction of the state before the power cut-off, i.e., a state where the high-level "Lv=H" data are stored in the node Q7, while the low-level "Lv=L" data are stored in the node Q8.

[Workings and Effects of Semiconductor Device 1]

In the semiconductor device 1 and the method for manufacturing the semiconductor device 1, the non-volatile storage section 20 may be provided between the flip-flop circuit 10 and the control line CTRL. Here, the non-volatile storage section 20 may include the P-type transistor PTr1 and the MTJ 21 coupled together in series, and the P-type transistor PTr2 and the MTJ 22 coupled together in series. Therefore, the number of the P-type transistors and the number of the N-type transistors become the same, making it possible to dispose the plurality of P-type transistors and N-type transistors regularly in a narrower region. Thus, it becomes possible to achieve a compact overall configuration.

Further, the MTJ 21 and the MTJ 22 may each have a so-called top spin structure in which the pinned layer P, the tunnel barrier layer I, and the free layer F are stacked (arranged) in order from above, i.e., from a position close to the control line CTRL. Therefore, current characteristics of the P-type transistors PTr1 and PTr2 coincide with current characteristics of the MTJs 21 and 22, thus solving the problem of asymmetry of writing currents into the MTJs 21 and 22. In other words, the P-type transistors PTr1 and PTr2 may each have characteristics in which a larger current flows in a direction from the control line CTRL toward the nodes Q1 and Q2, while a large current does not flow too much in a direction from the nodes Q1 and Q2 toward the control line CTRL. In contrast, a relatively small writing current is enough for the MTJs 21 and 22 to be switched from the high resistance state to the low resistance state, but a relatively large writing current is necessary for the MTJs 21 and 22 to be switched from the low resistance state to the high resistance state. In the present embodiment, the direction in which a larger current flows in the P-type transistors PTr1 and PTr2 and the direction in which a relatively large writing current is necessary in the MTJs 21 and 22 coincide with each other. Therefore, it becomes possible to efficiently utilize performances of the P-type transistors PTr1 and PTr2, resulting in advantage to overall compactness of the semiconductor device 1. Furthermore, in the present embodiment, the MTJs 21 and 22 may have a layered structure in which the pinned layer P, the tunnel barrier layer I, and the free layer F are stacked in order from a position close to the control line CTRL, thereby achieving the following effects. That is, data inversion is prevented when data stored in the MTJ 21 and the MTJ 22 from the flip-flop circuit 10 are read out again from the MTJ 21 and the MTJ 22 into the flip-flop circuit 10. This effect is described in detail referring to reference examples of FIGS. 7A, 7B, and 8.

The reference examples of FIGS. 7A, 7B, and 8 each illustrate a case where the high-level "Lv=H" data are stored in the node Q7, while the low-level "Lv=L" data are stored in the node Q8. Further, in the reference examples, there may be provided an MTJ 121 and an MTJ 122 each having a structure in which the free layer F, the tunnel barrier layer I, and the pinned layer P are stacked in order from a position close to the control line CTRL, unlike the semiconductor device 1.

When storing data in the MTJ 121 and the MTJ 122 in such reference examples, the selection lines SL1 and SL2 may be first set at the high-level "Lv=H" potential to bring the P-type transistors PTr1 and PTr2 into the ON state, while setting the control line CTRL at the low-level "Lv=L" potential, as illustrated in FIG. 7A. This allows the current I1 to flow from the node Q7 into the control line CTRL sequentially through the P-type transistor PTr1 and the MTJ 121. As a result, it becomes possible to bring the MTJ 121 into the high resistance state that indicates the resistance value $R_H$. This is because the current I1 flows inside the MTJ 121 through the pinned layer P, the tunnel barrier layer I, and the free layer F in order, i.e., electrons e⁻ flow through the free layer F, the tunnel barrier layer I, and the pinned layer P in order, thus allowing the magnetization PJ of the pinned layer P and the magnetization FJ of the free layer F to be substantially antiparallel to each other. It is to be noted that a current does not flow into the MTJ 122 in this case, because the node Q8 is at the low-level "Lv=L" potential.

Next, as illustrated in FIG. 7B, the selection lines SL1 and SL2 may be set at the high-level "Lv=H" to bring the P-type transistors PTr1 and PTr2 into the ON state, while setting the control line CTRL at the high-level "Lv=H" potential. This allows the current I2 to flow from the control line CTRL into the node Q8 sequentially through the MTJ 122 and the P-type transistor PTr2. As a result, it becomes possible to bring the MTJ 122 into the low resistance state that indicates the resistance value $R_L$. This is because the current I1 flows inside the MTJ 122 through the free layer F, the tunnel barrier layer I, and the pinned layer P in order, i.e., electrons e⁻ flow through the pinned layer P, the tunnel barrier layer I, and the free layer F in order, thus allowing the magnetization PJ of the pinned layer P and the magnetization FJ of the free layer F to be substantially parallel to each other. It is to be noted that a current does not flow into the MTJ 121 in this case, because the node Q7 is at the high-level "Lv=H" potential.

The data stored in the non-volatile storage section 20 in a non-volatile manner may be read out (restored) again into the flip-flop circuit 10 as described below. Description is given below, with reference to FIG. 8, of a method for reading out data stored in the MTJ 121 and the MTJ 122 into the flip-flop circuit 10. Description is given here of a case where the MTJ 121 is in the high resistance state that indicates the resistance value $R_H$, while the MTJ 122 is in the low resistance state that indicates the resistance value $R_L$.

First, the controller 30 may be used to bring the P-type transistor PTr1 and the P-type transistor PTr2 into the ON state and to set the control line CTRL at the high-level "L-v=H" potential. Thereafter, the power supply may be activated to apply a voltage to the inverter circuit 11 and the inverter circuit 12 to reach the high-level "Lv=H" potential from the low-level "Lv=L" potential. In this case, the MTJ 122 in the low resistance state may be activated prior to the MTJ 121 in the high resistance state. In other words, after the power supply activation, the current I4 and the current I3 may flow, respectively, to the node Q7 and the node Q8 from the power supply, as illustrated in FIG. 8. The MTJ 121 is in the high resistance state, while the MTJ 122 is in the low resistance state, and thus the current I5 that flows from the node Q7 to the control line CTRL is smaller than the current I6 that flows from the node Q8 to the control line CTRL (I5<I6). This causes a potential of the node Q8 to be first set at the high-level "Lv=H" potential that is the same as that of the control line CTRL, and thereafter a potential of the node Q7 is set at the low-level "Lv=L" potential accordingly. This results in a state opposite to the state before the power cut-off, i.e., a state where the high-level "Lv=H" data are stored in the node Q8, while the low-level "Lv=L" data are stored in the node Q7.

In contrast, in the present embodiment, the MTJs 21 and 22 may be provided that each have a predetermined stacking order as described above, thus preventing data inversion and allowing for precise data reproduction, when data stored in the non-volatile storage section 20 from the flip-flop circuit 10 are restored into the flip-flop circuit 10 from the non-volatile storage section 20.

[2. Modification Example 1]

FIG. 9A is a circuit diagram of a semiconductor device 1A that is a first modification example of the above-described semiconductor device 1; FIG. 9B is a plan view of the semiconductor device 1A; and FIG. 9C is a cross-sectional view of a key part of the semiconductor device 1A. It is to be noted that FIG. 9B illustrates a class including components such as the gate electrode 422, and that wiring lines in other classes are each illustrated in a simplified manner with a broken line or a thick solid line. Further, FIG. 9C illustrates a cross-section along a cut line IXC-IXC illustrated in FIG. 9B as viewed in a direction of arrows. In the above-described semiconductor device 1, the MTJ 21 may be provided between the P-type transistor PTr1 and the control line CTRL, and the MTJ 22 may be provided between the P-type transistor PTr2 and the control line CTRL. In contrast, in the present modification example, the MTJ 21 may be provided between the P-type transistor PTr1 and the node Q1, and the MTJ 22 may be provided between the P-type transistor PTr2 and the node Q2. Also in the present modification example, in each of the MTJ 21 and the MTJ 22, the pinned layer P, the tunnel barrier layer I, and the free layer F may be stacked (arranged) in order from a position close to the control line CTRL, in the same manner as the semiconductor device 1. This makes it possible for the semiconductor device 1A to achieve workings and effects similar to those of the semiconductor device 1. However, it is suitable for each of the MTJ 21 and the MTJ 22 in the semiconductor device 1A to have, as its cross-sectional structure, a so-called bottom pin structure in which the tunnel barrier layer I as an intermediate layer and the free layer F as an upper layer are stacked in order on the pinned layer P as a lower layer, as illustrated in FIG. 9C. This is because the bottom pin structure shortens the length of wiring lines that link the MTJs 21 and 22 respectively to the nodes Q1 and Q2 and the length of wiring lines that link the MTJs 21 and 22 respectively to the P-type transistors PTr1 and PTr2, thus bringing advantage in a compact overall configuration.

[3. Modification Example 2]

Description is given next of a second modification example of the above-described semiconductor device 1. In the semiconductor device 1, when storing data into the non-volatile storage section 20, the potential of the control line CTRL may be set at the low-level "Lv=L" potential (ground potential) and thereafter may be set at the high-level "Lv=H" potential (potential of power supply Vdd), or alternatively an operation reverse thereto may be performed. Further, when reading out data from the non-volatile storage section 20, the potential of the control line CTRL may be set at the high-level "Lv=H" potential. In contrast, in the present modification example, the potential of the control line CTRL may be set at a potential (hereinafter, referred to as the intermediate potential) between the low-level "Lv=L" potential (ground potential) and the high-level "Lv=H"

potential (potential of power supply Vdd), thereby storing data into and reading out data from the non-volatile storage section 20.

In the present modification example, when storing data into the non-volatile storage section 20, it is possible to bring the MTJ 21 into the low resistance state while bringing the MTJ 22 into the high resistance state. In other words, it is possible to perform writing into the MTJ 21 and the MTJ 22 all at once. In contrast, when reading out data from the non-volatile storage section 20, data inversion is prevented, allowing for precise reproduction of the state before the power cut-off.

[4. Second Embodiment]
[Configuration of Semiconductor Device 2]

Description is given of a configuration of a semiconductor device 2 as a second embodiment of the disclosure with reference to FIGS. 10A and 10B. FIG. 10A illustrates a circuit configuration of the semiconductor device 2. FIG. 10B illustrates a cross-sectional configuration of a key part of the semiconductor device 2.

The semiconductor device 1 according to the foregoing first embodiment may use the MTJs 21 and 22 as the non-volatile storage element. In contrast, in the semiconductor device 2 of the present embodiment, resistance change elements 61 and 62 each having a layered structure of an ion layer, an insulating layer, and an electrode layer may be used instead of the MTJs 21 and 22. Except this point, the semiconductor device 2 has a configuration similar to that of the semiconductor device 1. In the following description, the same reference numerals are assigned to components corresponding to those of the semiconductor device 1 of the foregoing first embodiment.

As illustrated in FIG. 10A, the resistance change elements 61 and 62 may each include the electrode layer 65, the insulating layer 64, and the ion layer 63 stacked in order from a position close to the control line CTRL. Here, it is suitable for each of the resistance change elements 61 and 62 in the semiconductor device 2 to have, as its cross-sectional structure, a structure in which the insulating layer 64 and the electrode layer 65 are stacked in order on the ion layer 63 as a lower layer, as illustrated in FIG. 10B. The ion layer 63 may be a layer made of, for example, copper-tellurium (CuTe), and may supply ions (e.g., $Cu^{2+}$) that move to the electrode layer 65 through the insulating layer 64. The resistance change elements 61 and 62 each demonstrate a resistance change by the movement amount of the ions.

[Operation of Semiconductor Device 2]

The basic operations in the semiconductor device 2 are similar to those in the semiconductor device 1 of the foregoing first embodiment.

Description is given, with reference to FIGS. 11A and 11B, of a method for storing data written into the flip-flop circuit 10 in the resistance change element 61 and the resistance change element 62 in the non-volatile storage section 20. Description is given here of a case where high-level "Lv=H" data are stored in the node Q7, while low level "Lv=L" data are stored in the node Q8. The controller 30 may perform operations described below before cutting off application of a voltage from the power supply Vdd to thereby perform writing into the non-volatile storage section 20. It is to be noted that the word line WL may be set at the low-level "Lv=L" potential, while the N-type transistor NTr3 and the N-type transistor NTr4 may be brought into a cut-off state. Further, in FIGS. 10A and 10B, components in an electrically conductive state are drawn in a solid line, while components in a cut-off state are drawn in a broken line. It is to be noted that the low-level "Lv=L" potential refers to a ground potential, for example, while the high-level "Lv=H" potential refers to a potential of the power supply Vdd, for example.

First, as illustrated in FIG. 11A, the selection lines SL1 and SL2 may be set at the high-level "Lv=H" potential to bring the P-type transistors PTr1 and PTr2 into the ON state, while setting the control line CTRL at the low-level "Lv=L" potential. This allows a current I1 to flow from the node Q7 into the control line CTRL sequentially through the P-type transistor PTr1 and the resistance change element 61. As a result, it becomes possible to bring the resistance change element 61 into the low resistance state that indicates the resistance value $R_L$. This is because the current I1 flows inside the resistance change element 61 through the ion layer 63, the insulating layer 64, and the electrode layer 65 in order, i.e., more copper ions $Cu^{2+}$ flow to move from the ion layer 63 toward the electrode layer 65. It is to be noted that a current does not flow into the resistance change element 62 in this case, because the node Q8 is at the low-level "Lv=L" potential.

Next, as illustrated in FIG. 11B, the selection lines SL1 and SL2 may be set at the high-level "Lv=H" to bring the P-type transistors PTr1 and PTr2 into the ON state, while setting the control line CTRL at the high-level "Lv=H" potential. This allows a current I2 to flow from the control line CTRL into the node Q8 sequentially through the resistance change element 62 and the P-type transistor PTr2. As a result, it becomes possible to bring the resistance change element 62 into the high resistance state that indicates the resistance value $R_H$ ($>R_L$). This is because the current I2 flows inside the resistance change element 62 through the electrode layer 65, the insulating layer 64, and the ion layer 63 in order, i.e., the copper ions $Cu^{2+}$ move away from the electrode layer 65 toward the ion layer 63. It is to be noted that a current does not flow into the resistance change element 61 in this case, because the node Q7 is at the high-level "Lv=H" potential.

Through the above-described operations, it becomes possible for the data written into the flip-flop circuit 10 to be stored into the non-volatile storage section 20 in a non-volatile manner also in the semiconductor device 2. Further, in the same manner as the semiconductor device 1, it is possible for the data stored in the non-volatile storage section 20 in a non-volatile manner to be read out again (restored) into the flip-flop circuit 10 also in the semiconductor device 2.

As described, the semiconductor device 2 achieves workings and effects similar to those of the semiconductor device 1. That is, the resistance change element 61 and the resistance change element 62 may each have a configuration in which the electrode layer 65, the insulating layer 64, and the ion layer 63 are stacked (arranged) in order from a position close to the control line CTRL. Thus, data inversion is prevented when data stored in the MTJ 21 and the MTJ 22 from the flip-flop circuit 10 are read out again from the MTJ 21 and the MTJ 22 into the flip-flop circuit 10. Therefore, high operation reliability is secured.

[5. Modification Example 3]

FIG. 12A is a circuit diagram of the semiconductor device 2A that is a modification example of the above-described semiconductor device 2. Further, FIG. 12B illustrates a cross-sectional configuration of a key part of the semiconductor device 2A. In the above-described semiconductor device 2, the resistance change element 61 may be provided between the P-type transistor PTr1 and the control line CTRL, and the resistance change element 62 may be provided between the P-type transistor PTr2 and the control line CTRL. In contrast, in the present modification example, the resistance change element 61 may be provided between the P-type transistor PTr1 and the node Q1, and the resistance change element 62 may be provided between the P-type transistor PTr2 and the node Q2. Also in the present modification example, each of the resistance change element 61 and the resistance change element 62 may have a structure in which the electrode layer 65, the insulating layer 64, and the ion layer 63 may be stacked (arranged) in order from a position close to the control line CTRL, in the same manner as the semiconductor device 2. This makes it possible for the semiconductor device 2A to achieve workings and effects similar to those of the semiconductor device 2. This makes it possible for the semiconductor device 2A to achieve workings and effects similar to those of the semiconductor device 2. It is to be noted that, it is suitable for each of the resistance change element 61 and the resistance change element 62 to have, as its cross-sectional structure, a structure in which the insulating layer 64 and the ion layer 63 are stacked in order on the electrode layer 65 as a lower layer, as illustrated in FIG. 12B.

[6. Third Embodiment]
[Configuration of Semiconductor Device 3]

Description is given of a configuration of a semiconductor device 3 as a third embodiment of the disclosure with reference to FIG. 13. FIG. 13 illustrates a cross-sectional configuration of a key part of the semiconductor device 3, and illustrates a portion corresponding to FIG. 3 that illustrates the semiconductor device 1 of the first embodiment.

As illustrated in FIG. 13, the semiconductor device 3 may have a joining structure, for example, in which a substrate unit U1 including the P-type transistor PTr1 and the P-type transistor PTr2 and a substrate unit U2 including the MTJ 21 and the MTJ 22 are joined together. In this example, a junction surface BS1 in the substrate unit U1 and a junction surface BS2 in the substrate unit U2 may be joined to face each other. The junction surface BS1 and the junction surface BS2 may be joined together, with an insulating thin film ZZ interposed therebetween. The insulating thin film ZZ may be formed by an atomic layer deposition (ALD) method, for example. However, it is also possible for the junction surface BS1 and the junction surface BS2 to be brought into direct contact with each other without the insulating thin film ZZ interposed therebetween. It is to be noted that FIG. 13 exemplifies a cross-section including the P-type transistor PTr1 and the MTJ 21, with the P-type transistor PTr2 and the MTJ 22 being omitted; however, a cross-sectional configuration including the P-type transistor PTr2 and the MTJ 22 is also similar. Accordingly, description is given below of the cross-section including the P-type transistor PTr1 and the MTJ 21.

The substrate unit U1 may have a configuration, for example, in which an element formation layer 42 including the P-type transistor PTr1 and a wiring line layer 43 are formed in order on a substrate 41 made of a semiconductor material such as monocrystalline silicon. A surface of the wiring line layer 43 may constitute the junction surface BS1. Further, in the substrate unit U1, the element formation layer 42 may further include a flip-flop circuit 30, in addition to the selection lines SL1 and SL2.

In the substrate 41, there may be formed a channel region and a pair of diffusion layers 412A and 412B that constitute a portion of the P-type transistor PTr1. The element separation layer 411 may be, for example, an insulating film made of a silicon oxide (SiO$_2$) film, and may be formed by shallow trench isolation (STI), for example. Further, the pair of diffusion layers 412A and 412B may be, for example,
silicon in which impurities are diffused. In the element formation layer 42, the gate insulating film 421 and the gate electrode 422 may be stacked in order on the channel region, and the source electrode 423 and the drain electrode 424 may be formed, respectively, on the pair of diffusion layers 412A and 412B. The gate insulating film 421, the gate electrode 422, the source electrode 423, and the drain electrode 424 may be embedded by an insulating layer 425. However, a surface of the source electrode 423 and a surface of the drain electrode 424 may be both exposed to an interface between the element formation layer 42 and the wiring line layer 43. The wiring line layer 43 may include a wiring line 431 to be in contact with the surface of the source electrode 423, a wiring line 432 to be in contact with the surface of the drain electrode 424, a pad 433, and a connection 434 that links the wiring line 432 to the pad 433. The wiring line 431, the wiring line 432, and the connection 434, and the pad 433 may be embedded, respectively, by the insulating layers 435 and 436. However, the pad 433 may have a surface exposed to the junction surface BS1. The gate insulating film 421 may be made of a silicon oxide film, for example. Further, the gate electrode 422, the source electrode 423, the drain electrode 424, the wiring lines 431 and 432, the pad 433, and the connection 434 may be each configured, for example, by a monolayer structure or a multilayer structure made of a highly electrically conductive non-magnetic material such as copper (Cu), aluminum (Al), gold (Au), platinum (Pt), titanium (Ti), molybdenum (Mo), tantalum (Ta), tungsten (W), titanium nitride (TiN), titanium-tungsten (TiW), tungsten nitride (WN), and a silicide, and may be formed, for example, by a physical vapor deposition (PVD) method such as a sputtering method.

In contrast, the substrate unit U2 may have a configuration, for example, in which a wiring line layer 52 including the control line CTRL, an element formation layer 53 including the MTJ 21, and a wiring line layer 54 are formed in order on a substrate 51 made of an insulating material. A surface of the wiring line layer 54 may constitute the junction surface BS2.

In the wiring line layer 52, a wiring line 521 such as the control line CTRL and a connection 522 having a rear surface coupled to the wiring line 521 may be embedded by insulating layers 523A to 523C. A surface of the connection 522 may be exposed to an interface between the wiring line layer 52 and the element formation layer 53. The element formation layer 53 may include a wiring line 531 having a rear surface to be in contact with the surface of the connection 522, and the MTJ 21 having a rear surface to be in contact with a surface of the wiring line 531. The wiring line 531 and the MTJ 21 may be embedded by an insulating layer 532. Furthermore, the wiring line layer 54 may include a pad 541 having a surface exposed to the junction surface BS2, and a connection 542 that links the MTJ 21 to the pad 541. A rear surface of the connection 542 may be in contact with a surface of the MTJ 21. The pad 541 and the connection 542 may be embedded by the insulating layer 543. However, the pad 541 may have a surface exposed to the junction surface BS2. The wiring line 521, the connection 522, the wiring line 531, the pad 541, and the connection 542 may be each configured, for example, by a monolayer structure or a multilayer structure made of a highly electrically conductive non-magnetic material such as copper (Cu), aluminum (Al), gold (Au), platinum (Pt), titanium (Ti), molybdenum (Mo), tantalum (Ta), tungsten (W), titanium nitride (TiN), titanium-tungsten (TiW), tungsten nitride (WN), and a silicide, and may be formed, for example, by a physical vapor deposition (PVD) method such as a sputtering method.

[Method of Manufacturing Semiconductor Device 3]

Description is given next of a method of manufacturing the semiconductor device 3 with reference to FIGS. 14A to 14C. Each of FIGS. 14A to 14C is a plan view of a process in the method of manufacturing the semiconductor device 3.

First, as illustrated in FIG. 14A, the element formation layer 42 including the P-type transistors PTr1 to PTr4 and the N-type transistors NTr1 to NTr4, and the wiring line layer 43 may be formed in order on the substrate 41 to obtain the substrate unit U1. Next, the ALD method, for example, may be used to form an insulating thin film ZZ1 in such a manner as to cover the junction surface BS1.

Description is give here of an outline of a procedure of the ALD method. First, a first reactant and a second reactant may be prepared, each of which contains a constituent element of a thin film to be formed. The film-forming process may include a first process in which a gas containing the first reactant is supplied to cause an adsorption reaction on a substrate, and a second process in which a gas containing the second reactant is supplied to cause an adsorption reaction on a substrate; between these processes, an inert gas may be flowed to purge an unadsorbed reactant. One cycle of the film-forming process may be performed to stack one atomic layer, and repetition of the process may form a film having a desired film thickness. It is to be noted that either the first process or the second process may be performed first. Application of such an ALD method enables the insulating thin film ZZ1 with extreme thinness to be formed uniformly with well-reproducibility.

Specific description is given below, as an example, of film-forming conditions of the insulating thin film ZZ1 made of one of an oxide film and a nitride film by means of the ALD method. When the insulating thin film ZZ1 is made of an oxide film (such as $SiO_2$ and $HfO_2$), the first reactant may be set as one of a Si-containing reactant and a Hf-containing reactant, and the second reactant may be set as an O-containing reactant in the above-described ALD method. Alternate repetition of the processes of supplying these reactants followed by the adsorption reaction allows for film-formation of the insulating thin film ZZ1 made of one of $SiO_2$ and $HfO_2$. Here, as the Si-containing reactant, there may be used, for example, a gaseous suppliable material such as silane ($SiH_4$) and dichlorosilane ($H_2SiCl_2$). As the Hf-containing reactant, there may be used a material such as tetrakis dimethylamino hafnium ($Hf[N(CH_3)_2]_4$). As the O-containing reactant, there may be used a material such as a steam gas and an ozone gas.

In contrast, when forming the insulating thin film ZZ1 made of an nitride film (such as silicon nitride (SiN)), the first reactant may be set as a Si-containing reactant, and the second reactant may be set as a N-containing reactant, in the above-described ALD method. Alternate repetition of the processes of supplying these reactants followed by the adsorption reaction allows for film-formation of the insulating thin film ZZ1 made of silicon nitride (SiN). Here, as the N-containing reactant, there may be used, for example, a material such as a nitrogen gas and an ammonia gas. As the O-containing reactant, there may be used a material such as a steam gas and an ozone gas.

Such an ALD method enables the insulating thin film ZZ1 with extreme thinness and uniformity to be formed to cover the junction surface BS1.

Subsequently, as illustrated in FIG. 14B, sequential formation of the wiring line layer 52 including the control line CTRL, the element formation layer 53 including the MTJ 21, and the wiring line layer 54 on the substrate 51 allows the substrate unit U2 to be obtained. Thereafter, for example, the above-described ALD method may be used to form an insulating thin film ZZ2 to cover the junction surface BS2.

Thereafter, the substrate unit U1 and the substrate unit U2 may be joined. In this example, as illustrated in FIG. 14C, for example, the substrate unit U2 may be inverted vertically to allow the insulating thin film ZZ1 of the substrate unit U1 and the insulating thin film ZZ2 of the substrate unit U2 to face each other. In this case, position adjustment in an in-plane direction may be performed to allow the pad 433 and the pad 541 to face each other.

After the position adjustment between the substrate unit U1 and the substrate unit U2, the insulating thin film ZZ1 and the insulating thin film ZZ2 may be abutted each other, and may be subjected to a heat treatment while abutting each other. When the pad 433 and the pad 541 are each configured by a material made mainly of copper (Cu), for example, the heat treatment may be maintained at 200° C. to 600° for 1 to 5 hours. Such a heat treatment may be performed in a pressurized atmosphere. Further, the heat treatment may be performed while forcing the pad 433 and the pad 541 to be pressed against each other. This allows the insulating thin film ZZ1 and the insulating thin film ZZ2 to be joined together to form an integrated insulating thin film ZZ. This consequently completes the joining between the substrate unit U1 and the substrate unit U2. It is to be noted that the insulating thin film ZZ1 and the insulating thin film ZZ2 either may be made of the same material, or may be made of materials different from each other.

[Workings and Effects of Semiconductor Device 3]

It is also possible for the semiconductor device 3 to perform functions similar to those of the semiconductor device 1 of the foregoing first embodiment. Further, it is possible, in the semiconductor device 3, to stack the pinned layer P, the tunnel barrier layer I, and the free layer F in order when forming the MTJs 21 and 22 on the substrate 51 in the substrate unit U2. This makes it possible to obtain, relatively easily, the MTJs 21 and 22 excellent in responsiveness as well as in operational stability, as compared to the case of stacking the free layer F, the pinned layer P, and the tunnel barrier layer I in order.

[7. Fourth Embodiment]

[Configuration of Semiconductor Device 4]

Description is given of a configuration of a semiconductor device 4 as a fourth embodiment of the disclosure with reference to FIGS. 15A and 15B. FIG. 15A illustrates a cross-sectional configuration of a key part of the semiconductor device 4, and FIG. 15B illustrates a planar configuration of a key part of the semiconductor device 4. FIG. 15A corresponds to a cross-sectional view along a cut line XVA-XVA illustrated in FIG. 15B as viewed in a direction of arrows. It is to be noted that FIGS. 15A and 15B each illustrate only a vicinity of a fin field effect transistor (Fin-FET) 80 that is a key part of the semiconductor device 4, with other components being omitted.

The semiconductor device 4 may use the Fin-FET 80 as each of the P-type transistors PTr1 to PTr4 and the N-type transistors NTr1 to NTr4. The semiconductor device 4 has a configuration similar to that of the semiconductor device 1 except this point. The Fin-FET 80 may be provided, for example, in a first level LV21 on the substrate 41 including the element separation layer 411. The Fin-FET 80 may include, for example, a fin 81 made of silicon (Si), a gate electrode 82G, a source electrode 82S, and a drain electrode 82D, which are embedded in an insulating film Z11.

A plurality of fins 81 each having a flat-plate shape may stand to allow a rear surface thereof to be in contact with the substrate 41 made of a semiconductor material. The plurality of fins 81 may each extend in the X-axis direction, and may be arranged in the Y-axis direction, for example. The gate electrode 82G, the source electrode 82S, and the drain electrode 82D may each extend in the Y-axis direction that crosses the extending direction of each of the fins 81 in such a manner as to straddle the fins 81. The gate electrode 82G, the source electrode 82S, and the drain electrode 82D may each cover surfaces of each of the fins 81 other than the rear surfaces, i.e., surfaces other than surfaces, of each of the fins 81, being in contact with the substrate 41.

On a second level LV21, there may be formed a second level LV22. In the second level LV22, there may be formed contact layers 83G, 83S, and 83D that are coupled, respectively, to the gate electrode 82G, the source electrode 82S, and the drain electrode 82D. Regions surrounding the contact layers 83G, 83S, and 83D may be occupied by an insulating layer Z12.

Use of such an Fin-FET 80 makes it possible to suppress short-channel characteristics, as compared to a planar transistor on a bulk substrate. Further, in the Fin-FET 80, the gate electrode 82G, the source electrode 82S, and the drain electrode 82D are arranged regularly. Thus, it becomes possible to form the P-type transistors PTr1 to PTr4 and the N-type transistors NTr1 to NTr4 in a narrower region, allowing the semiconductor device 4 that is highly integrated to be obtained.

[8. Fifth Embodiment]

FIG. 16 illustrates a cross-sectional configuration of a semiconductor device 5 as a fifth embodiment of the disclosure. The semiconductor device 5 differs from the semiconductor device 4 of the foregoing fourth embodiment in that the semiconductor device 5 includes a transistor 80A that is a nano-wire FET instead of the Fin-FET 80. More specifically, in the semiconductor device 5, an insulating film Z10 may be provided between a rear surface 81B of the fin 81 and the substrate 41. Further, an electrode 84 may be embedded in a portion of the substrate 41. The gate electrode 84 may be embedded at a position facing the gate electrode 82G, with the insulating film Z10 being interposed therebetween. In other points, the semiconductor device 5 has a configuration similar to that of the semiconductor device 4.

It is also possible for such a semiconductor device 5 to achieve higher integration.

The disclosure has been described heretofore with reference to some embodiments. However, the disclosure is not limited to the foregoing embodiments, and various modifications may be made.

For example, the flip-flop circuit of the disclosure is not limited to those described in the foregoing embodiments and modification examples. For example, it is also possible to employ a master-slave flip-flop circuit 70 that includes D-latch circuits 71 and 72, as in a semiconductor device 6 illustrated in FIG. 17. It is to be noted that, in the semiconductor device 6 illustrated in FIG. 17, positions of the MTJ 21 and the P-type transistor PTr1 may be switched; alternatively, positions of the MTJ 22 and the P-type transistor PTr2 may be switched. Further, the resistance change elements 61 and 62 described in the foregoing second embodiment may also be employed instead of the MTJs 21 and 22.

The disclosure does not necessarily include all of the components described in the foregoing embodiments, and may further include other components.

In addition, materials and thicknesses of the respective components as well as forming methods, for example, described in the foregoing embodiments are not limitative; other materials and thicknesses may also be used, and other forming methods may also be adopted.

It is to be noted that the effects described herein are mere examples and are not limited thereto, and may include other effects. Further, the technology may also have the following configurations.

(1)

A semiconductor device including:

a flip-flop circuit having a circular structure in which a first inverter circuit, a first connection line, a second inverter circuit, and a second connection line are coupled in order, the first connection line including a first node, the second connection line including a second node;

a control line;

a first P-type transistor provided between the first node and the control line;

a first non-volatile storage element provided between the first node and the control line, the first non-volatile storage element being coupled in series to the first P-type transistor;

a second P-type transistor provided between the second node and the control line; and a second non-volatile storage element provided between the second node and the control line, the second non-volatile storage element being coupled in series to the second P-type transistor, wherein the first non-volatile storage element is one of a first magnetic tunnel junction element and a first resistance change element, the first magnetic tunnel junction element including a first pinned layer, a first tunnel barrier layer, and a first free layer that are arranged in order from a position close to the control line, the first resistance change element including a first electrode layer, a first insulating layer, and a first ion layer that are arranged in order from a position close to the control line, and the second non-volatile storage element is one of a second magnetic tunnel junction element and a second resistance change element, the second magnetic tunnel junction element including a second pinned layer, a second tunnel barrier layer, and a second free layer that are arranged in order from a position close to the control line, the second resistance change element including a second electrode layer, a second insulating layer, and a second ion layer that are arranged in order from a position close to the control line.

(2)

The semiconductor device according to (1), wherein the first non-volatile storage element is one of the first magnetic tunnel junction element and the first resistance change element, the first magnetic tunnel junction element being located between the first P-type transistor and the control line and being provided in a second level above a first level including the first P-type transistor, the first magnetic tunnel junction element including the first free layer, the first tunnel barrier layer, and the first pinned layer that are stacked in order from a position close to the first level, the first resistance change element being located between the first P-type transistor and the control line and being provided in the second level above the first level including the first P-type transistor, the first resistance change element including the first ion layer, the first insulating layer, and the first electrode layer that are stacked in order from a position close to the first level, and the second non-volatile storage element is one of the second magnetic tunnel junction element and the second resistance change element, the second magnetic tunnel junction element being located between the second P-type transistor and the control line and being provided in the second level above the first level including the second P-type transistor, the second magnetic tunnel junction element including the second free layer, the second tunnel barrier layer, and the second pinned layer that are stacked in order from a position close to the first level, the second resistance change element being located between the second P-type transistor and the control line and being provided in the second level above the first level including the second P-type transistor, the second resistance change element including the second ion layer, the second insulating layer, and the second electrode layer that are stacked in order from a position close to the first level.

(3)

The semiconductor device according to (2), wherein the first P-type transistor includes a pair of first diffusion regions that are coupled, respectively, to the first node and the first non-volatile storage element, and the second P-type transistor includes a pair of second diffusion regions that are coupled, respectively, to the second node and the second non-volatile storage element.

(4)

The semiconductor device according to (1), wherein the first non-volatile storage element is one of the first magnetic tunnel junction element and the first resistance change element, the first magnetic tunnel junction element being located between the first P-type transistor and the first node and being provided in a second level above a first level including the first P-type transistor, the first magnetic tunnel junction element including the first pinned layer, the first tunnel barrier layer, and the first free layer that are stacked in order from a position close to the first level, the first resistance change element being located between the first P-type transistor and the first node and being provided in the second level above the first level including the first P-type transistor, the first resistance change element including the first electrode layer, the first insulating layer, and the first ion layer that are stacked in order from a position close to the first level, and the second non-volatile storage element is one of the second magnetic tunnel junction element and the second resistance change element, the second magnetic tunnel junction element being located between the second P-type transistor and the second node and being provided in the second level above the first level including the second P-type transistor, the second magnetic tunnel junction element including the second pinned layer, the second tunnel barrier layer, and the second free layer that are stacked in order from a position close to the first level, the second resistance change element being located between the second P-type transistor and the second node and being provided in the second level above the first level including the second P-type transistor, the second resistance change element including the second electrode layer, the second insulating layer, and the second ion layer that are stacked in order from a position close to the first level.

(5)

The semiconductor device according to (4), wherein the first P-type transistor includes a pair of first diffusion regions that are coupled, respectively, to the control line and the first non-volatile storage element, and the second P-type transistor includes a pair of second diffusion regions that are coupled, respectively, to the control line and the second non-volatile storage element.

(6)

The semiconductor device according to any one of (1) to (5), wherein the first inverter circuit includes a third P-type transistor and a first N-type transistor that are coupled together in series, and the second inverter circuit includes a fourth P-type transistor and a second N-type transistor that are coupled together in series.

(7)

The semiconductor device according to (6), further including:

a first bit line;

a third N-type transistor provided between the first bit line and the first connection line;

a second bit line; and a fourth N-type transistor provided between the second bit line and the second connection line.

(8)

The semiconductor device according to (7), further including:

a power supply terminal coupled to a power supply that applies a voltage to the first inverter circuit and the second inverter circuit; and a controller that brings the first P-type transistor into an ON state while setting the control line at a first potential and allows a first current to flow from the first node to the control line to bring the first non-volatile storage element into a first resistance state that indicates a first resistance value, the controller bringing the second P-type transistor into an ON state while setting the control line at a second potential that is equal to or higher than the first potential and allows a second current to flow from the control line to the second node to bring the second non-volatile storage element into a second resistance state that indicates a second resistance value higher than the first resistance value.

(9)

The semiconductor device according to (8), wherein the controller brings the first P-type transistor and the second P-type transistor into an ON state while setting the control line at the second potential, and subsequently activates the power supply to apply a voltage to the first inverter circuit and the second inverter circuit to set a potential of the first node and a potential of the second node.

(10)

The semiconductor device according to (7), wherein the first P-type transistor to the fourth P-type transistor include a first gate electrode to a fourth gate electrode, respectively, the first N-type transistor to the fourth N-type transistor include a fifth gate electrode to an eighth gate electrode, respectively, and the first gate electrode to the eighth gate electrode each extend in a first direction.

(11)

The semiconductor device according to (10), further including:

a P-type well region; and an N-type well region adjacent to the P-type well region, wherein the first P-type transistor to the fourth P-type transistor are disposed in the N-type well region, the first N-type transistor to the fourth N-type transistor are disposed in the P-type well region.

the first gate electrode to the fourth gate electrode are disposed to be arranged in a second direction orthogonal to the first direction, and the fifth gate electrode to the eighth gate electrode are disposed to be arranged in the second direction.

(12)

The semiconductor device according to (11), further including:

a power supply terminal coupled to a power supply that applies a voltage to the first inverter circuit and the second inverter circuit; and a ground terminal, wherein the power supply terminal is provided between one electrode of the first gate electrode to the fourth gate electrode and another one electrode of the first gate electrode to the fourth gate electrode in the second direction, and the ground terminal is provided between one electrode of the fifth gate electrode to the eighth gate electrode and another one electrode of the fifth gate electrode to the eighth gate electrode in the second direction.

(13)

The semiconductor device according to (11) or (12), wherein the first gate electrode to the fourth gate electrode are disposed between the first non-volatile storage element and the second non-volatile storage element in the second direction.

(14)

The semiconductor device according to any one of (11) to (13), further including:

a single selection line that is coupled to both of the first gate electrode and the second gate electrode and extends in the second direction;

a single word line that is coupled to both of the seventh gate electrode and the eighth gate electrode and extends in the second direction;

a first bit line that is coupled to the third N-type transistor and extends in the first direction; and a second bit line that is coupled to the fourth N-type transistor and extends in the first direction.

(15)

The semiconductor device according to (9), further including a power supply terminal coupled to a power supply that applies a voltage to the first inverter circuit and the second inverter circuit, wherein the controller sets the control line at a ground potential as the first potential, and sets the control line at a potential of the power supply as the second potential.

(16)

The semiconductor device according to (9), further including a power supply terminal coupled to a power supply that applies a voltage to the first inverter circuit and the second inverter circuit, wherein the controller sets the control line to an intermediate potential between the ground potential and the potential of the power supply, respectively, as the first potential and the second potential.

(17)

The semiconductor device according to any one of (1) to (16), further including a joining structure in which a first substrate unit and a second substrate unit are joined together, wherein the first substrate unit includes a first substrate, and the first P-type transistor and the second P-type transistor each formed on the first substrate, and the second substrate unit includes a second substrate, and the first non-volatile storage element and the second non-volatile storage element each formed on the second substrate.

(18)

The semiconductor device according to (17), wherein the first substrate unit includes a first pad exposed to a first junction surface that faces the second substrate unit, and the second substrate unit includes a second pad exposed to a second junction surface that faces the first substrate unit.

(19)

A semiconductor device including:

a flip-flop circuit having a circular structure in which a first inverter circuit, a first connection line, a second inverter circuit, and a second connection line are coupled in order, the first connection line including a first node, the second connection line including a second node;

a control line;

a primary first electrically conductive transistor provided between the first node and the control line;

a first non-volatile storage element provided between the first node and the control line, the first non-volatile storage element being coupled in series to the primary first electrically conductive transistor;

a secondary first electrically conductive transistor provided between the second node and the control line;

a second non-volatile storage element provided between the second node and the control line, the second non-volatile storage element being coupled in series to the secondary first electrically conductive transistor;

a first bit line;

a primary second electrically conductive transistor provided between the first bit line and the first connection line;

a second bit line; and a secondary second electrically conductive transistor provided between the second bit line and the second connection line, wherein the first inverter circuit includes a tertiary first electrically conductive transistor and a tertiary second electrically conductive transistor that are coupled together in series, and the second inverter circuit includes a quaternary first electrically conductive transistor and a quaternary second electrically conductive transistor that are coupled together in series.

(20)

The semiconductor device according to any one of (10) to (14), further including a semiconductor substrate, wherein the first P-type transistor to the fourth P-type transistor and the first N-type transistor to the fourth N-type transistor each include a gate electrode, a source electrode, and a drain electrode that extend in the first direction, and a fin that extends in a second direction, a rear surface of each of the fin, the gate electrode, the source electrode, and the drain electrode is in contact with the semiconductor substrate, and the gate electrode, the source electrode, and the drain electrode each cover surfaces other than the rear surface of the fin.

This application is based upon and claims the benefit of priority of the Japanese Patent Application No. 2014-235309 filed with the Japan Patent Office on Nov. 20, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:

a flip-flop circuit having a circular structure in which a first inverter circuit, a first connection line, a second inverter circuit, and a second connection line are coupled in order, the first connection line including a first node, the second connection line including a second node;

a control line;

a first P-type transistor provided between the first node and the control line;

a first non-volatile storage element provided between the first node and the control line, the first non-volatile storage element being coupled in series to the first P-type transistor;

a second P-type transistor provided between the second node and the control line; and a second non-volatile storage element provided between the second node and the control line, the second non-volatile storage element being coupled in series to the second P-type transistor, wherein the first non-volatile storage element is one of a first magnetic tunnel junction element and a first resistance change element, the first magnetic tunnel junction element including a first pinned layer, a first tunnel barrier layer, and a first free layer that are arranged in order from a position close to the control line, the first resistance change element including a first electrode layer, a first insulating layer, and a first ion layer that are arranged in order from a position close to the control line, and the second non-volatile storage element is one of a second magnetic tunnel junction element and a second resistance change element, the second magnetic tunnel junction element including a second pinned layer, a second tunnel barrier layer, and a second free layer that are arranged in order from a position close to the control line, the second resistance change element including a second electrode layer, a second insulating layer, and a second ion layer that are arranged in order from a position close to the control line.

2. The semiconductor device according to claim 1, wherein the first non-volatile storage element is one of the first magnetic tunnel junction element and the first resistance change element, the first magnetic tunnel junction element being located between the first P-type transistor and the control line and being provided in a second level above a first level including the first P-type transistor, the first magnetic tunnel junction element including the first free layer, the first tunnel barrier layer, and the first pinned layer that are stacked in order from a position close to the first level, the first resistance change element being located between the first P-type transistor and the control line and being provided in the second level above the first level including the first P-type transistor, the first resistance change element including the first ion layer, the first insulating layer, and the first electrode layer that are stacked in order from a position close to the first level, and the second non-volatile storage element is one of the second magnetic tunnel junction element and the second resistance change element, the second magnetic tunnel junction element being located between the second P-type transistor and the control line and being provided in the second level above the first level including the second P-type transistor, the second magnetic tunnel junction element including the second free layer, the second tunnel barrier layer, and the second pinned layer that are stacked in order from a position close to the first level, the second resistance change element being located between the second P-type transistor and the control line and being provided in the second level above the first level including the second ion layer, the second insulating layer, and the second electrode layer that are stacked in order from a position close to the first level.

3. The semiconductor device according to claim 2, wherein the first P-type transistor includes a pair of first diffusion regions that are coupled, respectively, to the first node and the first non-volatile storage element, and the second P-type transistor includes a pair of second diffusion regions that are coupled, respectively, to the second node and the second non-volatile storage element.

4. The semiconductor device according to claim 1, wherein the first non-volatile storage element is one of the first magnetic tunnel junction element and the first resistance change element, the first magnetic tunnel junction element being located between the first P-type transistor and the first node and being provided in a second level above a first level including the first P-type transistor, the first magnetic tunnel junction element including the first pinned layer, the first tunnel barrier layer, and the first free layer that are stacked in order from a position close to the first level, the first resistance change element being located between the first P-type transistor and the first node and being provided in the second level above the first level including the first P-type transistor, the first resistance change element including the first electrode layer, the first insulating layer, and the first ion layer that are stacked in order from a position close to the first level, and the second non-volatile storage element is one of the second magnetic tunnel junction element and the second resistance change element, the second magnetic tunnel junction element being located between the second P-type transistor and the second node and being provided in the second level above the first level including the second P-type transistor, the second magnetic tunnel junction element including the second pinned layer, the second tunnel barrier layer, and the second free layer that are stacked in order from a position close to the first level, the second resistance change element being located between the second P-type transistor and the second node and being provided in the second level above the first level including the second P-type transistor, the second resistance change element including the second electrode layer, the second insulating layer, and the second ion layer that are stacked in order from a position close to the first level.

5. The semiconductor device according to claim 4, wherein the first P-type transistor includes a pair of first diffusion regions that are coupled, respectively, to the control line and the first non-volatile storage element, and the second P-type transistor includes a pair of second diffusion regions that are coupled, respectively, to the control line and the second non-volatile storage element.

6. The semiconductor device according to claim 1, wherein the first inverter circuit includes a third P-type transistor and a first N-type transistor that are coupled together in series, and the second inverter circuit includes a fourth P-type transistor and a second N-type transistor that are coupled together in series.

7. The semiconductor device according to claim 6, further comprising:
   a first bit line;
   a third N-type transistor provided between the first bit line and the first connection line;
   a second bit line; and
   a fourth N-type transistor provided between the second bit line and the second connection line.

8. The semiconductor device according to claim 7, further comprising:
   a power supply terminal coupled to a power supply that applies a voltage to the first inverter circuit and the second inverter circuit; and
   a controller that brings the first P-type transistor into an ON state while setting the control line at a first potential and allows a first current to flow from the first node to the control line to bring the first non-volatile storage element into a first resistance state that indicates a first resistance value, the controller bringing the second P-type transistor into an ON state while setting the control line at a second potential that is equal to or higher than the first potential and allows a second current to flow from the control line to the second node to bring the second non-volatile storage element into a second resistance state that indicates a second resistance value higher than the first resistance value.

9. The semiconductor device according to claim 8, wherein
   the controller brings the first P-type transistor and the second P-type transistor into an ON state while setting the control line at the second potential, and subsequently activates the power supply to apply a voltage to the first inverter circuit and the second inverter circuit to set a potential of the first node and a potential of the second node.

10. The semiconductor device according to claim 7, wherein
   the first P-type transistor to the fourth P-type transistor include a first gate electrode to a fourth gate electrode, respectively,
   the first N-type transistor to the fourth N-type transistor include a fifth gate electrode to an eighth gate electrode, respectively, and
   the first gate electrode to the eighth gate electrode each extend in a first direction.

11. The semiconductor device according to claim 10, further comprising:
   a P-type well region; and
   an N-type well region adjacent to the P-type well region, wherein
   the first P-type transistor to the fourth P-type transistor are disposed in the N-type well region,
   the first N-type transistor to the fourth N-type transistor are disposed in the P-type well region,
   the first gate electrode to the fourth gate electrode are disposed to be arranged in a second direction orthogonal to the first direction, and
   the fifth gate electrode to the eighth gate electrode are disposed to be arranged in the second direction.

12. The semiconductor device according to claim 11, further comprising:
   a power supply terminal coupled to a power supply that applies a voltage to the first inverter circuit and the second inverter circuit; and
   a ground terminal, wherein
   the power supply terminal is provided between one electrode of the first gate electrode to the fourth gate electrode and another one electrode of the first gate electrode to the fourth gate electrode in the second direction, and
   the ground terminal is provided between one electrode of the fifth gate electrode to the eighth gate electrode and another one electrode of the fifth gate electrode to the eighth gate electrode in the second direction.

13. The semiconductor device according to claim 11, wherein
   the first gate electrode to the fourth gate electrode are disposed between the first non-volatile storage element and the second non-volatile storage element in the second direction.

14. The semiconductor device according to claim 11, further comprising:
   a single selection line that is coupled to both of the first gate electrode and the second gate electrode and extends in the second direction;
   a single word line that is coupled to both of the seventh gate electrode and the eighth gate electrode and extends in the second direction;
   a first bit line that is coupled to the third N-type transistor and extends in the first direction; and
   a second bit line that is coupled to the fourth N-type transistor and extends in the first direction.

15. The semiconductor device according to claim 9, further comprising
   a power supply terminal coupled to a power supply that applies a voltage to the first inverter circuit and the second inverter circuit, wherein
   the controller sets the control line at a ground potential as the first potential, and sets the control line at a potential of the power supply as the second potential.

16. The semiconductor device according to claim 9, further comprising
   a power supply terminal coupled to a power supply that applies a voltage to the first inverter circuit and the second inverter circuit, wherein
   the controller sets the control line to an intermediate potential between the ground potential and the potential of the power supply, respectively, as the first potential and the second potential.

17. The semiconductor device according to claim 1, further comprising
   a joining structure in which a first substrate unit and a second substrate unit are joined together, wherein
   the first substrate unit includes a first substrate, and the first P-type transistor and the second P-type transistor each formed on the first substrate, and
   the second substrate unit includes a second substrate, and the first non-volatile storage element and the second non-volatile storage element each formed on the second substrate.

18. The semiconductor device according to claim 17, wherein
   the first substrate unit includes a first pad exposed to a first junction surface that faces the second substrate unit, and
   the second substrate unit includes a second pad exposed to a second junction surface that faces the first substrate unit.

19. The semiconductor device according to claim 10, further comprising a semiconductor substrate, wherein
   the first P-type transistor to the fourth P-type transistor and the first N-type transistor to the fourth N-type transistor each include a gate electrode, a source electrode, and a drain electrode that extend in the first direction, and a fin that extends in a second direction, a rear surface of each of the fin, the gate electrode, the source electrode, and the drain electrode is in contact with the semiconductor substrate, and the gate electrode, the source electrode, and the drain electrode each cover surfaces other than the rear surface of the fin.

* * * * *